United States Patent
Onaka et al.

(10) Patent No.: US 10,759,276 B2
(45) Date of Patent: Sep. 1, 2020

(54) MAGNETIC SENSOR AND DETECTION DEVICE USING SAME

(71) Applicant: Panasonic Intellectual Property Management Co., Ltd., Osaka (JP)

(72) Inventors: Kazuhiro Onaka, Hyogo (JP); Shigehiro Yoshiuchi, Kyoto (JP); Noritaka Ichinomiya, Nara (JP); Kiyotaka Yamada, Kyoto (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 47 days.

(21) Appl. No.: 16/093,741

(22) PCT Filed: Jun. 27, 2017

(86) PCT No.: PCT/JP2017/023466
§ 371 (c)(1),
(2) Date: Oct. 15, 2018

(87) PCT Pub. No.: WO2018/012272
PCT Pub. Date: Jan. 18, 2018

(65) Prior Publication Data
US 2019/0077256 A1    Mar. 14, 2019

(30) Foreign Application Priority Data

Jul. 12, 2016  (JP) .................................. 2016-137291
Jul. 12, 2016  (JP) .................................. 2016-137292
(Continued)

(51) Int. Cl.
*B60K 20/02*    (2006.01)
*G01B 7/30*    (2006.01)
(Continued)

(52) U.S. Cl.
CPC ................ *B60K 20/02* (2013.01); *G01B 7/30* (2013.01); *G01D 5/245* (2013.01); *G01R 33/02* (2013.01);
(Continued)

(58) Field of Classification Search
CPC ......... B60K 20/02; H01L 27/22; H01L 43/08; H01L 43/065; H01L 43/06; G01R 33/02;
(Continued)

(56) References Cited

U.S. PATENT DOCUMENTS 6,039,410 A * 3/2000 Robertson ................. B60T 7/20
188/3 R
6,064,197 A   5/2000 Lochmann et al.
(Continued)

FOREIGN PATENT DOCUMENTS

JP    4-026227    1/1992
JP    6-310776    11/1994
(Continued)

OTHER PUBLICATIONS

International Search Report of PCT application No. PCT/JP2017/023466 dated Sep. 26, 2017.

*Primary Examiner* — Christopher P McAndrew
(74) *Attorney, Agent, or Firm* — McDermott Will & Emery LLP

(57) ABSTRACT

A magnetic sensor includes a magneto-resistive element, a Hall element, and a detection circuit that receives a signal from the magneto-resistive element and a signal from the Hall element input thereto. The detection circuit includes an output terminal and an interrupt generation unit. The output terminal outputs, to the outside as an output signal, a signal obtained by performing to the signal input from the magneto-resistive element, at least one processing selected from amplification, analog-to-digital conversion, offset correc-
(Continued)

tion, and temperature-characteristics correction. The interrupt generation unit outputs an interrupt signal when the signal input from the Hall element is larger than a predetermined threshold. The magnetic sensor is high accurate and highly reliable.

7 Claims, 33 Drawing Sheets

(30) Foreign Application Priority Data

Aug. 2, 2016 (JP) .................................. 2016-151648
Jan. 17, 2017 (JP) .................................. 2017-005561

(51) Int. Cl.
| | |
|---|---|
| *G01R 33/09* | (2006.01) |
| *G01R 33/02* | (2006.01) |
| *G01D 5/14* | (2006.01) |
| *H01L 43/08* | (2006.01) |
| *H01L 27/22* | (2006.01) |
| *G01D 5/245* | (2006.01) |
| *H01L 43/06* | (2006.01) |

(52) U.S. Cl.
CPC .............. *G01R 33/09* (2013.01); *H01L 27/22* (2013.01); *H01L 43/08* (2013.01); *G01D 5/145* (2013.01); *H01L 43/06* (2013.01); *H01L 43/065* (2013.01)

(58) Field of Classification Search
CPC ........ G01R 33/09; G01D 5/245; G01D 5/145; G01B 7/30
USPC ..................................... 324/207.13
See application file for complete search history.

(56) References Cited

U.S. PATENT DOCUMENTS

| | | | |
|---|---|---|---|
| 6,252,395 B1 | 6/2001 | Aoyama et al. | |
| 7,208,940 B2 * | 4/2007 | Withanawasam | G01D 5/14 |
| | | | 324/207.21 |
| 7,906,961 B2 | 3/2011 | Abwa et al. | |
| 8,841,776 B2 | 9/2014 | Nishimura et al. | |
| 9,151,809 B2 | 10/2015 | Astegher et al. | |
| 9,588,134 B2 * | 3/2017 | Ausserlechner | G01R 33/07 |
| 2002/0111763 A1 | 8/2002 | Koga | |
| 2003/0090265 A1 * | 5/2003 | Wan | G01D 5/145 |
| | | | 324/207.25 |
| 2004/0131887 A1 | 7/2004 | Ao et al. | |
| 2006/0158141 A1 * | 7/2006 | Frank | B60T 7/042 |
| | | | 327/511 |
| 2009/0058407 A1 | 3/2009 | Kanekawa et al. | |
| 2009/0212771 A1 | 8/2009 | Cummings et al. | |
| 2010/0097733 A1 * | 4/2010 | E. | H02H 1/0015 |
| | | | 361/42 |
| 2011/0018533 A1 | 1/2011 | Cesaretti et al. | |
| 2012/0313636 A1 | 12/2012 | Cummings et al. | |
| 2013/0335066 A1 | 12/2013 | Cesaretti et al. | |
| 2015/0175191 A1 | 6/2015 | Harada et al. | |
| 2015/0198678 A1 | 7/2015 | Pilla | |
| 2015/0300840 A1 * | 10/2015 | Haeberle | G01R 33/09 |
| | | | 324/207.21 |
| 2016/0146635 A1 * | 5/2016 | Sato | G01D 5/145 |
| | | | 324/207.22 |
| 2016/0377453 A1 * | 12/2016 | Kimura | G03B 3/10 |
| | | | 324/207.11 |
| 2017/0098520 A1 * | 4/2017 | Mittelstadt | G01D 5/145 |

FOREIGN PATENT DOCUMENTS

| | | |
|---|---|---|
| JP | 11-287668 | 10/1999 |
| JP | 2002-213944 | 7/2002 |
| JP | 3474096 B | 12/2003 |
| JP | 2004-172430 | 6/2004 |
| JP | 2005-521597 | 7/2005 |
| JP | 2006-234495 | 9/2006 |
| JP | 2007-155668 | 6/2007 |
| JP | 2007-203976 | 8/2007 |
| JP | 2007-333489 | 12/2007 |
| JP | 4138952 B | 8/2008 |
| JP | 4863953 B | 1/2012 |
| JP | 5083281 B | 11/2012 |
| JP | 2014-209124 | 11/2014 |
| JP | 5620989 B | 11/2014 |
| JP | 5638900 B | 12/2014 |
| JP | 2015-082633 | 4/2015 |
| JP | 5708986 B | 4/2015 |
| JP | 2015-108527 | 6/2015 |
| JP | 2015-116964 | 6/2015 |
| JP | 5961777 B | 8/2016 |
| WO | 2003/085481 | 10/2003 |
| WO | 2014/148087 | 9/2014 |

* cited by examiner

MAGNETIC SENSOR AND DETECTION DEVICE USING SAME

This application is a U.S. national stage application of the PCT international application No. PCT/JP2017/023466 filed on Jun. 27, 2017, which claims the benefit of foreign priority of Japanese patent applications No. 2016-137291 filed on Jul. 12, 2016, No. 2016-137292 filed on Jul. 12, 2016, No. 2016-151648 filed on Aug. 2, 2016, and No. 2017-005561 filed on Jan. 17, 2017, the contents all of which are incorporated herein by reference.

TECHNICAL FIELD

The present invention relates to a magnetic sensor used for detecting, e.g. a steering angle of an automobile, and to a detection device.

BACKGROUND ART

A magnetic sensor for detecting a steering angle even while an ignition switch of an automobile is turned off is known. PTLs 1 to 3 are known as prior art documents related to such a magnetic sensor.

A magnetic sensor for detecting rotation of an object which includes a steering angle or the like using a magneto-resistive element is known.

PTLs 4 to 6 are known as prior art documents related to such a magnetic sensor.

A magnetic sensor which has magnetic field generating means for diagnosing a sensor based on a magnetic field generated from the magnetic field generating means is known. PTLs 7 and 8 are known as prior art documents related to such a magnetic sensor.

A magnetic sensor combining a magneto-resistive element and a Hall element is known. PTLs 9 and 10 are known as prior art documents related to such a magnetic sensor.

A magnetic sensor including two detection systems to improve redundancy of the sensor is known. PTLs 11 to 13 are known as prior art documents relating to this magnetic sensor.

A magnetic sensor including a magneto-resistive film made of NiFe alloy to detect an external magnetic field is known. PTLs 14 to 17 are known as prior art documents relating to this magnetic sensor.

A magnetic sensor including two sensors stacked vertically to constitute one package is known. PTLs 18 to 22 are known as prior art documents relating to this magnetic sensor.

A position detecting device including a magnetic sensor to detect a position of a shift lever is known. PTLs 23 to 25 are known as prior art documents relating to this position detecting device.

Demands for high accuracy and reliability in the magnetic sensor have been increased. However, the above-mentioned magnetic sensors hardly satisfy these demands sufficiently.

CITATION LIST

Patent Literature

PTL 1: Japanese Patent Laid-Open Publication No. 2015-116964
PTL 2: International Publication WO 2014/148087
PTL 3: Japanese Patent Laid-Open Publication No. 2002-213944
PTL 4: Japanese Patent Laid-Open Publication No. 2014-209124
PTL 5: Japanese Patent No. 5708986
PTL 6: Japanese Patent Laid-Open Publication No. 2007-155668
PTL 7: Japanese Patent No. 5620989
PTL 8: Japanese Patent Laid-Open Publication No. 06-310776
PTL 9: Japanese Patent No. 4138952
PTL 10: Japanese Patent No. 5083281
PTL 11: Japanese Patent No. 3474096
PTL 12: Japanese Patent No. 4863953
PTL 13: Japanese Patent No. 5638900
PTL 14: Japanese Patent Publication No. 04-26227
PTL 15: Japanese Patent Laid-Open Publication No. 2004-172430
PTL 16: Japanese Patent Laid-Open Publication No. 2015-082633
PTL 17: Japanese Patent Laid-Open Publication No. 2015-108527
PTL 18: Japanese Patent No. 5961777
PTL 19: US Patent Publication No. 2015/0198678
PTL 20: U.S. Pat. No. 9,151,809
PTL 21: U.S. Pat. No. 8,841,776
PTL 22: U.S. Pat. No. 7,906,961
PTL 23: Japanese Patent Laid-Open Publication No. 2006-234495
PTL 24: Japanese Patent Laid-Open Publication No. 2007-333489
PTL 25: Japanese Patent Laid-Open Publication No. 2005-521597

SUMMARY

A magnetic sensor includes a magneto-resistive element, a Hall element, and a detection circuit that receives a signal from the magneto-resistive element and a signal from the Hall element input thereto.

The detection circuit includes an output terminal and an interrupt generation unit. The output terminal outputs, to the outside as an output signal, a signal obtained by performing, to the signal input from the magneto-resistive element, at least one processing selected from amplification, analog-to-digital conversion, offset correction, and temperature-characteristics correction. The interrupt generation unit outputs an interrupt signal when the signal input from the Hall element is larger than a predetermined threshold.

The magnetic sensor is accurate and highly reliable.

DETAILED DESCRIPTION OF PREFERRED EMBODIMENTS

Figure 1A:
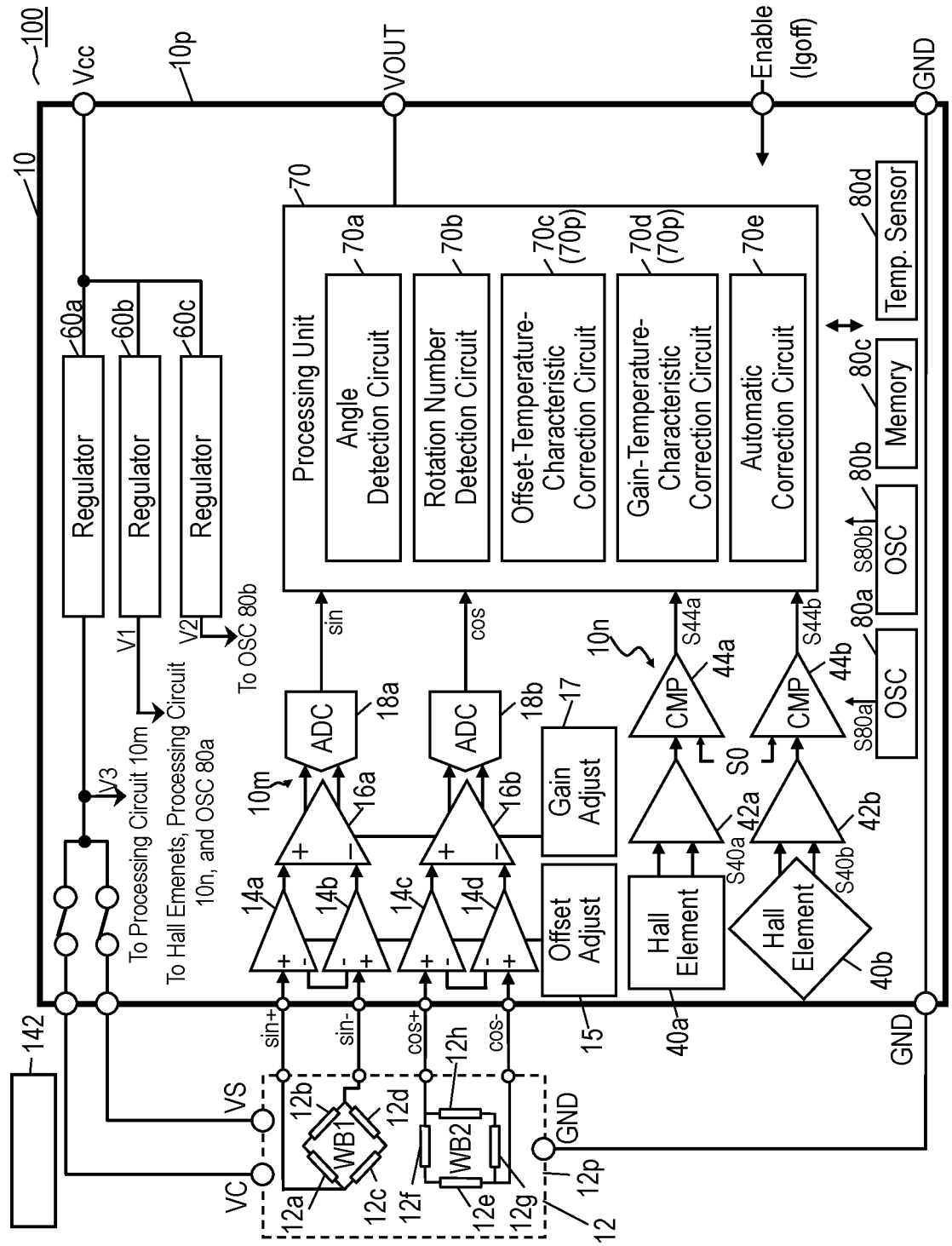
FIG. 1A is a block diagram of a magnetic sensor in accordance with an exemplary embodiment.

FIG. 1A is a block diagram of magnetic sensor 100 in accordance with an exemplary embodiment. Magnetic sensor 100 includes magneto-resistive (MR) element 12 and detection circuit 10 that is electrically connected to magneto-resistive element 12.

Figure 1B:
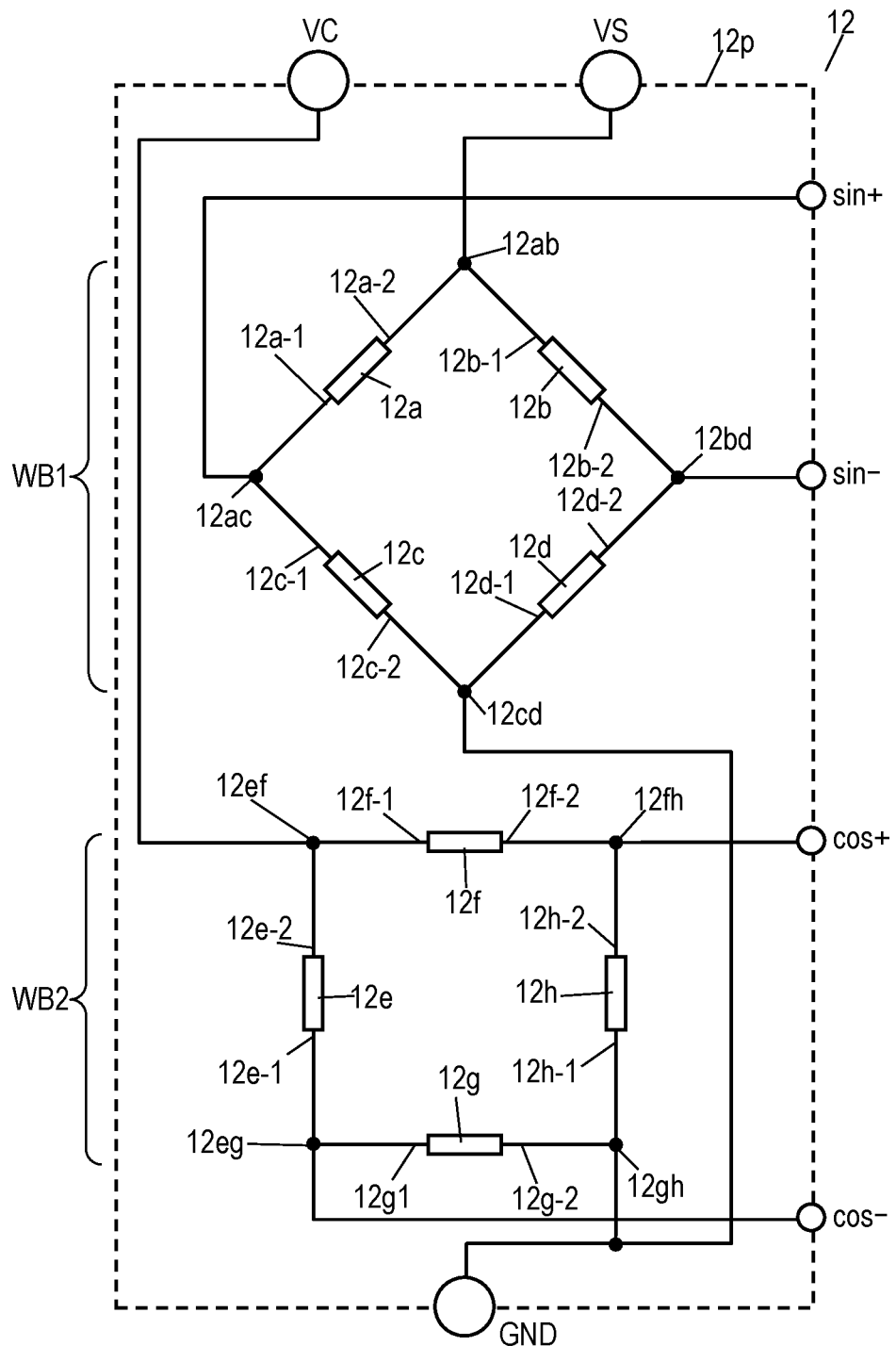
FIG. 1B is a circuit diagram of a magnetic detection element of the magnetic sensor in accordance with the embodiment.

FIG. 1B is a circuit diagram of magneto-resistive element 12. Magneto-resistive element 12 includes eight magneto-resistive elements 12a to 12h. Each magneto-resistive element is a magneto-resistive effect element that is provided on substrate 12p, such as a silicon substrate, and contains iron-nickel alloy. Each magneto-resistive element has an electrical resistance that changes according to a change in direction and magnitude of a magnetic field applied to the magneto-resistive element from the outside. In other words, magneto-resistive element 12 (12a to 12h) is a magnetic detection element for detecting magnetism.

Magneto-resistive elements 12a to 12d constitute bridge circuit WB1. In other words, a series circuit assembly constituted by magneto-resistive elements 12a and 12b connected in series with each other is connected in parallel with a series circuit assembly constituted by magneto-resistive elements 12c and 12d connected in series with each other to form bridge circuit WB1. One end of bridge circuit WB1 is connected to potential VS, and the other end of bridge circuit WB1 is grounded through ground GND.

As shown in FIG. 1B, end 12a-2 of magneto-resistive element 12a is connected to end 12b-1 of magneto-resistive element 12b at node 12ab, and magneto-resistive elements 12a and 12b are thus connected in series with each other. End 12c-2 of magneto-resistive element 12c is connected to end 12d-1 of magneto-resistive element 12d at node 12cd, and magneto-resistive elements 12c and 12d are thus connected in series with each other. End 12a-1 of magneto-resistive element 12a is connected to end 12c-1 of magneto-resistive element 12c at node 12ac, and magneto-resistive elements 12a and 12c are thus connected in series with each other. End 12b-2 of magneto-resistive element 12b is connected to end 12d-2 of magneto-resistive element 12d at node 12bd, and magneto-resistive elements 12b and 12d are thus connected in series with each other. Node 12ab is connected to potential VS which is a fixed potential, and node 12cd is grounded through ground GND, i.e., connected to a fixed potential. Nodes 12ac and 12bd constitute midpoints of bridge circuit WB1.

Magneto-resistive elements 12e to 12h constitute bridge circuit WB2. In other words, a series circuit assembly constituted by magneto-resistive elements 12e and 12f connected in series with each other is connected in parallel with a series circuit assembly constituted by magneto-resistive elements 12g and 12h connected in series with each other to form bridge circuit WB2. One end of bridge circuit WB2 is connected to potential VC serving as a reference potential, and the other end of bridge circuit WB2 is grounded through ground GND.

As shown in FIG. 1B, end 12e-2 of magneto-resistive element 12e is connected to end 12f-1 of magneto-resistive element 12f at node 12ef, and magneto-resistive elements 12e and 12f are connected in series with each other. End 12g-2 of magneto-resistive element 12g is connected to end 12h-1 of magneto-resistive element 12h at node 12gh, and magneto-resistive elements 12g and 12h are connected in series with each other. End 12e-1 of magneto-resistive element 12e is connected to end 12g-1 of magneto-resistive element 12g at node 12eg, and magneto-resistive elements 12e and 12g are connected in series with each other. End 12f-2 of magneto-resistive element 12f is connected to end 12h-2 of magneto-resistive element 12h at node 12fh, and magneto-resistive elements 12f and 12h are connected in series with each other. Node 12ef is connected to potential VC which is a fixed reference potential, and node 12gh is grounded through ground GND, i.e., connected to a fixed potential. Nodes 12eg and 12fh constitute midpoints of bridge circuit WB2.

The bridge circuit WB1 coincides with bridge circuit WB2 rotated by 45°. In another expression, bridge circuit WB2 coincides with bridge circuit WB1 rotated by 45°.

Magnetic sensor 100 is disposed near object magnet 142. Object magnet 142 is coupled with a rotating member (e.g., a steering shaft of an automobile), which serves as a target, via, e.g. a gear. According to a change in external magnetic field (or rotating magnetic field) applied from object magnet 142, the resistances of magneto-resistive elements 12a to 12h change. Accordingly, signal sin+ and signal sin− are output from node 12ac of magneto-resistive elements 12a and 12c and node 12bd of magneto-resistive elements 12b and 12d, respectively. Signal sin+ and signal sin− are sine wave signals having sinusoidal wave form with phases different from each other by 180°. Magneto-resistive elements 12a to 12d constitute bridge circuit WB1. Signal cos− and signal cos+ are output from node 12eg of magneto-resistive elements 12e and 12g and node 12fh of magneto-resistive elements 12f and 12h, respectively. Signal cos− and signal cos+ are cosine wave signals with phases different from each other by 180°. Magneto-resistive elements 12e to 12h constitute bridge circuit WB2. Signal cos+ and signal cos− have phases delayed by 90° from signal sin+ and signal sin−, respectively. Signal cos+ and signal cos− are cosine wave signals output from bridge circuit WB2. Signal sin+ and signal sin− are sine wave signals output from bridge circuit WB1. Sine wave signals are obtained from bridge circuit WB1 while cosine wave signals are obtained from bridge circuit WB2. This is because bridge circuit WB1 coincides with bridge circuit WB2 rotated by 45°. Thus, magneto-resistive element 12 outputs detection signals (signal sin+, signal sin−, signal cos+, signal cos−) according to the rotation of object magnet 142.

Detection circuit 10 is mounted on substrate 10p, and performs various kinds of signal processing, such as amplification and analog-to-digital (AD) conversion of signal sin+, signal sin−, signal cos+, and signal cos−, while receiving signal sin+, signal sin−, signal cos+, and signal cos−.

A structure and operation of detection circuit 10 will be detailed below.

Amplifier 14a amplifies signal sin+. Amplifier 14b amplifies signal sin−. Amplifier 14c amplifies signal cos+. Amplifier 14d amplifies signal cos−.

Offset control circuit 15 is connected to input stages of amplifiers 14a to 14d, and controls amplifiers 14a to 14d such that a difference between midpoint potentials which are respective average values of signal sin+ and signal sin− is adjusted to be zero, and a difference between midpoint potentials which are respective average values of signal cos+ and signal cos− is adjusted to be zero.

Differential amplifier 16a amplifies a difference between signal sin+ and signal sin− which are output from bridge circuit WB1 so as to generate signal sin having twice each of respective amplitudes of signal sin+ and signal sin−.

Differential amplifier 16b amplifies a difference between signal cos+ and signal cos− which are output from bridge circuit WB2 so as to generate signal cos having twice each of respective amplitudes of signal cos+ and signal cos−. Signal cos is a sine wave signal with phase different from the phase of signal sin by 90°.

Gain control circuit 17 adjusts gains of differential amplifiers 16a and 16b such that signal sin and signal cos which are output from differential amplifiers 16a and 16b have predetermined amplitudes.

This configuration does not require the adjusting of offset and gain of each of amplifiers 14a to 14d, so that the signals are adjustable by one offset adjustment and one gain adjustment. This contributes particularly to reduce circuit size.

An analog signal output from differential amplifier 16a is sampled by AD converter 18a at a predetermined sampling period and converted into signal sin which is a digital signal.

An analog signal output from differential amplifier 16b is sampled by AD converter 18b at a predetermined sampling period and converted into signal cos which is a digital signal. Amplifiers 14a to 14d, differential amplifiers 16a and 16b, and AD converters 18a and 18b constitute processing circuit 10m that processes the signals output from magneto-resistive element 12 (12a to 12h) and outputs signal sin and signal cos which are digital signals.

Hall element 40a has a detection sensitivity to a magnetic field perpendicular or parallel to the circuit substrate on which detection circuit 10 is provided, and outputs a detection signal according to a direction and magnitude of an external magnetic field (rotating magnetic field) mentioned above.

Hall element 40b has a detection sensitivity to a magnetic field perpendicular or parallel to the circuit substrate on which detection circuit 10 is provided, and outputs a detection signal according to a direction and magnitude of an external magnetic field (rotating magnetic field) mentioned above.

Amplifier 42a amplifies signal S40a output from Hall element 40a.

Amplifier 42b amplifies signal S40b output from Hall element 40b.

Comparator 44a converts a signal output from amplifier 42a into pulse signal S44a with a rectangle wave shape by binarizing, i.e., comparing the signal with predetermined threshold S0 to generate a binary signal. Threshold S0 is a median value of signals output from amplifier 42a.

Comparator 44b converts a signal output from amplifier 42b into pulse signal S44b with a rectangle wave shape by binarizing the signal, i.e., by comparing the signal with predetermined threshold S0 to generate a binary signal. Threshold S0 is a median value of signals output from amplifier 42b. Amplifiers 42a and 42b, and comparators 44a and 44b constitute processing 25 circuit 10n that processes signals output from Hall elements 40a and 40b and outputs pulse signal S44a and S44b.

Hall element 40a has a structure coinciding with a configuration of Hall element 40b rotated by 90°. In another expression, Hall element 40b has a structure identical to a configuration Hall element 40a rotated at 90°. The pulse signal output from Hall element 40 via comparator 44a has a phase difference of 90° with respect to the pulse signal output from Hall element 40b via comparator 44b.

Regulator 60b supplies potential V1 to processing circuit 10n, oscillator (OSC) 80a, and Hall elements 40a and 40b.

Regulator 60c supplies potential V2 to oscillator (OSC) 80b. Potential V2 is used in Hall elements 40a and 40b in an intermittent operation mode.

Regulator 60a supplies potentials VS, VC, and V3 to magneto-resistive element 12 and processing circuit 10m.

Processing unit 70 includes angle detection circuit 70a, rotation number detection circuit 70b, offset-temperature-characteristic correction circuit 70c, and gain-temperature-characteristic correction circuit 70d. Offset-temperature-characteristic correction circuit 70c and gain-temperature-characteristic correction circuit 70d constitute temperature-characteristic correction circuit 70p.

Angle detection circuit 70a detects a rotation angle of object magnet 142 from signal sin serving as a digital signal, signal cos serving as a digital signal, and pulse signals S44a and S44b, and outputs signal Vout. Specifically, an arc-tangent calculation is performed on signal sin and signal cos, i.e., a value of signal cos is divided by a value of signal sin to detect the rotation angle. Angle detection circuit 70a outputs an angle signal indicating the detected rotation angle.

Rotation number detection circuit 70b detects the number of rotations of object magnet 142 based on pulse signals S44a and S44b by the method described below, and outputs rotation-number information indicating the number of rotations detected above.

Offset-temperature-characteristic correction circuit 70c corrects, by, the method described later, a direct-current (DC) offset which occurs in signal sin or signal cos due to, e.g. a variation in resistance of magneto-resistive element 12.

Gain-temperature-characteristic correction circuit 70d corrects, by the method described later, an offset of amplitude which occurs in signal sin or signal cos due to a change in temperature of magneto-resistive element 12. In other words, a change in amplitude of signal sin or signal cos with respect to a temperature is previously measured to obtain a measured value. The measured value is stored in memory 80c of detection circuit 10. Based on temperature information corresponding to the temperature obtained from temperature sensor 80d, the measured value stored in memory 80c is read out. The measured value read out from memory 80c is added to the amplitude of signal sin or signal cos. Thus, the offset of amplitude which occurs in signal sin or signal cos is corrected based on the temperature.

Oscillator 80a generates internal clock S80a to be used in detection circuit 10. Internal clock S80a generated by oscillator 80a is used for detection in magneto-resistive element 12 and Hall elements 40a and 40b.

Oscillator 80b generates internal clock S80b to be used in detection circuit 10.

The frequency of internal clock S80b generated in oscillator 80b is lower than the frequency of internal clock S80a generated in oscillator 80a.

Memory 80c stores rotation-number information indicating the number of rotations measured by rotation number detection circuit 70b, and stores the measured value used for correcting the offset due to a change in temperature.

Figure 2A:
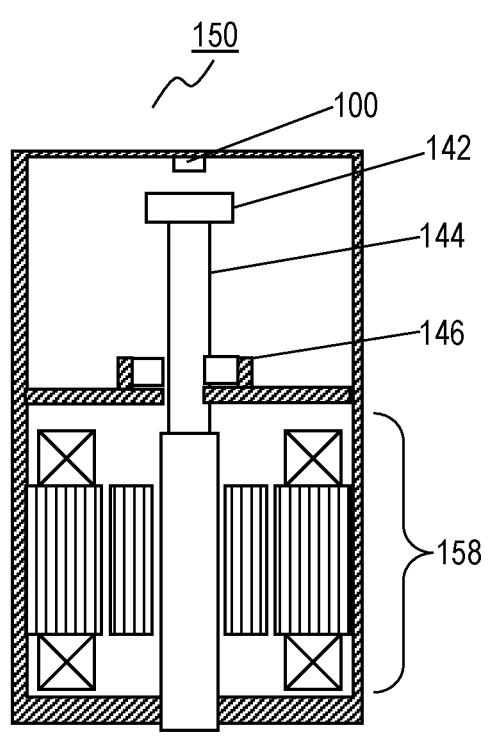
FIG. 2A is a schematic view of a rotation detecting device including the magnetic sensor in accordance with the embodiment.

FIG. 2A is a schematic view of rotation detecting device 150 including magnetic sensor 100. Rotation detecting device 150 includes magnetic sensor 100, object magnet 142, rotation shaft 144 to which object magnet 142 is attached, bearing 146 for supporting rotation shaft 144, and motor 158 for rotating rotation shaft 144. Object magnet 142 is made of magnetic material.

Figure 2B:
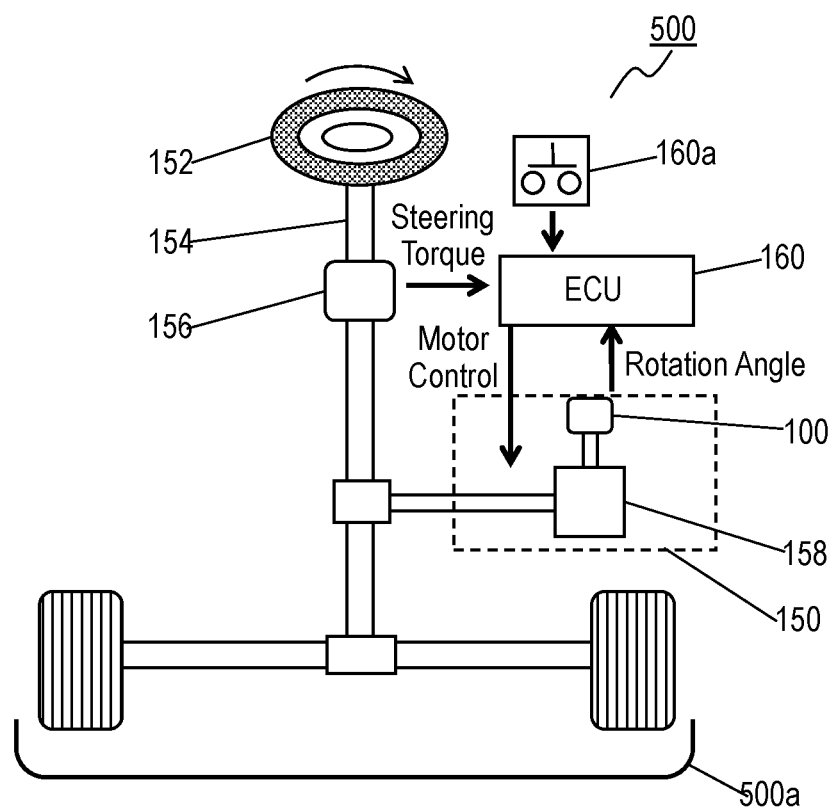
FIG. 2B is a schematic view of a control system including the rotation detecting device in accordance with the embodiment.

FIG. 2B is a schematic view of control system 500 including rotation detecting device 150. Control system 500 is mounted on automobile 500a. Control system 500 includes steering wheel 152, steering shaft 154, torque sensor 156, motor 158, magnetic sensor 100, and electrical control unit (ECU) 160. ECU 160 is connected to switch 160a. Switch 160a is an ignition switch. When automobile 500a moves, the ignition switch is turned on. When automobile 500a does not move, the ignition switch is turned off. When a driver rotates steering wheel 152 to change a driving direction of automobile 500a, steering shaft 154 coupled to steering wheel 152 rotates in the same direction as the direction in which steering wheel 152 rotates. Torque sensor 156 detects a relative rotational displacement between an input shaft and an output shaft which is caused by the rotation of steering wheel 152, and transmits an electric signal according to the rotational displacement to ECU 160. Motor 158 assisting steering wheel 152 and steering shaft 154 helps a driver to change a direction of automobile 500a with a light force. Magnetic sensor 100 attached to motor 158 detects a rotation angle of motor 158, thereby controlling motor 158.

As mentioned above, magnetic sensor 100 of rotation detecting device 150 includes: bridge circuit WB1 including magneto-resistive elements 12a to 12d, amplifier 14a connected to a midpoint (node 12ac) of bridge circuit WB1, amplifier 14b connected to a midpoint (node 12bd) of bridge circuit WB1, differential amplifier 16a connected to amplifiers 14a and 14b, offset control circuit 15 connected to amplifiers 14a and 14b, and gain control circuit 17 connected to differential amplifier 16a.

Analog-to-digital converter 18a may be connected to amplifiers 14a and 14b.

Magnetic sensor 100 of rotation detecting device 150 includes bridge circuit WB1 including magneto-resistive elements 12a to 12d, bridge circuit WB2 including magneto-resistive elements 12e to 12h, amplifier 14a connected to a midpoint (node 12ac) of bridge circuit WB1, amplifier 14b connected to a midpoint (node 12bd) of bridge circuit WB1, amplifier 14d connected to a midpoint (node 12eg) of bridge circuit WB2, amplifier 14c connected to a midpoint (node 12fh) of bridge circuit WB2, differential amplifier 16a connected to amplifiers 14a and 14b, differential amplifier 16b connected to amplifiers 14d and 14c, offset control circuit 15 connected to amplifiers 14a to 14d, and gain control circuit 17 connected to differential amplifiers 16a and 16b.

Analog-to-digital (AD) converter 18a may be connected to amplifiers 14a and 14b via differential amplifier 16a. AD converter 18b may be connected to amplifier 14c and amplifier 14d via differential amplifier 16b.

In rotation detecting device 150 including bridge circuit WB1 including magneto-resistive element 12, offset of an output of bridge circuit WB1 is corrected. By amplifying the above-mentioned output with the corrected offset, the amplitude thereof is corrected.

In the correction mentioned above, the output with the corrected amplitude may be converted into a digital signal.

Figure 3:
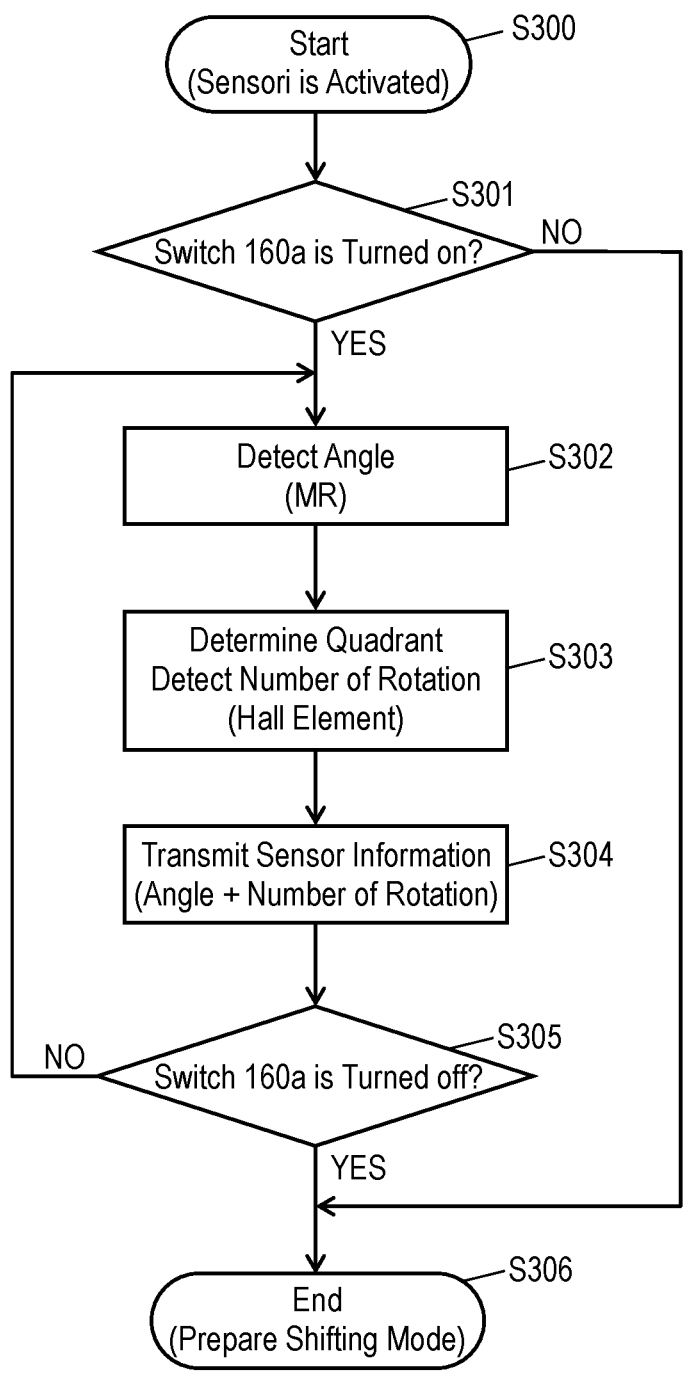
FIG. 3 illustrates an operation of a detection circuit of the magnetic sensor in accordance with the embodiment.

FIG. 3 is a flowchart showing an operation of magnetic sensor 100 in accordance with the embodiment. FIG. 3 shows an operation of magnetic sensor 100 detecting motion of a steering while switch 160a serving as an ignition switch is turned on.

First, after magnetic sensor 100 is activated (S300), if switch 160a is turned on ("YES" in S301), magnetic sensor 100 detects a rotation angle.

When switch 160a is turned on ("YES" in S301), magnetic sensor 100 detects the rotation angle based on a signal output from magneto-resistive element 12 (S302). In magnetic sensor 100, one rotation of 360° is divided into four quadrants at equal angular intervals of 90° to determine the rotation angle. Based on the signals output from Hall elements 40a and 40b, magnetic sensor 100 determines one quadrant out of the four quadrants which includes a rotation angle detected in Step S302, and detects the number of rotations based on the signals output from Hall elements 40a and 40b (S303). Magnetic sensor 100 transmits the rotation angle and the number of rotations obtained in the above calculation (S302, S303) to the outside.

Figure 4:
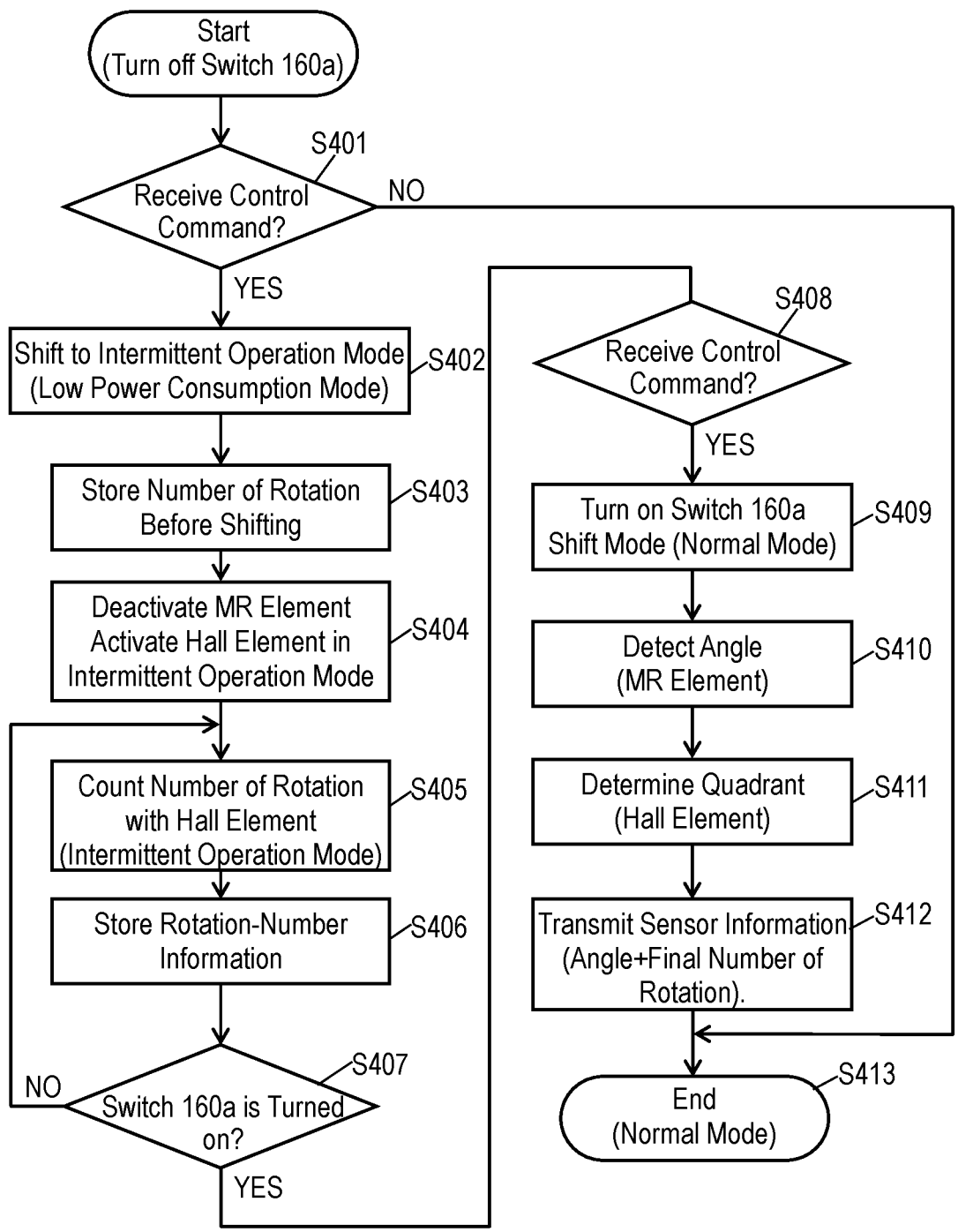
FIG. 4 illustrates another operation of the detection circuit of the magnetic sensor in accordance with the embodiment.

FIG. 4 is a flowchart of another operation of magnetic sensor 100 in accordance with the embodiment, and illustrates an operation of magnetic sensor 100 detecting motion of a steering while switch 160a is turned off.

First, at time point tp1 when switch 160a is turned off, control system 500 inputs a control command signal to magnetic sensor 100 (S401). When the control command signal is input, magnetic sensor 100 is shifted to the intermittent operation mode (S402). When magnetic sensor 100 is shifted to the intermittent operation mode in Step S402, processing unit 70 detects rotation-number information (absolute-angle information) indicating the number of rotations serving as the latest absolute angle before magnetic sensor 100 is shifted to the intermittent operation mode, and then stores rotation-number information (S403). When the absolute-angle information is stored in Step S403, processing unit 70 stops supplying electric power to magneto-resistive element 12 and processing circuit 10m so as to deactivate magneto-resistive element 12 and processing circuit 10m (S404). After that, processing unit 70 detects only the number of rotations of object magnet 142 based on the signals output from Hall elements 40a and 40b (S405). Processing unit 70 stores, in memory 80c, rotation-number information indicating the number of rotations detected in Step S405 (S406). Subsequently, if switch 160a is turned off ("NO" in S407), processing unit 70 detects only the number of rotations of object magnet 142 in Steps S405 and S406 based on the signals output from Hall elements 40a and 40b, and then, stores the detected number of rotations of object magnet 142 in memory 80c. In this way, when switch 160a is turned off ("NO" in S407), processing unit 70 detects only the number of rotations of object magnet 142 based on the signals output from Hall elements 40a and 40b every predetermined time in Steps S405 and S406, and then stores the number of rotations of object magnet 142 in memory 80c. After time point tp1, if switch 160a is turned on in Step S407 ("YES" in S407), control system 500 inputs a control command signal to magnetic sensor 100 at time point tp2 when switch 160a is turned on (S408). Magnetic sensor 100 receives the control command signal to shift to normal mode (S409). When magnetic sensor 100 is transferred to the normal mode in Step S409, processing unit 70 detects a rotation angle of object magnet 142 based on signals output from magneto-resistive element 12 (S410). Based on the signals output from Hall elements 40a and 40b, processing unit 70 determines one quadrant out of the quadrants which includes the detected rotation angle of object magnet 142 (S411). After that, processing unit 70 outputs the rotation-number information and the absolute-angle information to the outside, simultaneously. Herein, the above-mentioned rotation-number information is obtained as a detection result of the rotation angle and the quadrant of the rotation angle. The above-mentioned absolute-angle information is stored in Step S402 and indicates the last number of rotations stored when the intermittent operation mode has been started. The term "simultaneously" does not necessarily mean that two outputs are output at the completely same time, but may include the case where two outputs are output substantially at the same time. In this way, in the intermittent operation mode, magneto-resistive element 12 or processing circuit 10m does not operate temporarily, thereby reducing power consumption.

In the intermittent operation mode, internal clock S80b generated by oscillator 80b is used for various operations of detection circuit 10. The frequency of internal clock S80b is determined according to a cycle of operations in the intermittent operation mode. The operation based on internal clock S80b reduces the power consumption, and is highly efficient. Two oscillators 80a and 80b can observe (diagnosis) oscillators 80a and 80b from each other.

Rotation detecting device 150 used together with switch 160a detects rotation of rotation shaft 144 to which object magnet 142 serving as a magnetic body is attached. Rotation detecting device 150 includes magneto-resistive element 12 that outputs signals (signal sin, signal cos) related to displacement of the magnetic body (object magnet 142), Hall element 40a (40b) that is disposed at a position facing the magnetic body (object magnet 142) and outputs signals (signals S44a and S44b) related to displacement of the magnetic body (object magnet 142), and detection circuit 10 to which the above-mentioned signals (signal sin, signal cos) and the above-mentioned signals (signal S44a, S44b) are input. Detection circuit 10 is configured to output the above-mentioned signals (signal sin, signal cos) when switch 160a is turned on. At time point tp1 when switch 160a is turned off, detection circuit 10 is configured to detect rotation-number information corresponding to the number of rotations of rotation shaft 144 from the above-mentioned signal (signal S44a, S44b). Detection circuit 10 is configured to store the rotation-number information. At time point tp2 when switch 160a is turned on after time point tp1, detection circuit 10 is configured to output the stored rotation-number information.

Detection circuit 10 may use pulse signal S44a obtained by binarizing an output of Hall element 40a and use pulse signal S44b obtained by binarizing an output of Hall element 40b to detect rotation-number information.

Detection circuit 10 may use the signals (signal sin, signal cos) output from magneto-resistive element 12 to detect absolute-angle information indicating an angle of the magnetic body (object magnet 142) at time point tp2. In this case, detection circuit 10 is configured to output the stored rotation-number information and the stored absolute-angle information simultaneously.

Detection circuit 10 may include oscillator 80a generating internal clock S80a, and oscillator 80b generating internal clock S80b having a different frequency from internal clock S80a.

When switch 160a is turned off, detection circuit 10 may be configured to stop supplying a current supplied to oscillator 80a and to continue to supply current to oscillator 80b.

Detection circuit 10 may further include regulators 60b and 60c. Regulator 60b supplies potential V1 to oscillator 80a. Regulator 60c supplies potential V2 to oscillator 80b.

Detection circuit 10 may further include regulator 60a supplying potential VS (VC) to magneto-resistive element 12.

Regulator 60b supplies potential V1 to Hall element 40a (40b) and oscillator 80a.

The frequency of internal clock S80b may be lower than the frequency of internal clock S80a.

Rotation detecting device 150 (magnetic sensor 100) includes magneto-resistive element 12, Hall element 40a (40b), and detection circuit 10 to which a signal from magneto-resistive element 12 and a signal from Hall element 40a (40b) are input. Detection circuit 10 includes oscillator 80a generating internal clock S80a, regulator 60b supplying potential V1 to oscillator 80a, oscillator 80b generating internal clock S80b, regulator 60c supplying potential V2 to oscillator 80b, and regulator 60a supplying potential VS (VC) to magneto-resistive element 12.

Regulator 60b may supply potential V1 to Hall element 40a (40b) and oscillator 80a.

Detection circuit 10 may process the signal from magneto-resistive element 12 and the signal from Hall element 40a (40b) based on internal clock S80a. Detection circuit 10 may process the signal from Hall element 40a (40b) based on internal clock S80b.

Rotation detecting device 150 includes magneto-resistive element 12, Hall element 40a (40b), and detection circuit 10 to which a signal from magneto-resistive element 12 and a signal from Hall element 40a (40b) are input. Detection circuit 10 includes oscillators 80a and 80b. Oscillator 80a generates internal clock S80a. Oscillator 80b generates internal clock S80b having a different frequency from internal clock S80a.

Figure 5:
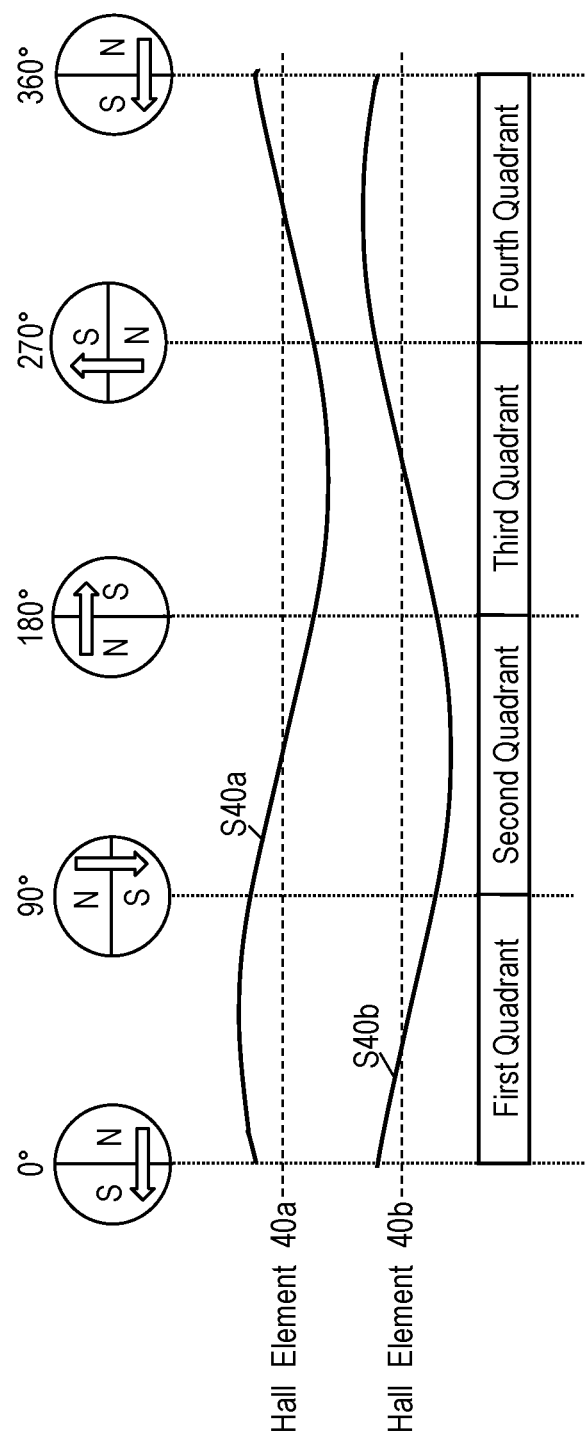
FIG. 5 illustrates still another operation of the detection circuit of the magnetic sensor in accordance with the embodiment.

FIG. 5 shows an operation of magnetic sensor 100 for detecting a rotation angle of object magnet 142 by using Hall elements 40a and 40b, and particularly shows signal S40a and S40b output from Hall elements 40a and 40b. In FIG. 5, the vertical axis represents values of signal S40a and S40b, and the horizontal axis represents a rotation angle of object magnet 142. FIG. 5 shows quadrants including the rotation angle of object magnet 142. Rotation angles of object magnet 142 ranging from 0° to 90° are included in the first quadrant. Rotation angles of object magnet 142 ranging from 90° to 180° are included in the second quadrant. Rotation angles of object magnet 142 ranging from 180° to 270° are included in the third quadrant. Rotation angles of object magnet 142 ranging from 270° to 360° are included in the fourth quadrant.

The signals obtained from the magneto-resistive elements have sine and cosine waves of angles which are twice rotation angle θ of the object magnet. Therefore, a magnetic sensor equipped with only one magneto-resistive element can only detect an angle ranging from 0° to 180°. In such a magnetic sensor, for example, signals at 90° and 270° cannot be distinguished from each other since these angles correspond to the same signal.

On the other hand, as shown in FIG. 5, the signals obtained in a Hall element typically have sine and cosine waves of angles identical to rotation angle θ of an object. Accordingly, a magnetic sensor equipped with a Hall element can detect an angle ranging from 0° to 360°.

Magnetic sensor 100 according to the embodiment includes a combination of a magneto-resistive element and a Hall element. Thus, a rotation angle of object magnet 142 is detected in a range of 0° to 360°.

Figure 6:
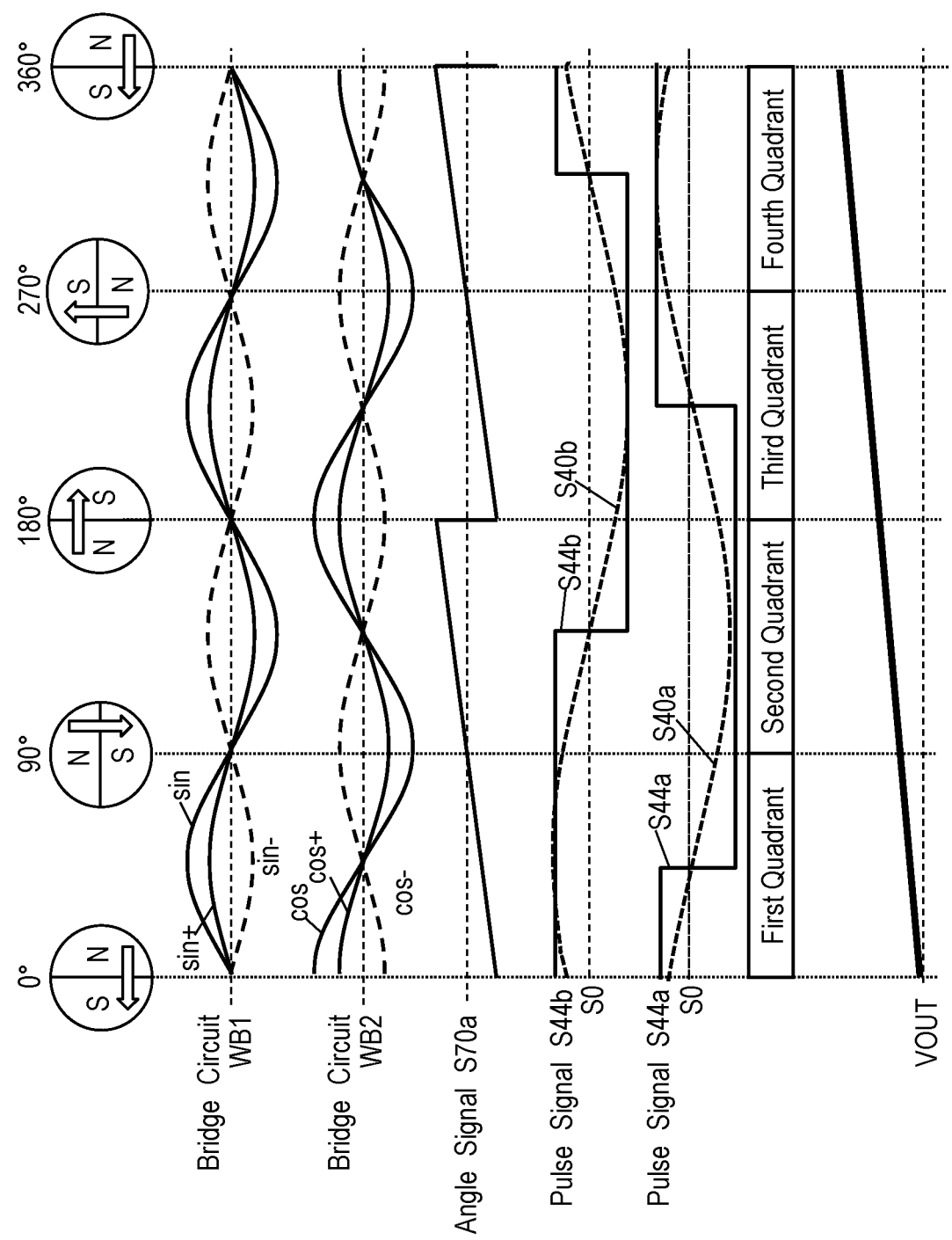
FIG. 6 illustrates an operation of the magnetic sensor in accordance with the embodiment.

FIG. 6 shows an operation of detection circuit 10 in which each magneto-resistive element detects a rotation angle of object magnet 142 while switch 160a is turned off. FIG. 6 shows signal sin+ and signal sin− output from bridge circuit WB1, signal cos+ and signal cos− output from bridge circuit WB2, and signal sin and signal cos output from AD converters 18a and 18b which are connected to differential amplifiers 16a and 16b, respectively. In FIG. 6, a vertical axis represents a value of each of the signals, and a horizontal axis represents a rotation angle of object magnet 142. FIG. 6 further shows angle signal S70a output from angle detection circuit 70a, pulse signals S44a and S44b output from comparators 44a and 44b, and a quadrant including rotation angle θ of object magnet 142.

Comparators 44a and 44b generate pulse signals S44a and 44b by binarizing signals from Hall elements 40a and 40b, i.e., by comparing signals from Hall elements 40a and 40b with threshold S0 to convert the signals into binary signals. When values of signals S40a and S40b are more than or equal to threshold S0, pulse signals S44a and 44b each have a value at a high level serving as an active level. When values of signals S40a and S40b are less than threshold S0, pulse signals S44a and 44b each have a value at a low level serving as an inactive level.

Based on pulse signals S44a and S44b for quadrant determination, pulse signals S44a and S44b are configured to have one pulse for one rotation and can count four quadrants in the one rotation. Specifically, at the time of rise and fall of pulse signal S44a, the number of pulse signals S44a or the number of pulse signals S44b is counted according to a state of pulse signal S44b. A method of calculating the number of rotations of object magnet 142 will be described below.

In accordance with the embodiment, when rotation angle θ ranges from 00 to 45° or from 225° to 360°, a value of pulse signal S44a is at the high level. When rotation angle θ ranges from 45° to 225°, the value of pulse signal S44a is at the low level. When rotation angle θ ranges from 0° to 135° or from 315° to 360°, a value of pulse signal S44b is at the high level. When rotation angle θ ranges from 135° to 315°, the value of pulse signal S44b is at the low level. While object magnet 142 rotates in normal rotation direction Df, pulse signal S44a falls down at a rotation angle θ of 45°, and pulse signal S44a rises up at a rotation angle θ of 225°. Similarly, while object magnet 142 rotates in normal rotation direction Df, pulse signal S44b falls down at a rotation angle θ of 135°, and pulse signal S44b rises up at a rotation angle θ of 315°. On the other hand, while object magnet 142 rotates in reverse rotation direction Dr, pulse signal S44a rises up at a rotation angle θ of 45°, and pulse signal S44a falls down at a rotation angle θ of 225°. Similarly, while object magnet 142 rotates in reverse rotation direction Dr, pulse signal S44b rises up at a rotation angle θ of 135°, and pulse signal S44b falls down at a rotation angle θ of 315°. Accordingly, when rotation angle θ becomes 45° or 225° at which the value of pulse signal S44a is changed, rotation number detection circuit 70b determines the rotation direction.

Object magnet 142 rotates in two directions i.e., normal rotation direction Df and reverse rotation direction Dr opposite to normal rotation direction Df. When the value of pulse signal S44a changes, rotation number detection circuit 70b of processing unit 70 detects the rotation direction and the number of rotations of object magnet 142 based on the value of pulse signal S44b and the change of the value of pulse signal S44a.

Specifically, in accordance with the embodiment, rotation number detection circuit 70b will determine that object magnet 142 rotates in normal rotation direction Df by one rotation if detecting that the value of pulse signal S44b is at the low level at the time when the value of pulse signal S44a rises to change from the low level to the high level, and subsequently, the value of pulse signal S44b is at the high level at the time when the value of pulse signal S44a falls to change from the high level to the low level, and subsequently, the value of pulse signal S44b is at the low level at the time when pulse signal S44a rises.

Rotation number detection circuit 70b determines that object magnet 142 rotates in reverse rotation direction Dr by one rotation if detecting that: the value of pulse signal S44b is at the high level at the time when pulse signal S44a rises, and subsequently, the value of pulse signal S44b is at the low level at the time when pulse signal S44a falls down, and subsequently, the value of pulse signal S44b is at the high level at the time when pulse signal S44a rises.

The rotation angle between object magnet 142 and motor 158 rotating while switch 160a is turned off can thus be detected precisely with low electric power at the time when switch 160a is turned on again.

Processing unit 70 of magnetic sensor 100 has an active correction mode and a passive correction mode. The active correction mode is an auto-calibration mode for correcting signal sin and signal cos output from magneto-resistive element 12 via processing circuit 10m. The passive correction mode is a temperature-characteristic correction mode.

First, an operation of the passive correction mode will be described.

Memory 80c stores formulas indicating a relation between temperature and offset included in each of signal sin and signal cos output from magneto-resistive element 12 via processing circuit 10m. In accordance with the embodiment, memory 80c stores coefficients of polynomial function that approximate the relation between the temperature and the offset included in each of signal sin and signal cos. Memory 80c further stores formulas indicating a relation between temperature and amplitude of each of signal sin and signal cos converted into digital signals. In accordance with the embodiment, memory 80c stores coefficients of polynomial function that approximate the relation between the temperatures and the amplitude of each of signal sin and signal cos converted into digital signals.

Temperature sensor 80d outputs temperature information which is a digital signal corresponding to temperature. Offset-temperature characteristic correction circuit 70c performs arithmetic processing based on temperature information input from temperature sensor 80d and the coefficients of relation function between the offset and the temperature stored in memory 80c. Thus, a change in the offset of each of signal sin and signal cos which depends on temperature is corrected.

Gain-temperature-characteristic correction circuit 70d performs arithmetic processing based on temperature information input from temperature sensor 80d and the coefficients of relation function between amplitude and temperature stored in memory 80c. Thus, a change in amplitude of each of signal sin and signal cos which depends on temperature is corrected.

Next, the active correction mode will be described.

In the active correction mode, automatic correction circuit 70e generates and updates a correction value for correcting the offset and the amplitude of each of signal sin and signal cos output from magneto-resistive element 12 via processing circuit 10m. Automatic correction circuit 70e thus updates the correction value every one rotation of object magnet 142. Based on the updated correction value, signal sin and signal cos are corrected such that signal sin and signal cos continuously have a fixed midpoint and fixed amplitude.

Figure 7A:
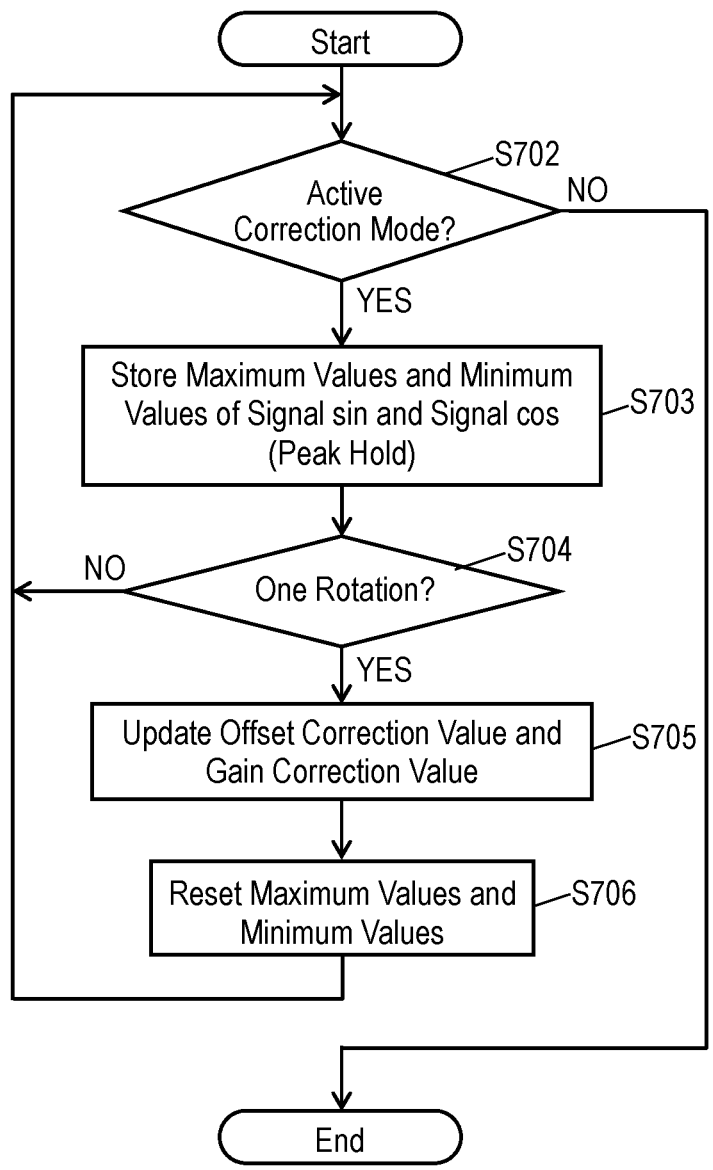
FIG. 7A is a flowchart for explaining a further operation of the detection circuit of the magnetic sensor in accordance with the embodiment.

FIG. 7A shows an operation of detection circuit 10 in the active correction mode.

Processing unit 70 determines whether processing unit 70 is in the active correction mode or not (S702). In the active correction mode ("Yes" in step S702), automatic correction circuit 70e of processing unit 70 stores maximum value Vmax1 and minimum value of signal sin output from magneto-resistive element 12 via processing circuit 10m, and stores maximum value Vmax2 and minimum value Vmin2 of signal cos output from magneto-resistive element 12 via processing circuit 10m (S703). After that, automatic correction circuit 70e determines whether object magnet 142 rotates by one rotation or not (S704). When determining that object magnet 142 rotates by one rotation in step S704 ("Yes" in step S704), automatic correction circuit 70e performs the calculation of (Vmax1+Vmin1)/2 to generate and update the correction value for correcting the offset of signal sin. Further, automatic correction circuit 70e performs the calculation of (Vmax2+Vmin2)/2 to generate and update the correction value for correcting the offset of signal cos. At the same time, automatic correction circuit 70e performs the calculation of (Vmax1−Vmin1) to update the correction value for correcting the amplitude of signal sin. Further, automatic correction circuit 70e performs the calculation of (Vmax2-Vmin2) to update the correction value for correcting the amplitude of signal cos (S705). After that, the stored maximum values Vmax1 and Vmax2 and the stored minimum values Vmin1 and Vmin2 are reset to zero (S706). Subsequently, processing unit 70 determines, in step S702, whether processing unit 70 is in active correction mode or not.

Based on the updated offset and amplitude, signal sin and signal cos are corrected until object magnet 142 completes the next one rotation.

When it is determined that object magnet 142 does not rotate by one rotation in step S704 ("No" in step S704), processing unit 70 determines, in step S702, whether processing unit 70 is in the active correction mode or not.

In the active correction mode ("Yes" in step S702), automatic correction circuit 70e continues to store the maximum values Vmax1 and Vma2 and the minimum values Vmin1 and Vmin2 until object magnet 142 completes the next one rotation. Since that time, the same operation as step S703 is repeated. Automatic correction circuit 70e continues to store the maximum values Vmax1 and Vma2 and the minimum values Vmin1 and Vmin2 during the one rotation until object magnet 142 completes the next one rotation.

If processing unit 70 is not in the active correction mode ("No" in step S702), processing unit 70 does not perform the process shown in FIG. 7A.

Rotation number detection circuit 70b determines whether object magnet 142 rotates by one rotation or not based on the pulse signals S44a and S44b by the above-mentioned method at the time when the value of rotation angle θ output from angle detection circuit 70a is jumped to 0° from 3600 (normal rotation direction Df) or at the time when the value of rotation angle θ is jumped to 360° from 0° (reverse rotation direction Dr). When a direction (normal rotation direction Df or reversal direction Dr) of the rotation is different from the latest determination, rotation number detection circuit 70b determines that object magnet 142 does not rotate by one rotation, and automatic correction circuit 70e does not update the correction values of the offset and amplitude of signal sin and signal cos. The operation will be detailed below.

Figure 7B:
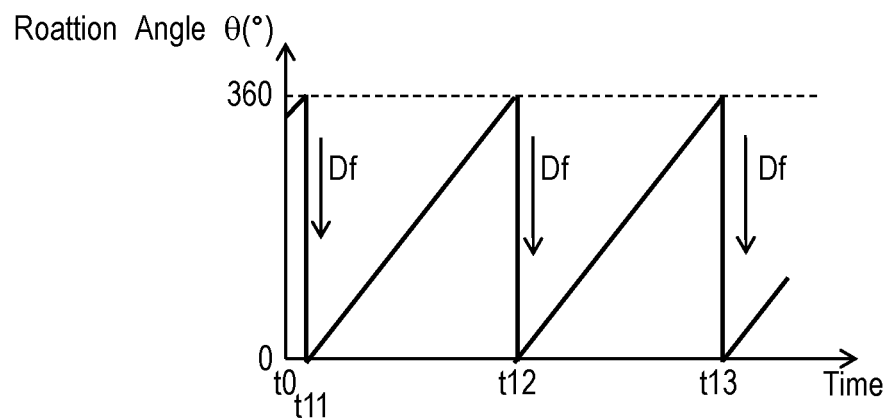
FIG. 7B schematically illustrates an operation of correcting the detection circuit of the magnetic sensor in accordance with the embodiment.
Figure 7C:
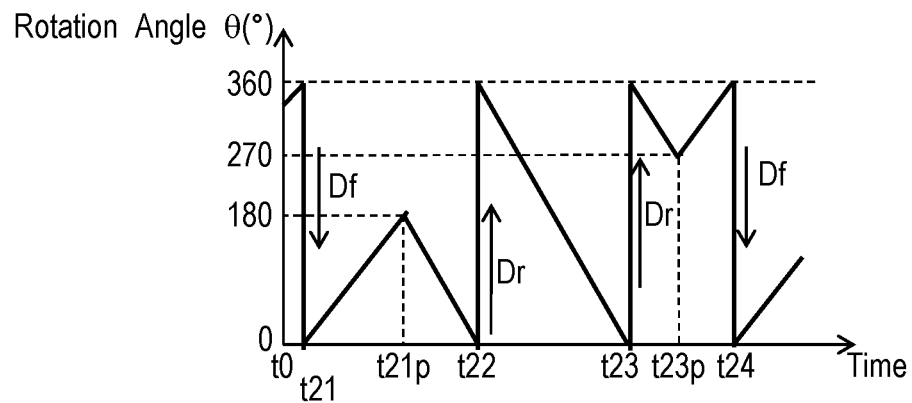
FIG. 7C is a schematic diagram of the detection circuit of the magnetic sensor in accordance with the embodiment for explaining an operation of correcting of the detection circuit.

FIG. 7B and FIG. 7C are schematic diagrams illustrating an operation correcting rotation angle θ detected by rotation number detection circuit 70b in the active correction mode. In FIG. 7B and FIG. 7C, the vertical axis represents a value of rotation angle θ of object magnet 142 calculated in angle detection circuit 70a, and a horizontal axis represents time.

In the operation shown in FIG. 7B, object magnet 142 rotates in normal rotation direction Df over a period from before time point t0 until after time point t13. According to this rotation, rotation angle θ output from rotation number detection circuit 70b increases at time point t0. Rotation angle θ reaches 360° and jumps to 0° at time point t11, and then, starts increasing. Rotation angle θ starts increasing from 0° at time point t11, and then, reaches 360° and jumps to 0° at time point t12, and then starts increasing again. Rotation angle θ starts increasing from 0° at time point t12. Rotation angle θ reaches 360° and jumps to 0° at time point t13, and then, starts increasing again. As mentioned above, based on pulse signals S44a and S44b, rotation number detection circuit 70b determines that object magnet 142 rotates by one rotation in normal rotation direction Df before each of time points t11, t12, and t13. When determining that object magnet 142 rotates in the same direction as the last-time determination, i.e., normal rotation direction Df, automatic correction circuit 70e updates correction values of offset and amplitude of each of signal sin and signal cos at time points t12 and t13. At time point t11 when the rotation direction is not determined, automatic correction circuit 70e does not update the correction values of the offset and amplitude each of signal sin and signal cos.

Similarly, when the rotation direction determined last time is the reverse rotation direction and the rotation direction determined at this time is the reverse rotation direction, automatic correction circuit 70e determines that object magnet 142 rotates by one rotation, and updates the correction values.

In the operation shown in FIG. 7C, object magnet 142 rotates in normal rotation direction Df from before time point t0 until time point t21p through time point t21, and rotates in reverse rotation direction Dr from time point t21p until time point t23p through time points t22 and t23. Then, object magnet 142 rotates in normal rotation direction Df from time point t23p until after t24. In the operation, the rotation direction in which object magnet 142 is rotated changes at time points t21p and t23p. According to the rotation, rotation angle θ output from rotation number detection circuit 70b increases at time point t0. At time point t21, rotation angle θ reaches 360° and jumps to 0°, and then starts increasing. Rotation angle θ starts increasing from 0° at time point t21. At time point t21p, rotation angle θ reaches 180°, and then starts decreasing. Rotation angle θ starts decreasing from 180° at time point t21p. At time point t22, rotation angle θ reaches 0° and jumps to 360°, and then starts decreasing again. Rotation angle θ starts decreasing from 360° at time point t22. At time point t23, rotation angle θ reaches 0° and jumps to 360°, and then starts decreasing again. Rotation angle θ starts decreasing from 360° at time point t23. At time point t23p, rotation angle θ reaches 270°, and then starts increasing from 270°. Rotation angle θ starts increasing from 270° at time point t23p. At time point t24, rotation angle θ reaches 360° and jumps to 0°, and then starts increasing again. As mentioned above, based on pulse signals S44a and S44b, rotation number detection circuit 70b determines that object magnet 142 rotates by one rotation in reverse rotation direction Dr before each of time points t22 and t23. When it is determined that object magnet 142 rotates in the same direction as the last time determination, i.e., reverse rotation direction Dr, automatic correction circuit 70e updates the correction values of the offset and amplitude of each of signal sin and signal cos at time point t23.

As shown in FIG. 7C, the rotation direction at time point t21 in the last time determination is normal rotation direction Df, and a rotation direction at time point t22 in this time determination is reverse rotation direction Dr. In this case, automatic correction circuit 70e determines that object magnet 142 does not rotate by one rotation, and does not update the correction values.

After that, in the case where the rotation direction at time point t22 in the last time determination is reverse rotation direction Dr and a rotation direction at time point t23 in this time determination is reverse rotation direction Dr, automatic correction circuit 70e determines that object magnet 142 rotates by one rotation, and updates the correction values.

After that, in the case where the rotation direction at time point t23 in the last time determination is reverse rotation direction Dr and a rotation direction at time point t24 in this time determination is normal rotation direction Df, automatic correction circuit 70e determines that object magnet 142 does not rotate by one rotation, and does not update the correction values.

When not updating the correction values, automatic correction circuit 70e does not necessarily generate a correction value.

The correction values are updated in the configuration even when the offset and amplitude of each of signal sin and signal cos from magneto-resistive element 12 change with respect to time. This operation maintains the offset and amplitude constant. At the same time, even when object magnet 142 rotates in both directions, i.e., normal rotation direction Df and reverse rotation direction Dr, offset can be updated correctly.

Magnetic sensor 100 does not preferably operate in the passive correction mode when operating in the active correction mode. Magnetic sensor 100 does not preferably operate in the active correction mode when operating in the passive correction mode. In another expression, magnetic sensor 100 switches between the active correction mode and the passive correction mode to operate. In the configuration, while magnetic sensor 100 operates in the active correction mode, signal sin and signal cos are corrected with respect to all of temporal changes including temperature characteristics. Therefore, magnetic sensor 100 does not necessarily operate in the passive correction mode. On the other hand, in the active correction mode, the correction values are not updated until object magnet 142 rotates by one rotation. Accordingly, in the case where object magnet 142 does not rotate by one rotation, if the offset and the amplitude are changed largely during the rotation of object magnet 142, magnetic sensor 100 operate more preferably in the passive correction mode than in the active correction mode.

In the active correction mode, both the offset and amplitude of the signal are corrected, but not limited to this. At least one of the offset and amplitude may be corrected, i.e., only the offset out of the offset and amplitude may be corrected, or only the gain out of the offset and amplitude may be corrected.

In description of the active correction mode and the passive correction mode, signal sin and signal cos from magneto-resistive element 12 are corrected, but not limited to this. As long as being a magnetic detection element for detecting a magnetic field from object magnet 142 and outputting signal sin and signal cos according to the rotation of object magnet 142, magneto-resistive element 12 is not necessarily made of magneto-resistive material. In other words, the active correction mode and the passive correction mode can be used for correcting signal sin and signal cos of the magnetic detection element.

As mentioned above, rotation detecting device 150 (magnetic sensor 100) for detecting rotation of an object (object magnet 142) includes magnetic detection elements (magneto-resistive elements 12a and 12c) that output signal sin, magnetic detection elements (magneto-resistive elements 12e and 12f) that output signal cos, and detection circuit 10 to which signal sin and signal cos are input. Detection circuit 10 includes automatic correction circuit 70e that performs generation and update of correction values to correct signal sin and signal cos. Automatic correction circuit 70e is configured to stop the generation or the update of correction values in at least one of the case where a rotation direction of the object (object magnet 142) changes from normal rotation direction Df to reverse rotation direction Dr, or the case where a rotation direction of the object (object magnet 142) changes from reverse rotation direction Dr to normal rotation direction Df.

Detection circuit 10 may further include angle detection circuit 70a that outputs an angle signal indicating the rotation angle of the object (object magnet 142) based on signal sin and signal cos. In this case, a rotation direction in which an angle of the angle signal changes to 0° from 360° is normal rotation direction Df. A rotation direction in which an angle of the angle signal changes to 360° from 0° is reverse rotation direction Dr.

Signal sin is a sine wave signal, and signal cos is a sine wave signal. Detection circuit 10 may further include angle detection circuit 70a that performs an arc tangent calculation on signal sin and signal cos to obtain the angle signal. In this case, a rotation direction in which an angle of the angle signal changes to 0° from 360° is normal rotation direction Df, and a rotation direction in which the angle changes from 0° to 360° is reverse rotation direction Dr.

Detection circuit 10 may further include temperature-characteristic correction circuit 70p that corrects at least one of the amplitude and offset of each of signal sin and signal cos according to the temperature. In this case, detection circuit 10 has an active correction mode in which automatic correction circuit 70e corrects signal sin and signal cos without temperature-characteristic correction circuit 70p, and a passive correction mode in which temperature-characteristic correction circuit 70p corrects signal sin and signal cos without automatic correction circuit 70e. Detection circuit 10 is configured to switch between the active correction mode and the passive correction mode.

Detection circuit 10 may further include temperature sensor 80d that detects temperature, and memory 80c that stores plural values of the offset of signal sin each corresponding to respective one of plural values of the temperature. In this case, temperature-characteristic correction circuit 70p adds a value of the offset corresponding to a value of the detected temperature out of the stored plural values of the offset to signal sin.

Memory 80c may store plural values related to the offset of the differential signal each corresponding to respective one of plural values of the temperature. In this case, temperature-characteristic correction circuit 70p adds a value related to the offset corresponding to a value of the detected temperature out of the stored plural values related to the offset to signal sin.

Memory 80c may store plural values related to the amplitude of signal sin each corresponding to respective one of plural values of the temperature. In this case, temperature-characteristic correction circuit 70p adds, to signal sin, a value related to the amplitude corresponding to a value of the detected temperature out of the stored plural values related to the amplitude.

Memory 80c may store plural values related to the amplitude of the differential signal each corresponding to respective one of plural values of the temperature. In this case, temperature-characteristic correction circuit 70p adds, to signal sin, a value related to the amplitude corresponding to the detected value of the temperature out of the stored plural values related to the amplitude.

The magnetic detection elements (magneto-resistive elements 12a and 12c) and the magnetic detection elements (magneto-resistive elements 12e and 12f) may contain magneto-resistive material.

Rotation detecting device 150 (magnetic sensor 100) that detects rotation of the object (object magnet 142) includes magnetic detection elements (magneto-resistive elements 12a and 12c) that output signal sin, magnetic detection elements (magneto-resistive elements 12e and 12f) that output signal cos, and detection circuit 10 to which signal sin and signal cos are input. Detection circuit 10 includes temperature-characteristic correction circuit 70p that corrects at least one of amplitude and offset of each of signal sin and signal cos according to the temperature, and automatic correction circuit 70e that performs generation and update of correction values to correct signal sin and signal cos.

Detection circuit 10 may further include angle detection circuit 70a that outputs an angle signal indicating an angle of the object (object magnet 142) based on signal sin and signal cos.

When the angle indicated by the angle signal changes to 0° from 360° again after changing to 0° from 360°, or when the angle indicated by the angle signal changes to 360° from 0° again after changing to 360° from 0°, automatic correction circuit 70e may perform at least one of the generation and the update of the correction values.

When temperature-characteristic correction circuit 70p operates, automatic correction circuit 70e does not necessarily operate.

Rotation detecting device 150 including the magnetic detection elements (magneto-resistive elements 12a and 12c) and the magnetic detection elements (magneto-resistive elements 12e and 12f) and detecting rotation of the object (object magnet 142) corrects signals by the method below. According to the rotation of the object (object magnet 142), signal sin and signal cos are obtained from the magnetic detection elements (magneto-resistive elements 12a and 12c) and the magnetic detection elements (magneto-resistive elements 12e and 12f), respectively. Signal sin, signal cos, and a correction value for correction are generated and updated. Rotation detecting device 150 detects that the rotation direction of the object (object magnet 142) changes to reverse rotation direction Dr from normal rotation direction Df or that the rotation direction of an object (object magnet 142) changes to normal rotation direction Df from reverse rotation direction Dr. When detecting that the rotation direction of the object (object magnet 142) changes to reverse rotation direction Dr from normal rotation direction Df or that the rotation direction of the object (object magnet 142) changes to normal rotation direction Df from reverse rotation direction Dr, rotation detecting device 150 stops the above-mentioned operation i.e., the generation and the update of correction values.

The angle signal indicating an angle of the object (object magnet 142) may be obtained from signal sin and signal cos. In this case, a direction in which the angle indicated by the angle signal changes to 0° from 360° is defined as normal rotation direction Df. A direction in which the angle changes from 0° to 360° is defined as reverse rotation direction Dr.

Figure 8:
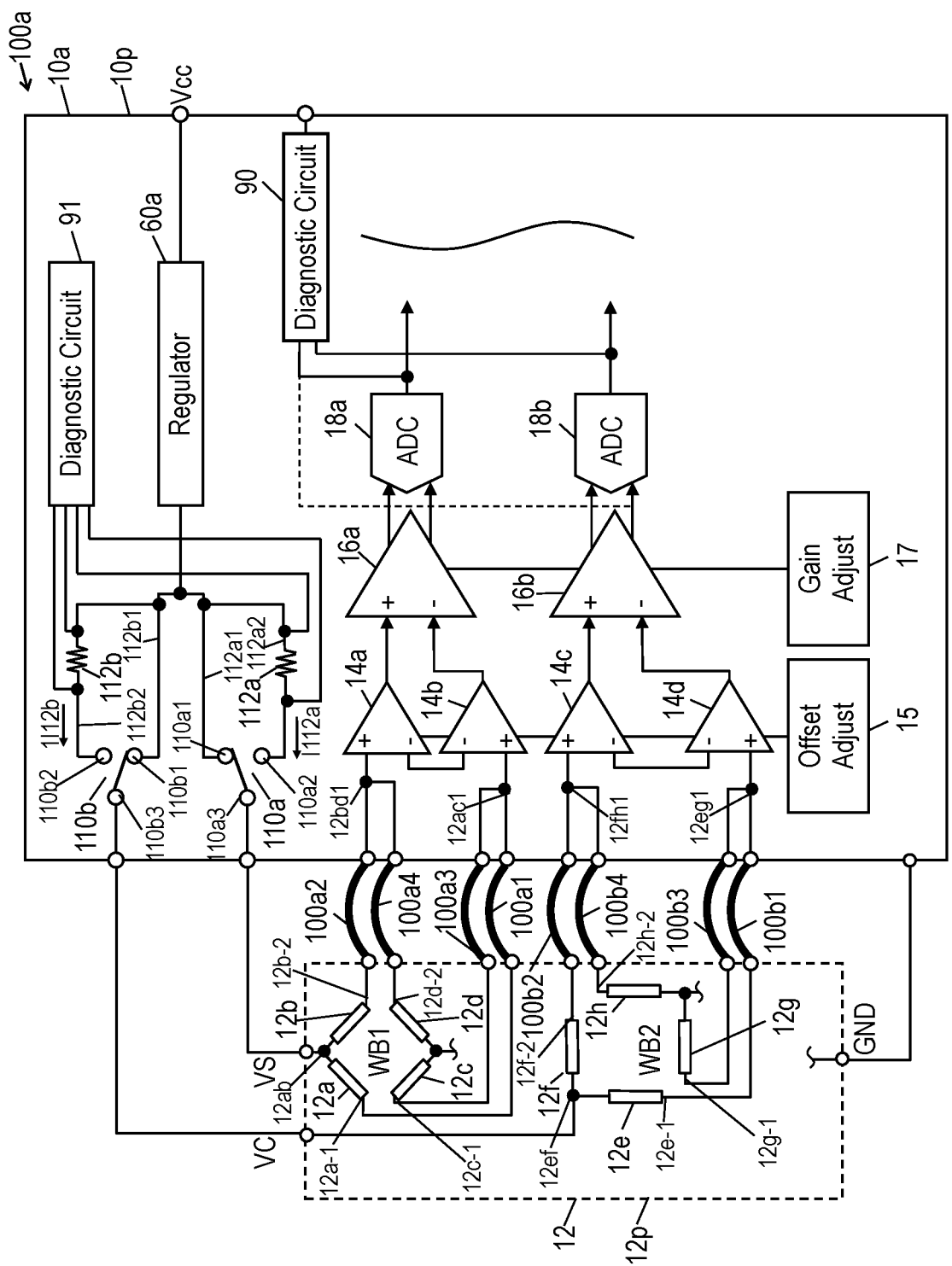
FIG. 8 is a block diagram of another magnetic sensor in accordance with the embodiment.

FIG. 8 is a block diagram of another magnetic sensor 100a in accordance with the embodiment. In FIG. 8, components identical to those of magnetic sensor 100 shown in FIGS. 1A and 1B are denoted by the same reference numerals. Magnetic sensor 100a includes detection circuit 10a mounted on substrate 10p instead of detection circuit 10 of magnetic sensor 100 shown in FIG. 1A. Detection circuit 10a further includes diagnostic circuits 90 and 91, switches 110a and 110b, and resistors 112a and 112b.

End 12a-2 of magneto-resistive element 12a and end 12b-1 of magneto-resistive element 12b are connected to potential VS (see FIG. 1B). End 12c-2 of magneto-resistive element 12c and end 12d-1 of magneto-resistive element 12d are connected to ground GND (see FIG. 1B). End 12a-1 of magneto-resistive element 12a is connected to detection circuit 10a via wiring 100a1. End 12b-2 of magneto-resistive element 12b is connected to detection circuit 10a via wiring 100a2. End 12c-1 of magneto-resistive element 12c is connected to detection circuit 10a via wiring 100a3. End 12d-2 of magneto-resistive element 12d is connected to detection circuit 10a via wiring 100a4.

Inside detection circuit 10a, wiring 100a1 and 100a3 are connected to each other at node 12ac1. Inside detection circuit 10a, end 12a-1 of magneto-resistive element 12a and end 12c-1 of magneto-resistive element 12c are connected to each other at node 12ac1 via wirings 100a1 and 100a3. Node 12ac1 constitutes a midpoint of bridge circuit WB1. A signal at node 12ac1 is input to amplifier 14b to be amplified, and then, input to differential amplifier 16a.

Inside detection circuit 10a, wirings 100a2 and 100a4 are connected to each other at node 12bd1. Inside detection circuit 10a, end 12b-2 of magneto-resistive element 12b and end 12d-2 of magneto-resistive element 12d are connected to each other at node 12bd1 via wirings 100a2 and 100a4. Node 12bd1 constitutes another midpoint of bridge circuit WB1. A signal at node 12bd1 is input to amplifier 14a to be amplified, and then, input to differential amplifier 16a.

End 12e-2 of magneto-resistive element 12e and end 12f-1 of magneto-resistive element 12f are connected to potential VC (see FIG. 1B). End 12g-2 of magneto-resistive element 12g and end 12h-1 of magneto-resistive element 12h are connected to ground GND (see FIG. 1B). End 12e-1 of magneto-resistive element 12e is connected to detection circuit 10a via wiring 100b1. End 12f-2 of magneto-resistive element 12f is connected to detection circuit 10a via wiring 100b2. End 12g-1 of magneto-resistive element 12g is connected to detection circuit 10a via wiring 100b3. End 12h-2 of magneto-resistive element 12h is connected to detection circuit 10a via wiring 100b4.

End 12e-1 of magneto-resistive element 12e is connected to detection circuit 10a via wiring 100b1. End 12f-2 of magneto-resistive element 12f is connected to detection circuit 10a via wiring 100b2. End 12g-1 of magneto-resistive element 12g is connected to detection circuit 10a via wiring 100b3. End 12h-2 of magneto-resistive element 12h is connected to detection circuit 10a via wiring 100b4.

Inside detection circuit 10a, wirings 100b1 and 100b3 are connected to each other at node 12eg1. Inside detection circuit 10a on substrate 10p, end 12e-1 of magneto-resistive element 12e and end 12g-1 of magneto-resistive element 12g are connected to each other at node 12eg1 via wirings 100b1 and 200b3. Node 12eg1 constitutes a midpoint of bridge circuit WB2. A signal at node 12eg1 is input to amplifier 14d to be amplified, and then, input to differential amplifier 16b.

Inside detection circuit 10a, wirings 100b2 and 100b4 are connected to each other at node 12fh1. Inside detection circuit 10a, end 12f-2 of magneto-resistive element 12f and end 12h-2 of magneto-resistive element 12h are connected to each other at node 12fh1. Node 12fh1 constitutes another midpoint of bridge circuit WB2. A signal at node 12fh1 is input to amplifier 14c to be amplified, and then, input into differential amplifier 16b.

Wirings 100a1 to 100a4 and wirings 100b1 to 100b4 are bonding wires, such as metal wires employed for wire bonding.

Magnetic sensor 100a can detect disconnection of wirings 100a1 to 100a4 and wirings 100b1 to 100b4 which connect detection circuit 10a to magneto-resistive element 12. The operation will be described below.

In a normal operation, i.e., when none of wirings 100a1 to 100a4 and 100b1 to 100b4 are disconnected, the potentials of nodes 12ac1 12bd1, 12eg1, and 12fh1 being signals output from magneto-resistive element 12 are substantially equal to potentials of the midpoints. As a result, outputs of amplifiers 14a to 14d, differential amplifiers 16a and 16b, and AD converter 18a are substantially equal to the potentials of the midpoints. On the other hand, if a wiring out of wirings 100a1 to 100a4 and wirings 100b1 to 100b4 is disconnected, a node out of nodes 12ac1, 12bd1, 12eg1, and 12fh1 connected to the disconnected wiring becomes either one of potential VS, potential VC, or a ground potential. Potential VS and potential VC are fixed potentials. Accordingly, the outputs of amplifiers 14a to 14d, differential amplifiers 16a and 16b, and AD converters 18a and 18b are fixed to have either one of potential VS, potential VC, or the ground potential, which are fixed potential. As a result, when detecting that the output of AD converter 18a or AD converter 18b deviates from a predetermined normal operation range, diagnostic circuit 90 determines that magnetic sensor 100a is in an abnormal operation, and then, outputs an abnormal signal. This configuration can detect the disconnection of wirings connecting magneto-resistive element 12 to detection circuit 10a.

When detecting that the output of differential amplifier 16a or 16b, rather than AD converter 18a or 18b, deviates from the predetermined normal operation range, diagnostic circuit 90 determines that magnetic sensor 100a is in an abnormal operation, and may output an abnormal signal.

Bridge circuit WB1 constituted by magneto-resistive elements 12a to 12b, and bridge circuit WB2 constituted by magneto-resistive elements 12e to 12h are provided on substrate 12p. Detection circuit 10a is provided on substrate 10p. The midpoints constituted by nodes 12ac1 and 12bd1 of bridge circuit WB1 are provided on substrate 10p. The midpoints constituted by nodes 12eg1 and 12fh1 of bridge circuit WB2 are provided on substrate 10p.

Magnetic sensor 100a can detect abnormalities in resistances of magneto-resistive element 12. The operation will be described below.

Switch 110a has common end 110a3, and branch ends 110a1 and 110a2. Switch 110a can connect common end 110a3 electively or exclusively to branch end 110a1 and branch end 110a2. Common end 110a3 of switch 110a is directly connected to node 12ab of magneto-resistive element 12. Branch end 110a1 is directly connected to regulator 60a. Branch end 110a2 is connected to regulator 60a through resistor 112a. Resistor 112a is connected in series with branch end 110a2 and regulator 60a. By disconnecting common end 110a3 of switch 110a from branch end 110a2 and connecting common end 110a3 to branch end 110a1, switch 110a constitutes current path 112a1 that supplies potential VS to magneto-resistive element 12. By disconnecting common end 110a3 of switch 110a from branch end 110a1 and connecting common end 110a3 to branch end 110a2, switch 110a constitutes current path 112a2 that supplies potential VS to magneto-resistive element 12. Current path 112a2 has a larger resistance than current path 112a1.

Switch 110b has common end 110b3 and branch ends 110b1 and 110b2. Switch 110b can connect common end 110b3 selectively or exclusively to branch end 110b1 and branch end 110b2. Common end 110b3 of switch 110b is directly connected to node 12ef of magneto-resistive element 12. Branch end 110b1 is directly connected to regulator 60a. Branch end 110b2 is connected to regulator 60a through resistor 112b. Resistor 112b is connected in series with branch end 110b2 and regulator 60a. By disconnecting common end 110b3 of switch 110b from branch end 110b2 and connecting common end 110b3 to branch end 110b1, switch 110b constitutes current path 112b1 that supplies potential VC to magneto-resistive element 12. By disconnecting common end 110b3 of switch 110b from branch end 110b1 and connecting common end 110b3 to branch end 110b2, switch 110b constitutes current path 112b2 that supplies potential VS to magneto-resistive element 12. Current path 112b2 has a larger resistance than current path 112b1.

Switches 110a and 110b can switch a state of magneto-resistive element 12 between a state where magneto-resistive element 12 is connected to regulator 60a of detection circuit 10a through resistors 112a and 112b and a state where magneto-resistive element 12 is directly connected to regulator 60a without through resistors 112a and 112b. In the normal operation, i.e., when no abnormalities are detected in the resistances of magneto-resistive element 12, switches 110a and 110b select current path 112a1 and 112b1 in which magneto-resistive element 12 is directly connected to regulator 60a. When the resistances of magneto-resistive element 12 are diagnosed, switches 110a and 110b select current path 112a2 and 112b2 in which magneto-resistive element 12 is connected to regulator 60a through resistors 112a and 112b. Diagnostic circuit 91 is connected to regulator 60a, and measures a voltage across both ends of each of resistors 112a and 112b or currents 112a and 112b flowing through resistors 112a and 112b. If magneto-resistive element 12 has a normal resistance and wirings supplying potential VS and VC are not disconnected, currents 1112a and 1112b flowing through resistors 112a and 112b is within a predetermined normal range. If a fault occurs in magneto-resistive element 12 to cause abnormalities in resistance, or if the wirings supplying potential VS and VC is disconnected, currents 112a and 112b flowing through resistors 112a and 112b deviate from the predetermined normal range. When currents 112a and 112b deviate from the normal range, diagnostic circuit 91 determines that abnormalities occur, and outputs an abnormal signal. With the configuration, abnormalities in resistance of magneto-resistive element 12 and disconnection of wirings for supplying potential VS and VC can be detected. Even when sheet resistance of magneto-resistive element 12 changes, i.e., resistance of four magneto-resistive elements which constitute bridge circuits WB1 and WB2 changes by the same amount at the same time, abnormalities can be detected based on currents 112a and 112b, as mentioned above.

The period of time when current path 112a2 connected to regulator 60a through resistor 112a is elected, i.e., when bridge circuit WB1 is diagnosed is preferably different from a period of time when current path 112b2 connected to regulator 60a through resistor 112b is selected, i.e., when bridge circuit WB2 is diagnosed. This configuration allows the current flowing through bridge circuit WB1 and the current flowing through bridge circuit WB2 to be input to diagnostic circuit 91 subsequently, thereby diagnosing bridge circuits WB1 and WB2 without enlarging the circuit scale of diagnostic circuit 91.

Rotation detecting device 150 (magnetic sensor 100a) includes substrate 12p, magneto-resistive elements 12a to 12d that are provided on substrate 12p to constitute bridge circuit WB1, substrate 10p, detection circuit 10a that is provided on substrate 10p and connected to magneto-resistive elements 12a to 12d, wiring 100a1 connecting between end 12a-1 of magneto-resistive element 12a and detection circuit 10a, wiring 100a3 connecting between end 12c-1 of magneto-resistive element 12c and detection circuit 10a, wiring 100a2 connecting between end 12b-2 of magneto-resistive element 12b and detection circuit 10a, wiring 100a4 connecting between end 12d-2 of magneto-resistive element 12d and detection circuit 10a, node 12ac1 that is provided on substrate 10p and combines a signal on wiring 100a1 with a signal on wiring 100a3, and node 12bd1 that is provided on substrate 10p and combines a signal on wiring 100a2 with a signal on wiring 100a4. Detection circuit 10a includes amplifier 14b that is provided on substrate 10p and amplifies a signal at node 12ac1, and amplifier 14a that is provided on substrate 10p and amplifies a signal at node 12bd1.

Node 12ac1 and node 12bd1 constitute a midpoint (node 12ac1) and a midpoint (node 12bd1) of bridge circuit WB1, respectively.

Wirings 100a1 to 100a4 may be bonding wires.

Detection circuit 10a may further include differential amplifier 16a that amplifies a difference between a signal from amplifier 14b and a signal from amplifier 14a.

Detection circuit 10a may further include diagnostic circuit 90 to which a signal from differential amplifier 16a is input.

Diagnostic circuit 90 may output an abnormal signal when an output from differential amplifier 16a deviates from a predetermined range. Detection circuit 10a may include analog-to-digital (AD) converter 18a to which a signal is input from differential amplifier 16a.

Diagnostic circuit 90 may output an abnormal signal when an output of AD converter 18a deviates from a predetermined range.

End 12a-2 of magneto-resistive element 12a and end 12b-1 of magneto-resistive element 12b are connected to reference potential VS. End 12c-2 of magneto-resistive element 12c and end 12d-1 of magneto-resistive element 12d are connected to ground GND.

Rotation detecting device 150 (magnetic sensor 100a) includes substrate 12p, magneto-resistive elements 12a to 12d that are provided on substrate 12p to constitute bridge circuit WB1, substrate 10p, detection circuit 10a that is provided on substrate 10p and connected to magneto-resistive elements 12a to 12d, wiring 100a1 connecting between end 12a-1 of magneto-resistive element 12a and detection circuit 10a, wiring 100a2 connecting between end 12b-2 of magneto-resistive element 12b and detection circuit 10a, wiring 100a3 connecting between end 12c-1 of magneto-resistive element 12c and detection circuit 10a, wiring 100a4 connecting between end 12d-2 of magneto-resistive element 12d and detection circuit 10a. A midpoint (node 12ac1) and a midpoint (node 12bd1) of bridge circuit WB1 are provided on substrate 10p.

Detection circuit 10a may include amplifier 14b that amplifies a signal at the midpoint (node 12ac1), amplifier 14a that amplifies a signal at the midpoint (node 12bd1), and differential amplifier 16a that amplifies a difference between a signal from amplifier 14b and a signal from amplifier 14a.

Detection circuit 10a may further include diagnostic circuit 90 to which a signal from differential amplifier 16a is input.

Detection circuit 10a may further include analog-to-digital (AD) converter 18a to which a signal is input from differential amplifier 16a, and diagnostic circuit 90 to which an output of AD converter 18a is input.

End 12a-2 of magneto-resistive element 12a and end 12b-1 of magneto-resistive element 12b are connected to reference potential VS. End 12c-2 of magneto-resistive element 12c and end 12d-1 of magneto-resistive element 12d are connected to ground GND.

Magnetic sensor 100a includes magneto-resistive element 12a that outputs signal sin+, magneto-resistive element 12e that outputs signal cos−, and detection circuit 10a to which signal sin+ and signal cos− are input. Detection circuit 10a includes regulator 60a that supplies potential VS and VC to magneto-resistive elements 12a and 12e, respectively, current path 112a1 that electrically connects magneto-resistive element 12a to regulator 60a, current path 112a2 with resistor 112a that electrically connects magneto-resistive element 12a to regulator 60a, current path 112b1 that electrically connects magneto-resistive element 12e to regulator 60a, current path 112b2 with resistor 112b that electrically connects magneto-resistive element 12e to regulator 60a, switch 110a that switches between current path 112a1 and current path 112a2, switch 110b that switches between current path 112b1 and current path 112b2, and diagnostic circuit 91 connected to current path 112a2 and current path 112b2.

Diagnostic circuit 91 is connected to both ends of resistor 112a and both ends of resistor 112b.

Magneto-resistive element 12a are combined with three other magneto-resistive elements 12b to 12c to constitute bridge circuit WB1, and magneto-resistive element 12e are combined with three other magneto-resistive elements 12f to 12h to constitute bridge circuit WB2. Magneto-resistive element 12e and magneto-resistive element 12a are made of the same material, and magneto-resistive element 12a coincides with a configuration in which magneto-resistive element 12e is rotated at 450.

Magnetic sensor 100a includes magneto-resistive element 12a that outputs signal sin+, and detection circuit 10a to which signal sin+ is input. Detection circuit 10a includes regulator 60a that supplies potential VS to magneto-resistive element 12a, current path 112a1 that electrically connects magneto-resistive element 12a to regulator 60a, current path 112a2 with resistor 112a that electrically connects magneto-resistive element 12a to regulator 60a, switch 110a that switches between current path 112a1 and current path 112a2, and diagnostic circuit 91 connected to current path 112a2.

Diagnostic circuit 91 is connected to both ends of resistor 112a.

Rotation detecting device 150 includes magnetic sensor 100a, object magnet 142 that generates a magnetic field detected by magnetic sensor 100a, rotation shaft 144 to which object magnet 142 is attached, bearing 146 for supporting rotation shaft 144, and motor 158 that rotates rotation shaft 144.

Magnetic sensor 100a includes magneto-resistive element 12a that outputs signal sin+, magneto-resistive element 12e that outputs signal cos−, and regulator 60a connected to magneto-resistive elements 12a and 12e. Magnetic sensor 100a can be diagnosed by the following method. Potential VS is supplied to magneto-resistive element 12a from regulator 60a through current path 112a1. Potential VS is supplied to magneto-resistive element 12a from regulator 60a through current path 112a2 having a larger resistance than current path 112a1 so as to cause current 112a to flow through magneto-resistive element 12a. Potential VC is supplied to magneto-resistive element 12e from regulator 60a through current path 112b1. Potential VC is supplied to magneto-resistive element 12e from regulator 60a through current path 112b2 having a larger resistance than current path 112b1 so as to cause current 112b to flow through magneto-resistive element 12e. When current 112a deviates from a predetermined range, it is determined that magneto-resistive element 12a is in an abnormal operation. When current 112b deviates from a predetermined range, it is determined that magneto-resistive element 12e is in an abnormal operation.

A period of time when current 112b flows through magneto-resistive element 12e may be different from a period of time when current 112a flows through magneto-resistive element 12a. A period of time when it is determined that magneto-resistive element 12e is in the abnormal operation may be different from a period of time when it is determined that magneto-resistive element 12a is in the abnormal operation.

Figure 9:
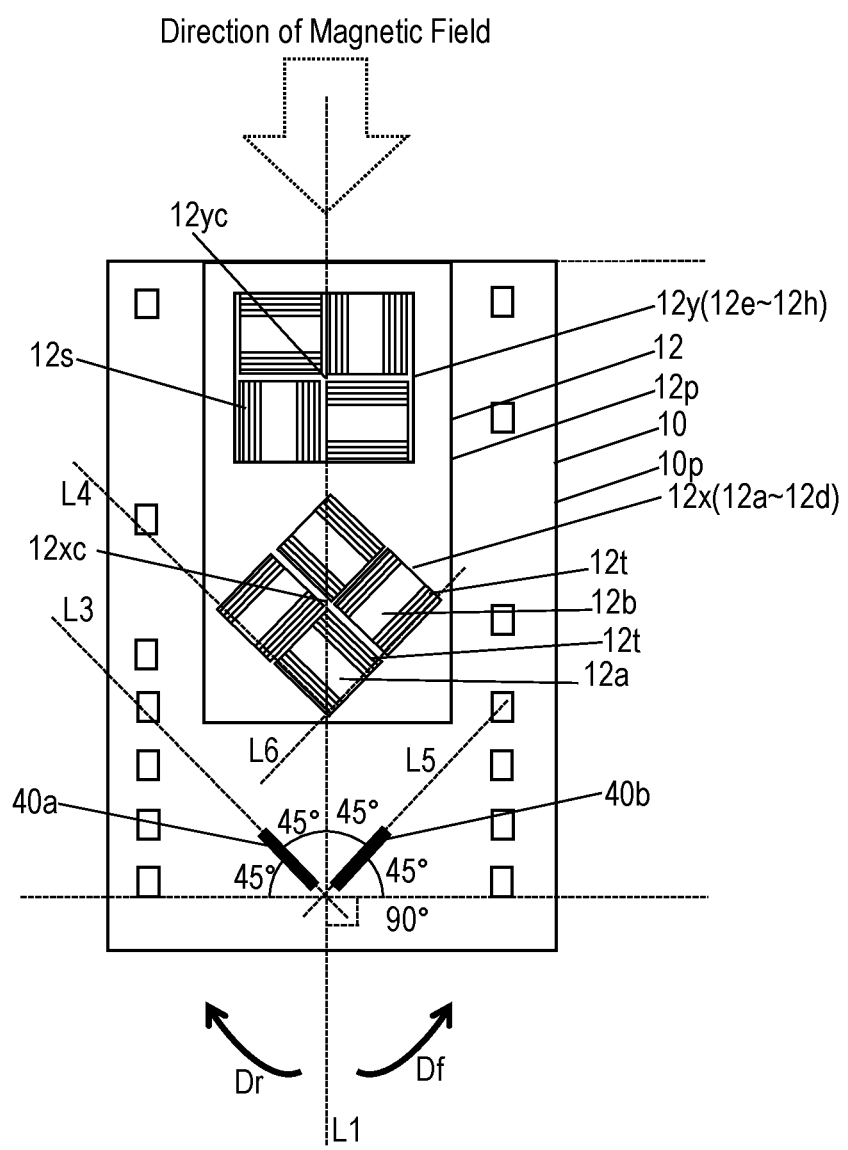
FIG. 9 is a top view of the magneto-resistive element and the detection circuit shown in FIG. 8.
Figure 10:
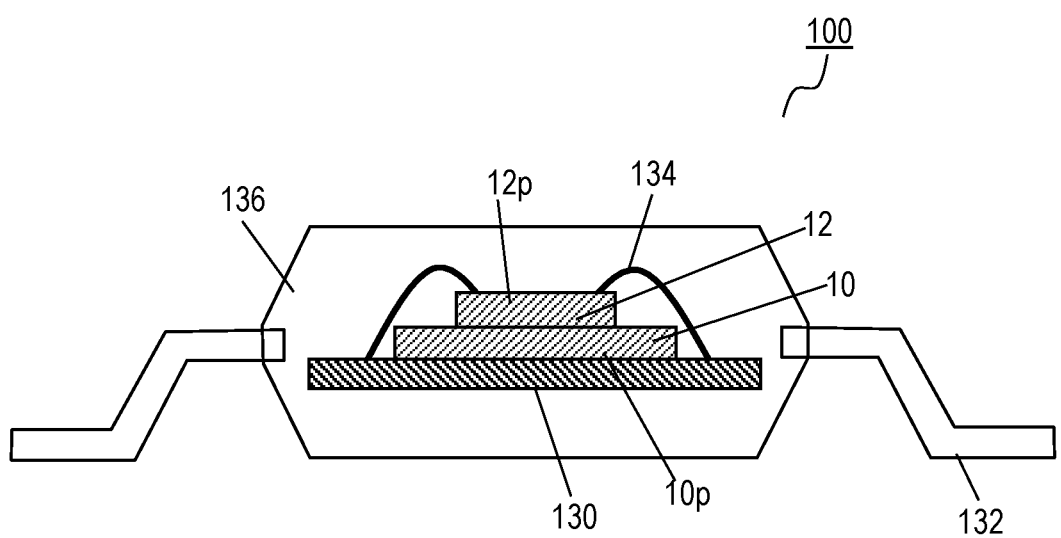
FIG. 10 is a front view of the magnetic sensor shown in FIG. 8.

FIG. 9 is a top view of magnetic sensor 100 (100a). FIG. 10 is a side view of magnetic sensor 100 (100a). In FIG. 9, the structure of magnetic sensor 100 (100a) is partially omitted. In magnetic sensor 100 (100a) shown in FIG. 9, each of Hall elements 40a and 40b is a longitudinal type of Hall element that detects a magnetic field parallel to substrate 10p on which detection circuit 10 is provided.

Magnetic sensor 100 (100a) includes magneto-resistive element 12, detection circuit 10, lead frame 130, wire 134, sealing resin 136, and terminal 132. Magneto-resistive elements 12a to 12d constitute magneto-resistive element group 12x that forms bridge circuit WB1.

Magneto-resistive elements 12e to 12h constitute magneto-resistive element group 12y that forms bridge circuit WB2. Magneto-resistive element 12 and detection circuit 10 are disposed on lead frame 130. Sealing resin 136 seals magneto-resistive element 12, detection circuit 10, and lead frame 130. Terminal 132 extends from sealing resin 136 to connect detection circuit 10 electrically to the outside.

Straight line L1 passes substantially through center 12xc of magneto-resistive element group 12x constituted by magneto-resistive elements 12a to 12d and center 12yc of magneto-resistive element group 12y constituted by magneto-resistive elements 12e to 12h. Hall elements 40a and 40b are arranged symmetrically to each other with respect to straight line L1. In more detail, a direction of a magnetic field detected by Hall elements 40a and 40b inclines by 45° with respect to straight line L1.

Each of magneto-resistive elements 12a to 12d is made of magnetic resistance pattern 12t slenderly extending perpendicularly to a direction of the magnetic field to be detected. Magnetic resistance pattern 12t of magneto-resistive element 12a extends slenderly along straight line L4. Magnetic resistance pattern 12t of magneto-resistive element 12c extends slenderly along straight line L6. Straight lines L4 and L6 extend symmetrically to each other with respect to straight line L1. Straight line L4 inclines by 45° with respect to straight line L1. Straight line L6 inclines by 45° with respect to straight line L1. Straight line L4 inclines by 90° with respect to straight line L6. Each of magneto-resistive elements 12e to 12h is made of magnetic resistance pattern 12s slenderly extending perpendicularly to a direction of the magnetic field to be detected. Magnetic resistance patterns 12t and 12s are made of magneto-resistive material that has a magneto-resistive effect. Hall elements 40a and 40b detect magnetic field along straight lines L3 and L5 passing substantially through the respective centers of Hall elements 40a and 40b. Straight line L3 passing substantially through the center of Hall element 40a is parallel to magnetic resistance pattern 12t of any one of magneto-resistive elements 12a to 12d. Straight line L3 is parallel to magnetic resistance pattern 12t of magneto-resistive element 12a, and therefore, is parallel to straight line L4. Straight line L5 passing substantially through the center of Hall element 40b is parallel to magnetic resistance pattern 12t of any one of magneto-resistive elements 12a to 12d. Straight line L5 is parallel to magnetic resistance pattern 12t of magneto-resistive element 12c, and therefore, is parallel to straight line L6.

Hall element 40b has a configuration identical to that of Hall element 40a rotating by 90°. Magneto-resistive element 12b has a configuration identical to that of magneto-resistive element 12a rotating by 90°. Magneto-resistive element 12d has a configuration identical to that of magneto-resistive element 12c rotating by 90°. Magneto-resistive element 12c has a configuration identical to that of magneto-resistive element 12a rotating by 90°. Magneto-resistive element 12d has a configuration identical to that of magneto-resistive element 12b rotating by 90°. Each of Hall elements 40a and 40b is a longitudinal type of Hall element that detects a magnetic field parallel to substrate 10p on which detection circuit 10 is provided. Accordingly, to easily obtain a magnetic field parallel to substrate 10p, Hall elements 40a and 40b are preferably provided near the center of substrate 10p. Thus, Hall elements 40a and 40b can detect the angle accurately.

In accordance with the embodiment, magnetic sensor 100 (100a) is attached to motor 158 assisting steering wheel 152 and steering shaft 154, but not limited to this. For instance, magnetic sensor 100 (100a) may be used for detecting a position of a shift lever of a vehicle. In other words, magnetic sensor 100 (100a) may be used independently as a stand-alone unit.

Diagnostic circuit 90 may be a part of processing unit 70.

As described above, magnetic sensor 100 includes substrate 12p, magneto-resistive element group 12x that is provided on substrate 12p and constituted by plural magneto-resistive elements 12a to 12d constituting bridge circuit WB1, magneto-resistive element group 12y that is provided on substrate 12p and constituted by plural magneto-resistive elements 12e to 12h constituting bridge circuit WB2, substrate 10p, Hall elements 40a and 40b provided on substrate 10p, and detection circuit 10 that is provided on substrate 10p and receives a signal from magneto-resistive element group 12x, a signal from magneto-resistive element group 12y, a signal from Hall element 40a, and a signal from Hall element 40b. Each of Hall elements 40a and 40b is a longitudinal type Hall element detecting a magnetic field parallel to substrate 10p. Hall element 40a and Hall element 40b are arranged symmetrically to each other with respect to straight line L1. Straight line L1 passes substantially through center 12xc of magneto-resistive element group 12x and center 12yc of magneto-resistive element group 12y.

A direction of the magnetic field detected by Hall element 40a may incline by 45° with respect to straight line L1. A direction of the magnetic field detected by Hall element 40b may incline by 45° with respect to straight line L1.

Magneto-resistive element 12a out of plural magneto-resistive elements 12a to 12d of magneto-resistive element group 12x includes magnetic resistance pattern 12t made of magneto-resistive material. Magneto-resistive element 12b out of plural magneto-resistive elements 12a to 12d of magneto-resistive element group 12x includes magnetic resistance pattern 12t made of magneto-resistive material. Straight line L3 passing substantially through the center of Hall element 40a may be parallel to magnetic resistance pattern 12t of magneto-resistive element 12a. Straight line L4 passing substantially through the center of Hall element 40b may be parallel to magnetic resistance pattern 12t of magneto-resistive element 12b.

Hall elements 40a and 40b are made of the same material. Hall element 40a has a configuration identical to that of Hall element 40b rotating by 90°.

Plural magneto-resistive elements 12a to 12d of magneto-resistive element group 12x are made of the same material. Magneto-resistive element 12a out of plural magneto-resistive elements 12a to 12d of magneto-resistive element group 12x has a configuration identical to that of magneto-resistive element 12b out of magneto-resistive elements 12a to 12d of magneto-resistive element group 12x which rotates by 90°.

As described above, magnetic sensor 100 includes magneto-resistive element group 12x constituted by plural magneto-resistive elements 12a to 12d, magneto-resistive element group 12y constituted by plural magneto-resistive elements 12e to 12h, Hall element 40a, Hall element 40b, detection circuit 10 to which signals from magneto-resistive element groups 12x and 12y and signals from Hall elements 40a and 40b are input. Plural magneto-resistive elements 12a to 12d of magneto-resistive element group 12x include magneto-resistive element 12a including magnetic resistance pattern 12t, and magneto-resistive element 12b including magnetic resistance pattern 12t. Straight line L3 passing substantially through the center of Hall element 40a is parallel to magnetic resistance pattern 12t of magneto-resistive element 12a. Straight line L5 passing substantially through the center of Hall element 40b is parallel to magnetic resistance pattern 12t of magneto-resistive element 12b.

Hall element 40a may be arranged such that Hall element 40a inclines by 45° with respect to straight line L1 passing substantially through center 12xc of magneto-resistive element group 12x and center 12yc of magneto-resistive element group 12y. Hall element 40b may be arranged such that Hall element 40b inclines by 45° with respect to straight line L1.

Hall elements 40a and 40b may be symmetrical to each other with respect to straight line L1 passing substantially through center 12xc of magneto-resistive element group 12x and center 12yc of magneto-resistive element group 12y.

Magneto-resistive element group 12x constitutes bridge circuit WB1, and magneto-resistive element group 12y constitutes bridge circuit WB2.

Figure 11:
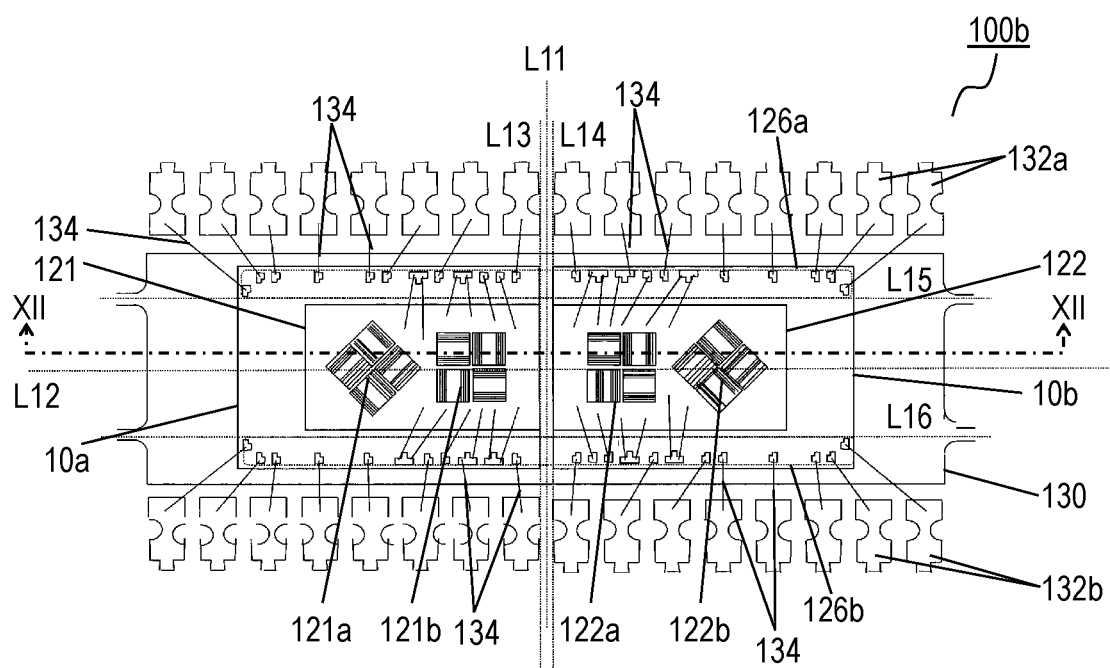
FIG. 11 is a top view of still another magnetic sensor in accordance with the embodiment.
Figure 12:
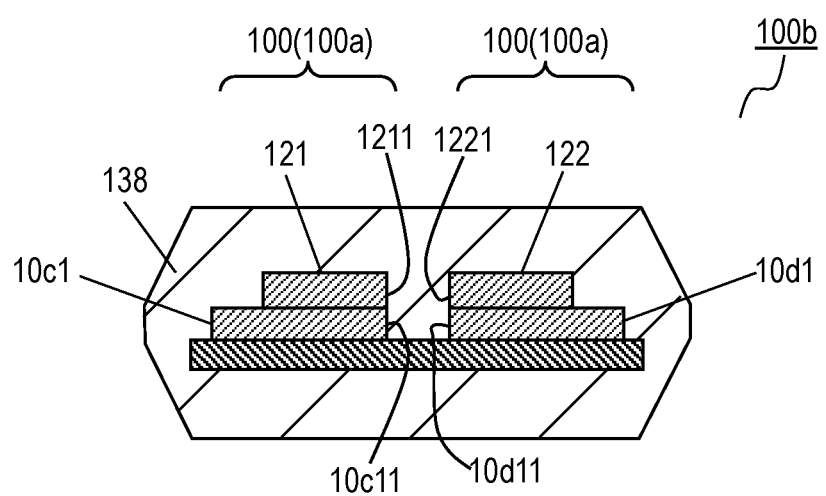
FIG. 12 is a cross-sectional view of the magnetic sensor along line XII-XII shown in FIG. 11.

FIG. 11 is a top view of still another magnetic sensor 100b in accordance with the exemplary embodiment. FIG. 12 is a cross-sectional view of magnetic sensor 100b along line XII-XII shown in FIG. 11. In FIGS. 11 and 12, components identical to those of the magnetic sensor shown in FIGS. 1A to 10 are denoted by the same reference numerals. In FIG. 12, a structure of magnetic sensors 100b is partially omitted. Magnetic sensor 100b includes two magnetic sensors 100 (100a), and includes two magneto-resistive elements 121 and 122 each having the same structure as magneto-resistive element 12 shown in FIGS. 1A and 1B. Each of magneto-resistive elements 121 and 122 has the same substrate as substrate 12p shown in FIG. 8. Magneto-resistive element 121 includes magneto-resistive element group 121a and magneto-resistive element group 121b. Magneto-resistive element group 121a includes magneto-resistive elements 12a to 12d shown in FIGS. 1A and 1B. Magneto-resistive element group 121b includes magneto-resistive elements 12e to 12h shown in FIGS. 1A and 1B. Similarly, magneto-resistive element 122 includes magneto-resistive element group 122a and magneto-resistive element group 122b. Magneto-resistive element group 122a includes magneto-resistive elements 12a to 12d shown in FIGS. 1A and 1B. Magneto-resistive element group 122b includes magneto-resistive elements 12e to 12h shown in FIGS. 1A and 1B. In accordance with the exemplary embodiment, detection circuit 10c is provided on an upper surface of substrate 10c1 while detection circuit 10d is provided on an upper surface of substrate 10d1.

Magnetic sensor 100b includes magneto-resistive elements 121 and 122, detection circuits 10c and 10d, substrates 10c1 and 10d1, die pad 130, wire 134, sealing resin 138, and leads 132a and 132b.

Magneto-resistive elements 121 and 122, and substrates 10c1 and 10d1 are mounted onto die pad 130.

Sealing resin 138 seals magneto-resistive elements 121 and 122, substrates 10c1 and 10d1, and die pad 130.

Leads 132a and 132b extend from sealing resin 138 and electrically connected to the outside.

A signal from magneto-resistive element 121 is input to detection circuit 10c. The structure and operation of detection circuit 10c are the same as the structure and operation of detection circuit 10 (10a).

A signal from magneto-resistive element 122 is input to detection circuit 10d. The structure and operation of detection circuit 10d are the same as the structure and operation of detection circuit 10 (10a).

As shown in FIG. 11, magneto-resistive elements 121 and 122 are symmetrical to each other about straight line L11. Alternatively, straight line L12 passes through the center of magneto-resistive element group 121a, the center of magneto-resistive element group 121b, the center of magneto-resistive element group 122a, and the center of magneto-resistive element group 122b. Magneto-resistive elements 121 and 122 increase redundancy of the sensor, thereby improving the reliability.

Substrate 10c1 has end surface 10c11 that faces substrate 10d1. Magneto-resistive element 121 has end surface 1211 that faces magneto-resistive element 122. End surface 1211 of magneto-resistive element 121 is flush with end surface 10c11 of substrate 10c1. In other words, end surface 1211 of magneto-resistive element 121 and end surface 10c11 of substrate 10c1 are located on straight line L13 when viewed from above.

Substrate 10d1 has end surface 10d11 that faces substrate 10c1. Magneto-resistive element 122 has end surface 1221 that faces magneto-resistive element 121. End surface 1221 of magneto-resistive element 122 is flush with end surface 10d11 of substrate 10d1. In other words, end surface 1221 of magneto-resistive element 122 and end surface 10d11 of substrate 10d1 are located on straight line L14 when viewed from above.

Detection circuit 10c and detection circuit 10d include electrode groups 126a and 126b each including plural electrodes to be electrically connected to a magneto-resistive element or a lead. The electrodes of electrode groups 126a and 126b are arranged in parallel with straight line L12. The electrodes are also arranged in parallel with straight lines L15 and L16 separated away from straight line L12. Electrode groups 126a and 126b and wires connected to the electrode groups are separated away from straight line L12, i.e., the center of the magneto-resistive elements. This configuration prevents interference from electrode groups 126a and 126b and the wires connected thereto, thereby improving accuracy of the magnetic sensor.

Figure 13:
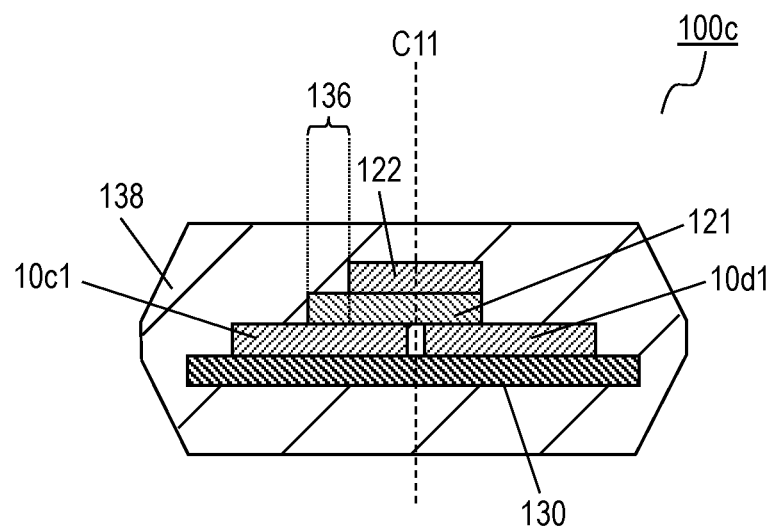
FIG. 13 is a cross-sectional view of a further magnetic sensor in accordance with the embodiment.

FIG. 13 is a cross-sectional view of further magnetic sensor 100c in accordance with the exemplary embodiment. In FIG. 13, components identical to those of magnetic sensor 100b shown in FIGS. 11 and 12 are denoted by the same reference numerals.

Magnetic sensor 100c includes magneto-resistive elements 121 and 122, substrates 10c1 and 10d1, die pad 130, sealing resin 138, wire 134 (FIG. 11), and leads 132a and 132b (FIG. 11).

In magnetic sensor 100c, magneto-resistive element 122 is disposed on an upper surface of magneto-resistive element 121. The center of magneto-resistive element 121 coincides substantially with the center of magneto-resistive element 122 when viewed from above. In other words, straight line C11 passes through the center of magneto-resistive element 121 and the center of magneto-resistive element 122. This configuration allows the center of magneto-resistive element 121 to be close to the center of magneto-resistive element 122. Therefore, the signals obtained from magneto-resistive element 121 and magneto-resistive element 122 can preferably be substantially the same.

In magnetic sensor 100c, substrate 121 includes portion 136 that does not overlap magneto-resistive element 122 when viewed from above. In other words, a width of the substrate constituting magneto-resistive element 121 is larger than a width of the substrate constituting magneto-resistive element 122. Portion 136 is provided to secure an area for wiring. Portion 136 allows the center of magneto-resistive element 121 to substantially coincide with the center of magneto-resistive element 122 when viewed from above. Therefore, the signals obtained from magneto-resistive elements 121 and 122 can preferably be substantially the same.

Figure 14:
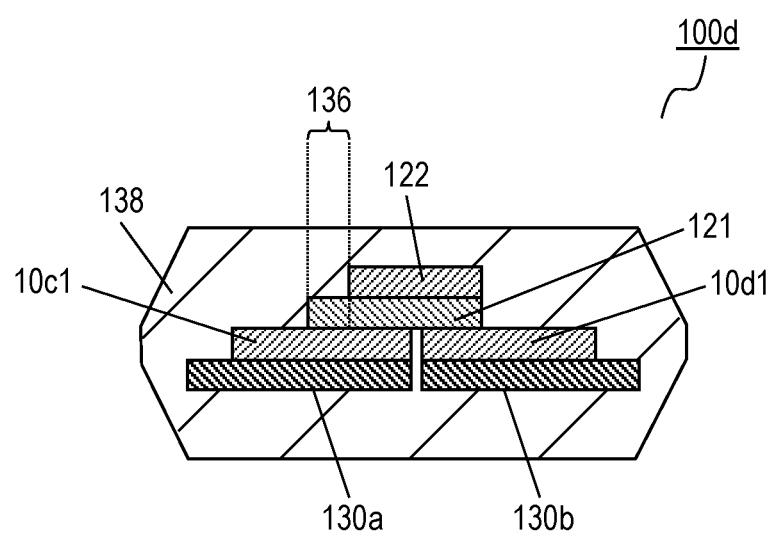
FIG. 14 is a cross-sectional view of a further magnetic sensor in accordance with the embodiment.

FIG. 14 is a cross-sectional view of further magnetic sensor 100d in accordance with the exemplary embodiment. In FIG. 14, components identical to those of magnetic sensor 100c shown in FIG. 13 are denoted by the same reference numerals. Magnetic sensor 100d shown in FIG. 14 includes die pads 130a and 130b, instead of die pad 130 of magnetic sensor 100c shown in FIG. 13. Substrate 10c1 is provided on an upper surface of die pad 103a. Substrate 10d1 is provided on an upper surface of die pad 130b. Magnetic sensor 100b shown in FIG. 12 may further include two die pads 130a and 130b each having a corresponding one of upper surfaces on which substrates 10c1 and 10d1 are provided, instead of die pad 130.

Figure 15:
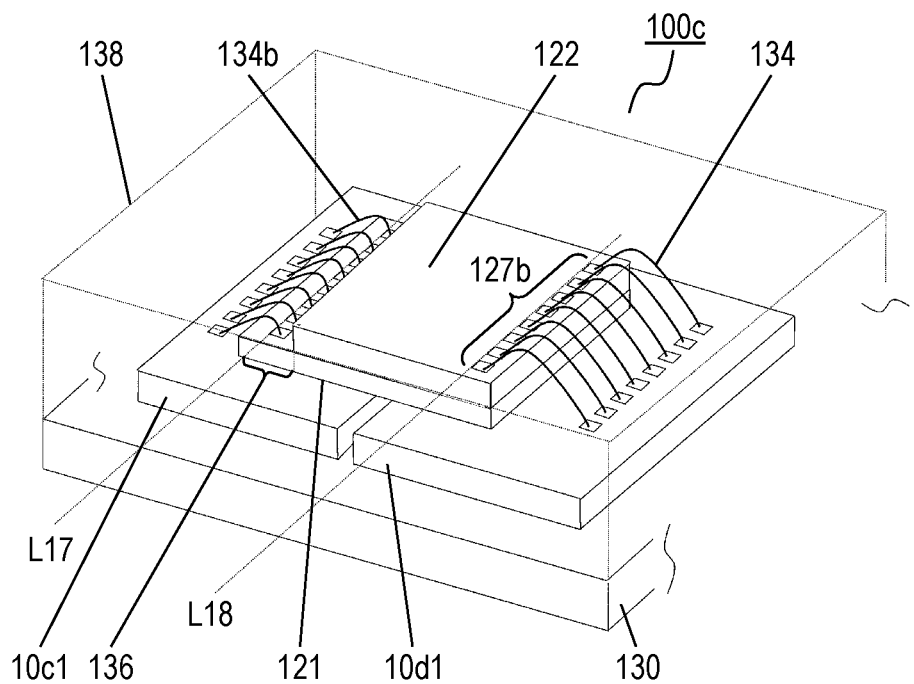
FIG. 15 is a perspective view of the magnetic sensor shown in FIG. 13.
Figure 16:
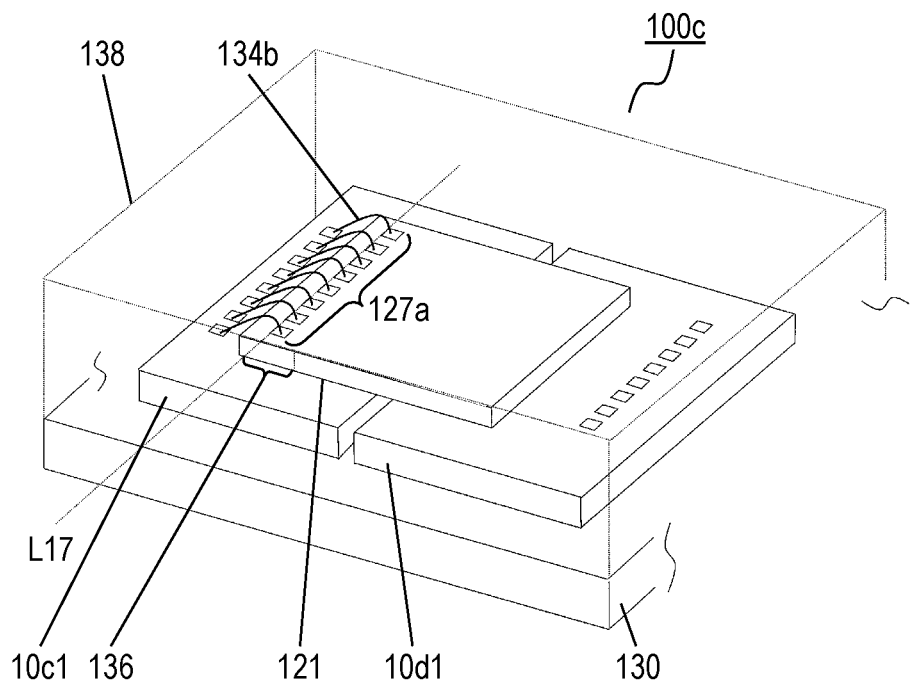
FIG. 16 is a perspective view of the magnetic sensor shown in FIG. 15.

FIGS. 15 and 16 are perspective views of magnetic sensor 100c shown in FIG. 13. In FIG. 15, the structure of magnetic sensor 100c shown in FIG. 13 is partially omitted or simplified. In FIG. 16, the structure of magnetic sensor 100c shown in FIG. 15 is partially omitted.

Magneto-resistive element 121 includes electrode group 127a constituted by plural electrodes. Magneto-resistive element 122 includes electrode group 127b constituted by plural electrodes. Electrode group 127a is provided on portion 136 of magneto-resistive element 121 that is exposed from magneto-resistive element 122. The electrodes of electrode group 127a are arranged along straight line L17.

Electrode group 127b which is constituted by the electrodes is provided on magneto-resistive element 122. The electrodes of electrode group 127b are arranged along straight line L18. Straight line L17 is parallel with straight line L18.

Figure 17A:
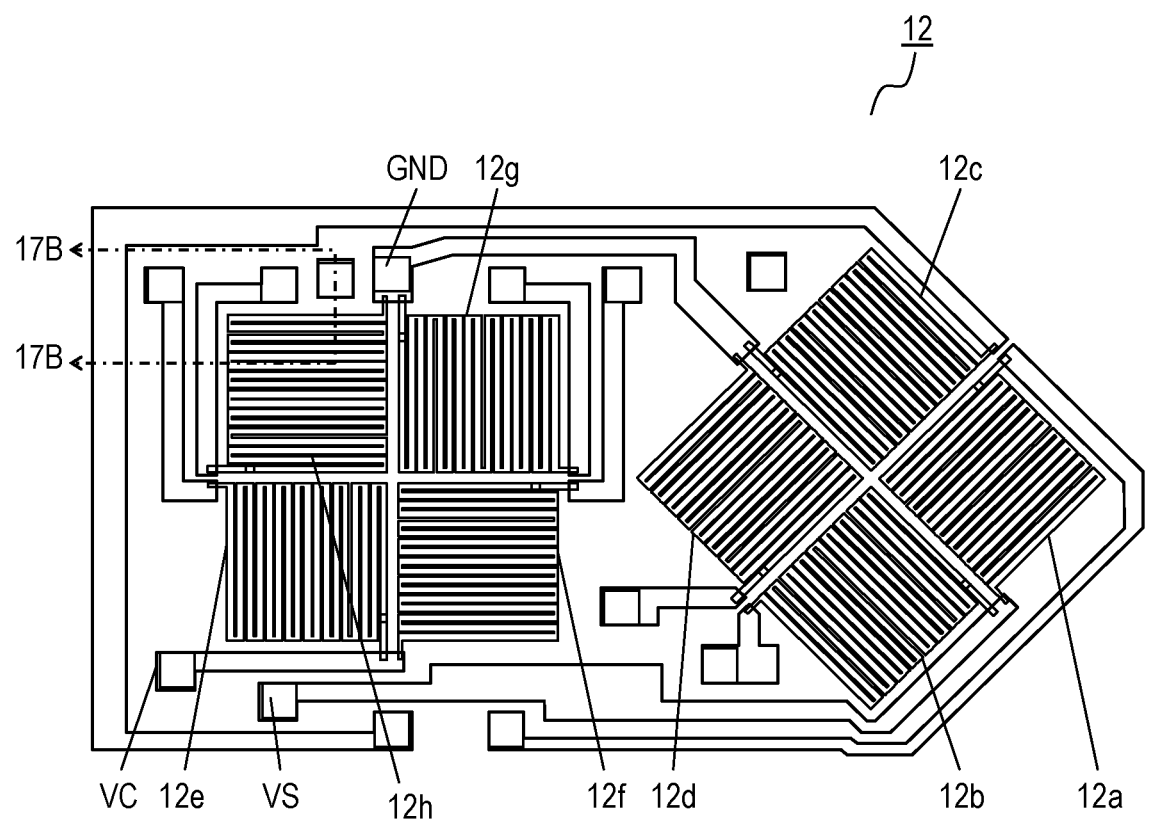
FIG. 17A is a front view of the magneto-resistive element shown in FIG. 8.
Figure 17B:
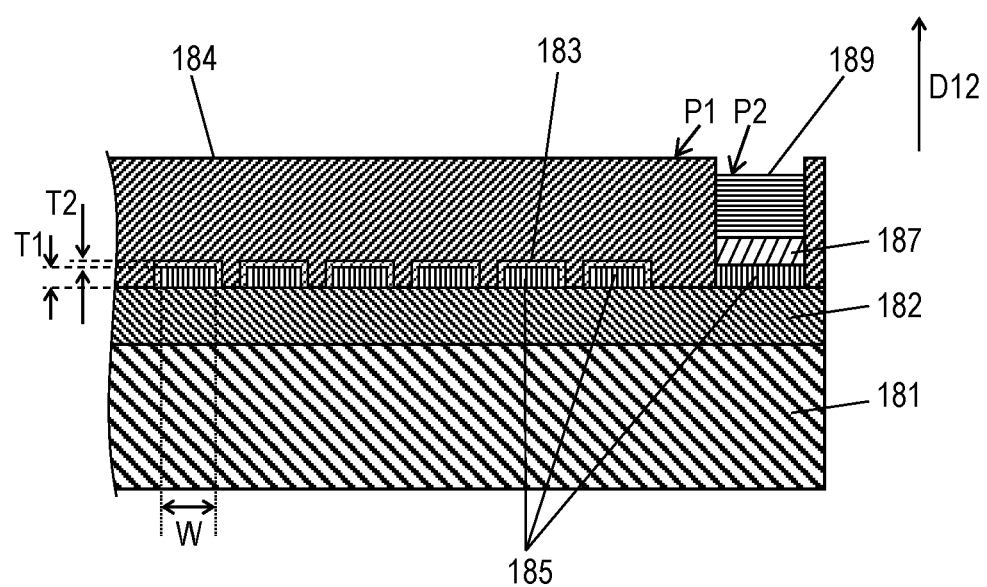
FIG. 17B is a cross-sectional view of the magneto-resistive element along line 17B-17B shown in FIG. 17A.

FIG. 17A is a front view of magneto-resistive element 12 of magnetic sensor 100a shown in FIG. 8. FIG. 17B is a cross-sectional view of magneto-resistive element 12 along line 17B-17B shown in FIG. 17A. The structure of magneto-resistive element 12 shown in FIG. 17B is applicable not only to magnetic sensor 100a shown in FIG. 8 but also to the magnetic sensor shown in FIGS. 1A and 1B.

FIG. 17B shows a cross-section of magneto-resistive element 12h. Magneto-resistive element 12h includes silicon substrate 181, insulating layer 182 stacked on silicon substrate 181 in laminating direction D12, magneto-resistive (MR) layer 185 stacked on insulating layer 182 in laminating direction D12, adhesion layer 187 stacked on MR layer 185 in laminating direction D12, wiring layer 189 stacked on adhesion layer 187 in laminating direction D12, protection layer 183 stacked on MR layer 185 in laminating direction D12, and protection layer 184 stacked on protection layer 183 in laminating direction D12. Insulating layer 182 is made of silicon oxide, such as silicon dioxide. Adhesion layer 187 is made of titanium. FIG. 17B shows a cross-section of magneto-resistive element 12h along laminating direction D12.

Wiring layer 189 is a wiring line for electrical connection between MR layer 185 and detection circuit 10, and is made of, e.g. gold (Au). Wiring layer 189 includes a portion exposed from protection layer 184, and is electrically connected to the outside. Adhesion layer 187 bonds wiring layer 189 to MR layer 185.

Protection layer 183 protects MR layer 185. An upper surface and a side surface of MR layer 185 are covered with protection layer 183. In accordance with the exemplary embodiment, film thickness T2 of protection layer 183 between MR layer 185 and protection layer 184 is equal to or larger than 1.5 nm. Film thickness T1 of MR layer 185 is equal to or smaller than 15 nm. Ratio T1/T2 of film thickness T1 of MR layer 185 to film thickness T2 of protection layer 183 is larger than 1/10. Protection layer 183 allows protection layer 184 to be tightly bonded to MR layer 185, thereby improving reliability to humidity. In the case that protection layer 184 has a high Young's modulus, protection layer 183 prevents MR layer 185 from receiving an influence due to a stress of protection layer 184.

Protection layer 184 is provided on protection layer 183, and is made of, e.g. silicon dioxide ($SiO_2$) or fluoride-based resin. Providing protection layer 184 prevents oxidation, which is caused by humidity of MR layer 185 or oxygen in the air at high temperature, and protects MR layer 185 from a mechanical crack, corrosion that is caused by direct contact with all other chemical substances.

A nickel iron alloy is sputtered on insulating layer 182 to form (deposit) MR layer 185. More specifically, while vacuum is increased, a nickel iron alloy is sputtered at low gas pressure with high kinetic energy applied to material atoms of the nickel iron alloy, thereby providing thin and homogeneous MR layer 185.

Width W of MR layer 185 in a direction perpendicular to laminating direction D12 is equal to or larger than 15 μm. Film thickness T1 of MR layer 185 in laminating direction D12 is equal to or smaller than 15 nm. In other words, in the cross-section of magneto-resistive element 12 shown in FIG. 17B, an aspect ratio (T1/W) of film thickness T1 of MR layer 185 to width W of MR layer 185 is equal to or smaller than 1/1000. This configuration reduces magnetic anisotropy field Ha of MR layer 185. Here, magnetic anisotropy field Ha is expressed by the following equation with constant physical property value 4πMs.

$$Ha = 4\pi Ms + (T/W)$$

Magnetic anisotropy field Ha of MR layer 185 is smaller than 12 (Oe). Film thickness T1 of MR layer 185 is equal to or smaller than 15 nm and width W of MR layer 185 is equal to or larger than 15 μm provides the relationship of the above equation. Thus, even if a rotating signal magnetic field with a magnetic field strength equal to or larger than 12 (Oe) is applied, the signal output from magneto-resistive element 12h is obtained as an almost ideal sine wave. Further, even if the magnetic field strength is increased to infinite, waveform and voltage of the signal output from magneto-resistive element 12h are not almost changed. Accordingly, if the magnetic field strength of a magnet is sufficiently high and a decrease of the signal magnetic field which is caused by a temperature change is equal to or larger than 12 (Oe), temperature characteristics of the output voltage, which depends on the magnet, can be virtually ignored, so that the circuit configuration is simplified.

Figure 18A:
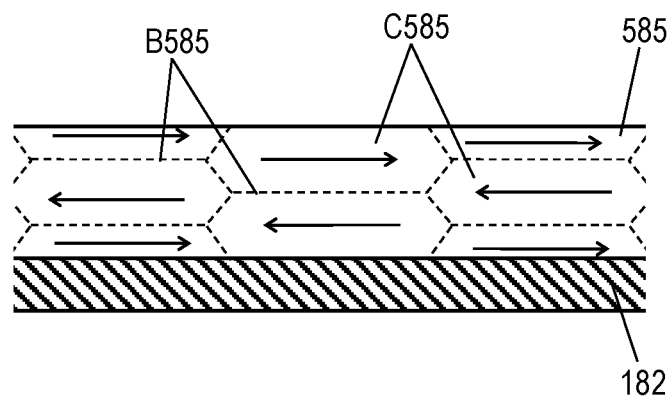
FIG. 18A is a cross-sectional view of a magneto-resistive layer of a comparative example of a magneto-resistive element.
Figure 18B:
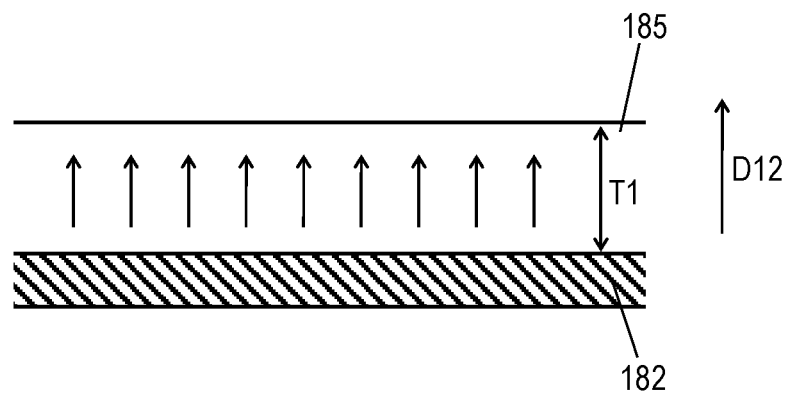
FIG. 18B is a cross-sectional view of a magneto-resistive layer of the magneto-resistive element in accordance with the embodiment.

FIG. 18A is a cross-sectional view of MR layer 585 of a comparative example of a magneto-resistive element. FIG. 18B is a cross-sectional view of MR layer 185 of magneto-resistive element 12 according to the embodiment.

After the magneto-resistive element is patterned to extend slenderly in a longitudinal direction as shown in FIG. 17A, MR layer 585 of the comparative example shown in FIG. 18A has a cross-section in which magnetic domain walls, each of which is a boundary between one magnetic domain and another magnetic domain, are aligned in a longitudinal direction of MR layer 585. This structure is obtained as follows. A substrate is heated to a temperature equal to or higher than 200° C., and MR layer 585 is deposited by, e.g. ion beam deposition to have a film thickness equal to larger than 25 nm, thereby providing crystal grain C585 with a predetermined particle diameter. Grain boundaries B585, each of which is a boundary between crystal grains C585, exist in a cross-section of MR layer 585. This method hardly reduces the film thickness because the film thickness of MR layer 585 equal to or smaller than 25 nm provides crystal grain C585 with an island-shape structure. In consideration of consumption current, if the resistance is increased, it will be necessary to reduce a width of MR layer 585. As shown in the above equation, however, if the width of MR layer 585 is reduced, magnetic anisotropy field Ha increases. Thus, the sine waveform, which is obtained at the time of detecting a magnetic field angle, is distorted remarkably. This deteriorates the detection accuracy.

On the other hand, after magneto-resistive element 12 is patterned to extend slenderly in the longitudinal direction as shown in FIG. 17A, MR layer 185 in accordance with the exemplary embodiment shown in FIG. 18B has a cross-section in which crystal grains of a metallic material (nickel iron alloy according to the exemplary embodiment), which constitutes MR layer 185, do not exist, i.e., grain boundaries, each of which is a boundary between the crystal grains, do not exist. MR layer 185 has magnetization anisotropy in a direction of film thickness T1 (in another expression, laminating direction D12). This configuration prevents MR layer 185 from being magnetized in a direction parallel to a surface of insulating layer 182 because crystal grains are not fully formed for film thickness T1 equal to or smaller than 15 nm, and crystal grains are not formed when sputtered at a substrate temperature equal to or lower than 25° C. In other words, when a magnetic field in a direction substantially parallel to silicon substrate 181 is applied, the direction of magnetization of MR layer 185 is easily reversed, and MR layer 185 is mostly saturated magnetically with a low magnetic field. That is, MR layer 185 is magnetized in a direction parallel to a main surface of silicon substrate 181. This configuration reduces a superimposed amount of magnetic field strength that is changed when an angle of the magnetic field with respect to a direction substantially parallel to silicon substrate 181 is detected. This configuration provides an angle detection signal substantially consistent with the theory. The term "crystal grains do not exist" means that crystal grains do not exist in a cross-section along a direction perpendicular to the longitudinal direction of MR layer 185 shown in FIG. 17B. Further, the term "crystal grains do not exist" does not necessarily mean that no crystal grains exist in all of cross-sections of MR layer 185, which appear in the above cross-section, but also means that crystal grains do not exist in at least one cross-section in laminating direction D12 of MR layer 185. The one cross-section of MR layer 185 is a cross-section of MR layer 185 that appears in an area surrounded by a dashed line in FIG. 17B.

In the case where magnetic sensor 100 in accordance with the exemplary embodiment is used for a rotation detection device, object magnet 142 preferably has a magnetic field (signal magnetic field) equal to or larger than 20 mT. This is because, in the case that magnetic sensor 100 in the exemplary embodiment used for an in-vehicle magnetic sensor, since a large-sized power generator, a motor, or the like is often mounted near the magnetic sensor in a vehicle, magnetic sensor 100 is likely to be affected by magnetic field variations caused by coils built in these components. Accordingly, the signal magnetic field strength to be detected is set as high as possible, thereby reducing these influences.

Magnetic sensor 100 is attached to motor 158 assisting steering wheel 152 and steering torque 154, which are shown in FIG. 2B, but not limited to this. Magnetic sensor 100 in accordance with the exemplary embodiment may be used, for example, for detecting a lever position of a shift lever in a vehicle. In other words, magnetic sensor 100 can be used solely and independently.

Diagnostic circuit 90 shown in FIG. 8 may be a part of processing circuit 70.

Figure 19:
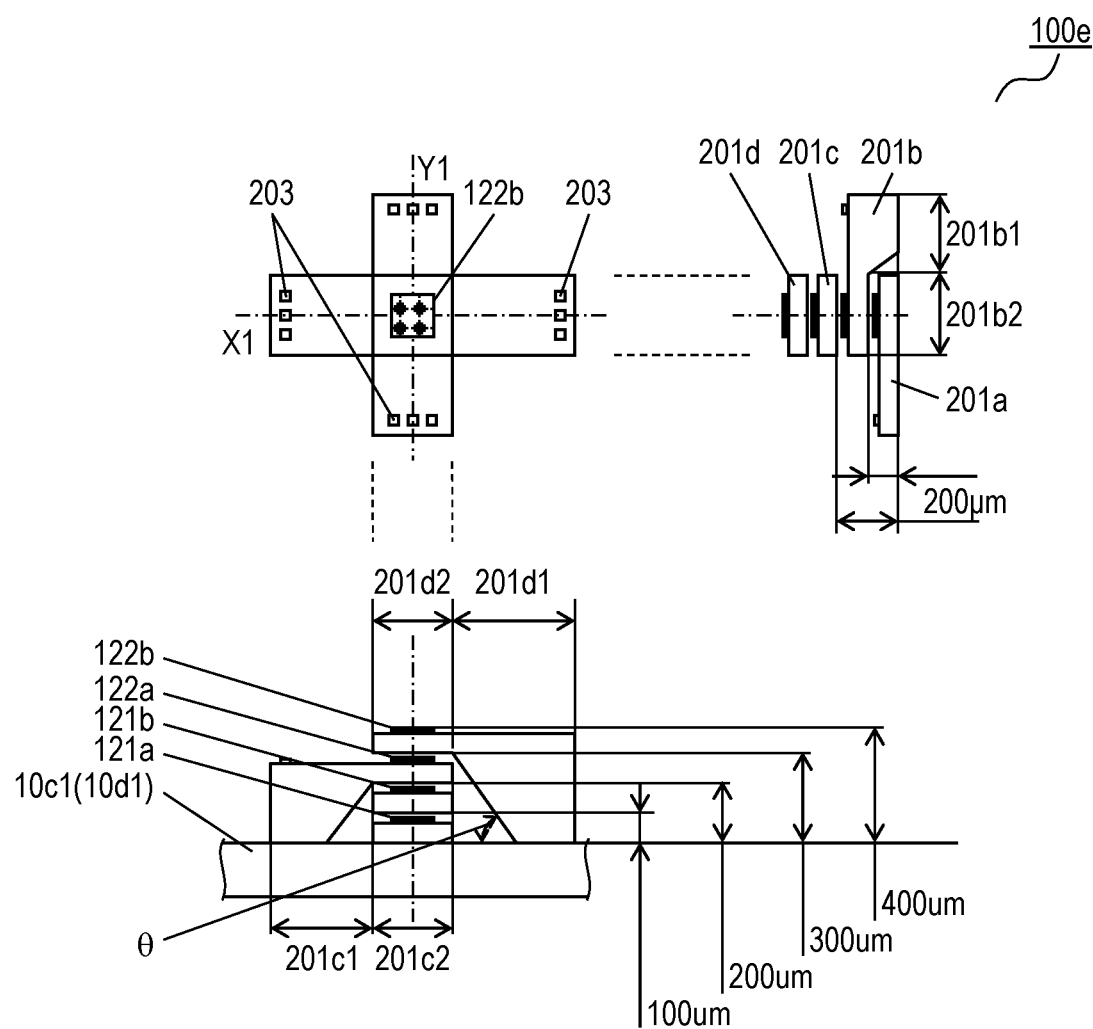
FIG. 19 illustrates a further magnetic sensor in accordance with the embodiment.

FIG. 19 shows another magnetic sensor 100e in accordance with the exemplary embodiment. In FIG. 19, structure of magnetic sensor 100e is partially omitted or simplified. In FIG. 19, components identical to those of magnetic sensor 100b shown in FIGS. 11 and 12 are denoted by n the same reference numerals.

Magnetic sensor 100e includes magneto-resistive element groups 121a and 122b, substrates 10c1 and 10d1, die pad 130, wire 134, sealing resin 138, lead 132, and substrates 201a, 201b, 201c, and 201d. As described above, each of magneto-resistive element groups 121a and 122a is constituted by magneto-resistive elements 12a to 12d while each of magneto-resistive element groups 121b and 122b is constituted by magneto-resistive elements 12e to 12h.

Magneto-resistive element group 121a is provided on substrate 201a.

Magneto-resistive element group 121b is provided on substrate 201b. Substrate 201b includes portions 201b1 and 201b2. Portion 201b1 is thicker than substrate 201a. Portion 201b2 extends from portion 201b and overlaps substrate 201a. Magneto-resistive element group 121b is provided on portion 201b2.

Magneto-resistive element group 122a is provided on substrate 201c. Substrate 201c includes portions 201c1 and 201c2. Portion 201c1 is thicker than substrate 201b. Portion 201c2 extends from portion 201c1 and overlap substrate 201b. Magneto-resistive element group 122a is provided on portion 201c2.

Magneto-resistive element group 122b is provided on substrate 201d. Substrate 201d includes portions 201d1 and 201d2. Portion 201d1 is thicker than substrate 201d. Portion 201d2 extends from portion 201d1 and overlap substrate 201d. Magneto-resistive element group 122b is provided on portion 201d2.

Substrates 201a and 201b are arranged along axis Y1. Substrates 201c and 201d are arranged along axis X1. Axes X1 and Y1 intersect perpendicularly with each other. Accordingly, at least one portion of each substrate is exposed when viewed from above. Therefore, electrode 203 for electrically connecting the substrates with detection circuit 10c (10d) can be provided on a corresponding one of the substrates. In other words, since at least one portion of each substrate is exposed when viewed from above, electrode 203 for electrically connecting of the substrates to detection circuit 10c (10d) can be provided on an upper surface of a corresponding one of the substrates.

Each of substrates 201b, 201c, and 201d is mounted on an upper surface of respective one of mounting boards. In accordance with the exemplary embodiment, the mounting boards are substrates 10c1 and 10d1 on which detection circuits 10c and 10d are provided. Each of portion 201b1 of substrate 201b, portion 201c1 of substrate 201c, and portion 201d1 of substrate 201d has a portion inclined at predetermined angle θ with respect to the upper surface of the mounting board. Angle θ ranges from 45 degrees to 55 degrees.

Substrate 201a, portion 201b2 of substrate 201b, portion 201c2 of substrate 201c, and portion 201d2 of substrate 201d have substantially the same thickness. Portion 201b2 of substrate 201b, portion 201c2 of substrate 201c, and portion 201d2 of substrate 201d can be formed by silicon anisotropic etching, i.e., a silicon substrate is partially removed using alkaline wet anisotropic etching liquid (for example, potassium hydrate solution (KOH), tetramethyl ammonium hydroxide solution (TMAH)).

The center of magneto-resistive element group 121a substantially coincides with the center of magneto-resistive element group 122b when viewed from above. In other words, at least one portion of magneto-resistive element group 121a overlaps at least one portion of magneto-resistive element group 122b when viewed from above. Since the center of magneto-resistive element group 121a substantially coincides with the center of magneto-resistive element group 121b when viewed from above, a phase shift between the signal sin and the signal cos can be reduced. Herein, the signal sin is output from magneto-resistive element group 121a, and the signal cos is output from magneto-resistive element group 121b. Consequently, an angle error of magnetic sensor 100d is reduced. This configuration reduces a phase shift between an angle signal output from magneto-resistive element groups 121a and 121b and an angle signal output from magneto-resistive element groups 122a and 122b. Therefore, the redundancy of magnetic sensor 100d is improved.

Magnetic sensor 100 (100a to 100e) in accordance with the exemplary embodiment can detect an angle, but not limited to this. Magnetic sensor 100 (100a to 100e) may detect, for example, a displacement of an object moving along a straight line. This point will be detailed below.

Figure 20A:
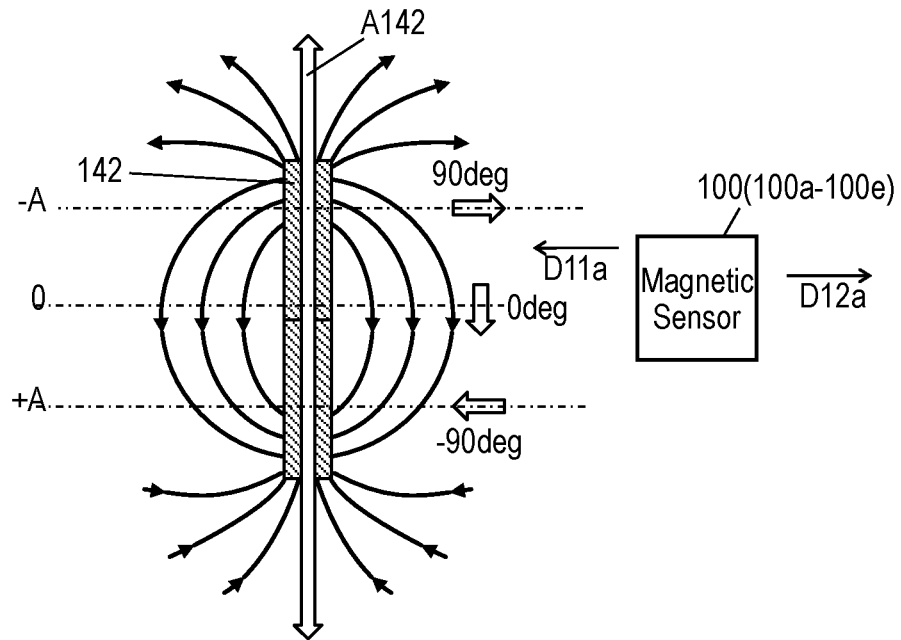
FIG. 20A illustrates the magnetic sensor in accordance with the embodiment for illustrating an operation of the magnetic sensor when a magnet is located on the left-hand side of the magnetic sensor in accordance with the embodiment.

FIG. 20A shows an operation of magnetic sensor 100 when magnet 142 is located on the left-hand side of magnetic sensor 100. Herein, the displacement of magnet 142 is to be detected. Any one of magnetic sensors 100a to 100e may be used as magnetic sensor 100.

Figure 20B:
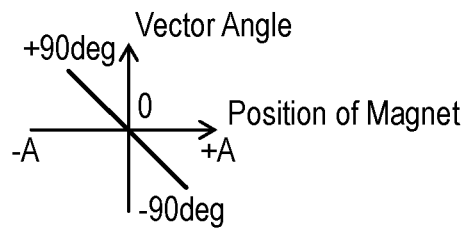
FIG. 20B is a view describing the operation when the magnet is located on the left-hand side of the magnetic sensor in the exemplary embodiment.
Figure 20C:
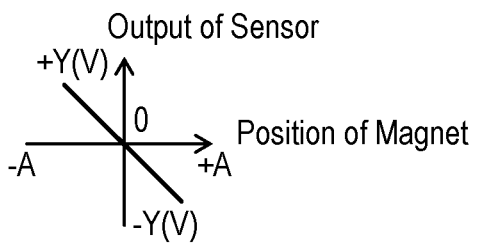
FIG. 20C is a view describing the operation when the magnet is located on the left-hand side of the magnetic sensor in the exemplary embodiment.

An operation of magnetic sensor 100 shown in FIG. 20A will be described. When magnet 142 moves in a direction of displacement axis A142 by an amount of displacement +A, a magnetic vector angle of −90 degrees is input to magnetic sensor 100, whereas when magnet 142 moves in the direction of displacement axis A142 by an amount of displacement −A, a magnetic vector angle of +90 degrees is input to magnetic sensor 100. FIG. 20B shows a relationship between a magnetic vector angle which is input to magnetic sensor 100 due to the movement in the direction of displacement axis A142, and the amount of displacement of magnet 142. In FIG. 20B, the horizontal axis represents an amount of displacement, and the vertical axis represents the vector angle. Magnetic sensor 100 performs ARCTAN calculation of output of AD converters 18a and 18b (see FIG. 1A), which is generated by the movement of magnet 142, to output signals according to an amount of displacement of magnet 142. FIG. 20C shows an output of magnetic sensor 100 and an amount of displacement of magnet 142. In FIG. 20C, the horizontal axis represents an amount of displacement, and the vertical axis represents an output of magnetic sensor 100. As shown in FIG. 20C, the output of magnetic sensor 100 changes substantially linearly with respect to the amount of displacement.

Figure 21A:
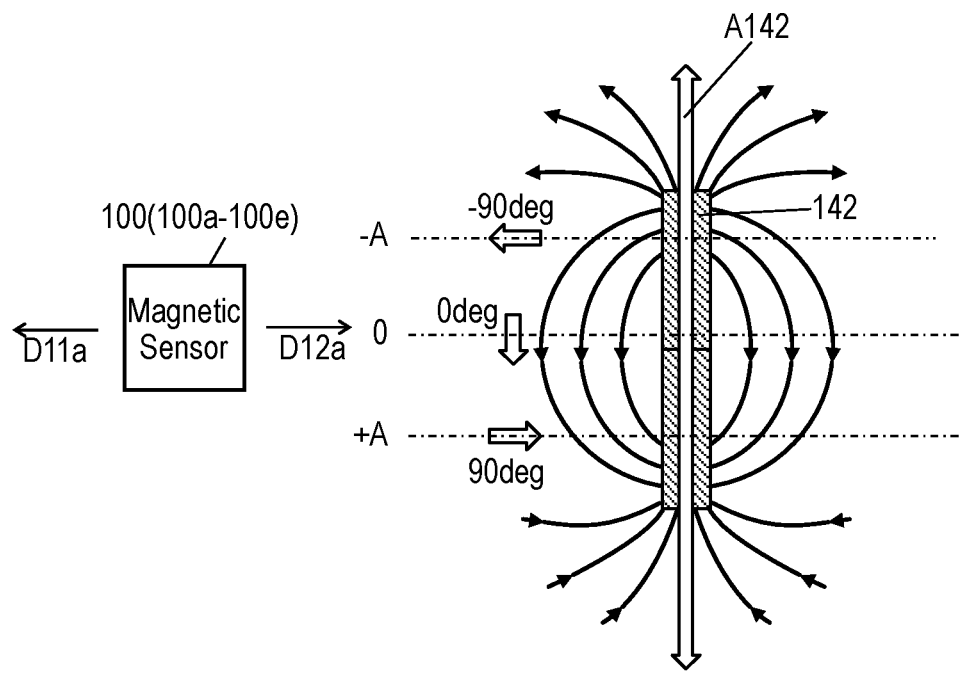
FIG. 21A is a view describing an operation when a magnet is located on the right-hand side of the magnetic sensor in the exemplary embodiment.

FIG. 21A shows an operation of magnetic sensor 100 when magnet 142 is located on the right-hand side of magnetic sensor 100. Herein, the linear displacement of magnet 142 is to be detected.

Figure 21B:
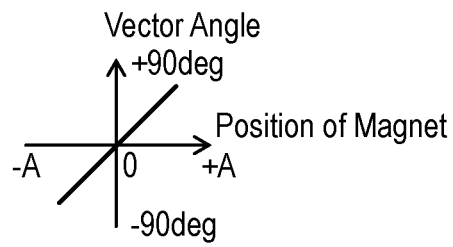
FIG. 21B is a view describing the operation when the magnet is located on the right-hand side of the magnetic sensor in the exemplary embodiment.
Figure 21C:
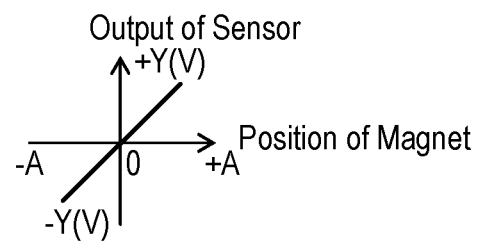
FIG. 21C is a view describing the operation when the magnet is located on the right-hand side of the magnetic sensor in the exemplary embodiment.

An operation shown in FIG. 21A will be described. When magnet 142 moves in the direction of displacement axis A142 by an amount of displacement +A, a magnetic vector angle of +90 degrees is input to magnetic sensor 100, whereas when magnet 142 moves in the direction of displacement axis A142 by an amount of displacement −A, a magnetic vector angle of −90 degrees is input to magnetic sensor 100. FIG. 21B shows a relationship between a magnetic vector angle input to magnetic sensor 100 due to the movement in the direction of displacement axis A142, and the amount of displacement of magnet 142. In FIG. 21B, the horizontal axis represents an amount of displacement, and the vertical axis represents the vector angle. Magnetic sensor 100 performs ARCTAN calculation of output of AD converters 18a and 18b (see FIG. 1A), which is generated by the movement of magnet 142, to output signals according to an amount of displacement of magnet 142. FIG. 21C shows an output of magnetic sensor 100 with respect to an amount of displacement of magnet 142. In FIG. 21C, the horizontal axis represents an amount of displacement, and the vertical axis represents the output of magnetic sensor 100. As shown in FIG. 21C, the output of magnetic sensor 100 changes substantially linearly with respect to the amount of displacement. In this way, for the arrangement shown in FIG. 20A and the arrangement shown in FIG. 21A, the outputs of magnetic sensor 100 are changed reversely to each other.

Figure 22:
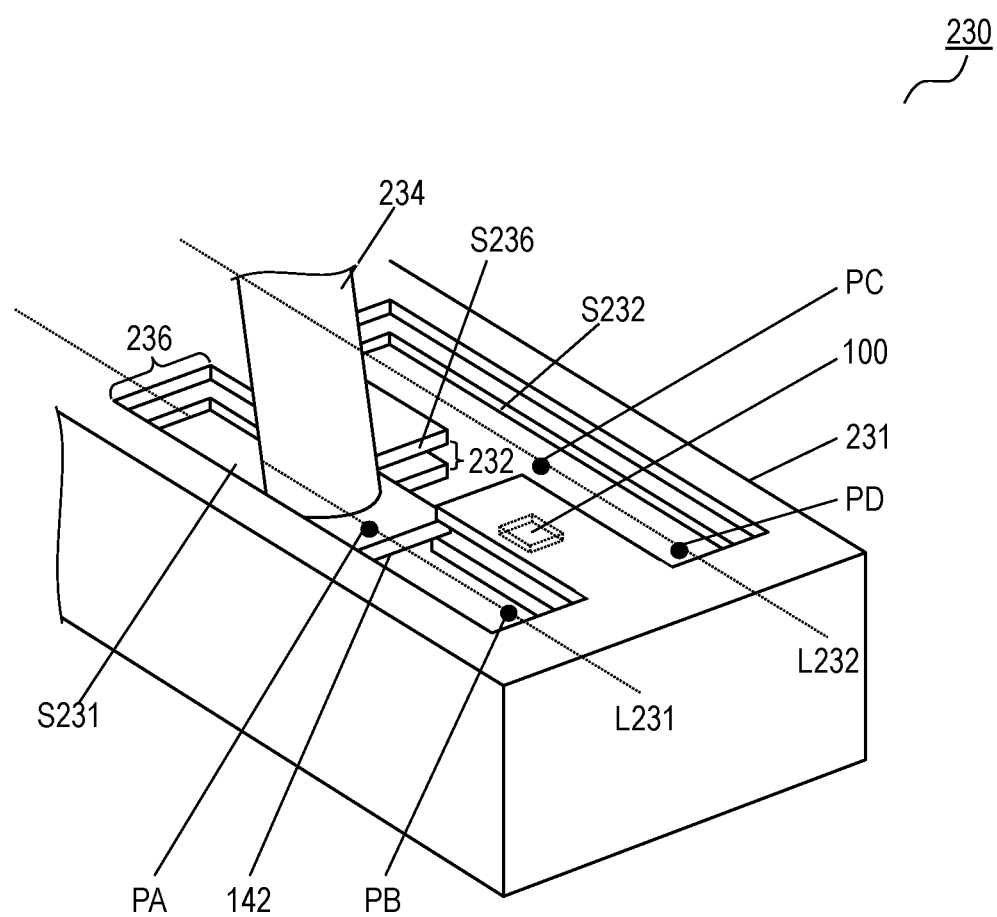
FIG. 22 is a perspective view of another detection device in the exemplary embodiment.

FIG. 22 is a schematic view of detection device 230 including magnetic sensor 100 in accordance with the exemplary embodiment. Detection device 230 includes case 231, guide 232, object magnet 142, shaft 234, and magnetic sensor 100. Shaft 234 may be a shift lever. Any one of magnetic sensors 100a to 100e may be employed as magnetic sensor 100.

Slit 236 is provided in case 231.

Slit 236 includes portions S231, S232, and S236. Each of portions S231 and S232 extends slenderly along a corresponding one of straight lines L231 and L232 in parallel with each other. Portion S236 connects portion S231 to portion S232. In FIG. 22, slit 236 has an H-shape. Guide 232 is provided in an inner wall of slit 236. In accordance with the exemplary embodiment, guide 232 is a recess provided in an inner wall of slit 236.

Object magnet 142 is disposed slidably in slit 236 along guide 232. In other words, object magnet 142 is slidable along straight line L232 and straight line L231. Further, straight line L232 and straight line L231 are tracks along which object magnet 142 moves.

Object magnet 142 may be partially fitted into guide 232. In the case where object magnet 142 is covered with resin, the resin may be partially fitted into guide 232. In the case where shaft 234 is a part of a lever mechanism, a linkage mechanism connected to the lever mechanism may move the object magnet.

Shaft 234 is connected to object magnet 142. When a user operates shaft 234, object magnet 142 moves along guide 232.

Magnetic sensor 100 which is attached to case 231 is disposed between straight lines L231 and L232, and detects a linear displacement of object magnet 142 in response to the operations shown in FIGS. 20A to 20C and FIGS. 21A to 21C.

Figure 23A:
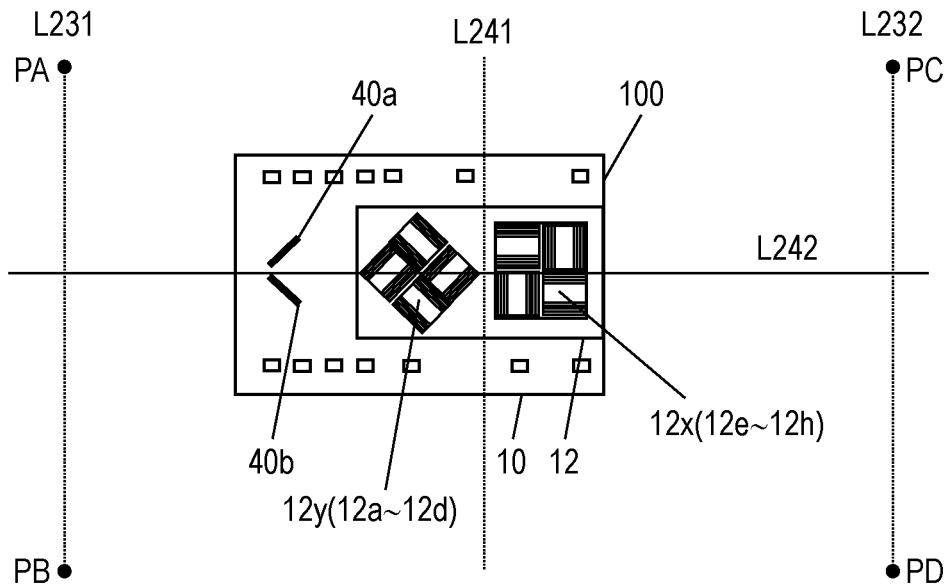
FIG. 23A is a top view of the detection device shown in FIG. 22.

FIG. 23A is a partial top view of detection device 230 shown in FIG. 22. FIG. 23A does not illustrate unnecessary structure for description. FIG. 23A shows straight line L241 located between straight lines L231 and L232.

Straight line L241 parallel to straight line L231 is located at an equal distance from straight lines L231 and L232.

In detection device 230, straight line L241 is located between magneto-resistive element groups 12x and 12y. In other words, magneto-resistive element 12 is provided such that straight line L241 passes through the center of magneto-resistive element 12. On the other hand, Hall elements 40a and 40b are provided such that straight line L241 does not pass through Hall elements 40a and 40b. In other words, Hall elements 40a and 40b are located away from straight line L241 by a predetermined distance.

With the configuration, in magneto-resistive element 12, even if object magnet 142 is located on either straight line L231 or straight line L232, the distance from the center of magneto-resistive element group 12x to straight line L231 is identical to the distance from the center of magneto-resistive element group 12x to straight line, and the distances from the center of magneto-resistive element group 12y to straight line L231 is identical to the distance from the center of magneto-resistive element group 12y to straight line L232. Accordingly, the signals output from the magneto-resistive element groups have almost constant intensity. For instance, a signal output from magneto-resistive element 12 in response to object magnet 142 shown in FIG. 23A located at position PA has the same intensity as a signal output from magneto-resistive element 12 in response to object magnet 142 shown in FIG. 23A located at position PC. In other words, even if object magnet 142 is located away from magnetic sensor 100 in either direction, i.e., on the right-hand side or the left-hand side of magnetic sensor 100, magnetic sensor 100 can detect the position of object magnet 142 accurately.

Figure 23B:
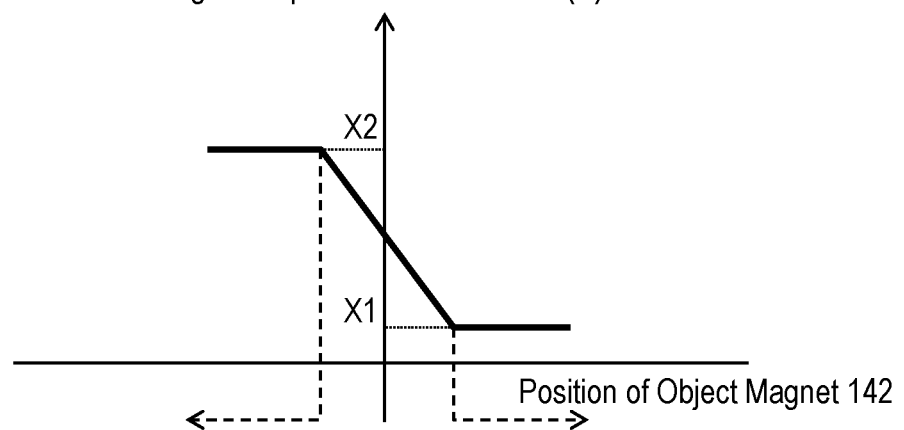
FIG. 23B is a view showing an output of the detection device shown in FIG. 22.

FIG. 23B shows outputs of Hall elements 40a and 40b. In FIG. 23B, the vertical axis represents the outputs of Hall elements 40a and 40b, and the horizontal axis represents the position of magnet 142 in a direction of straight line L242. On the other hand, for each Hall element, object magnet 142 passes closer to Hall elements 40a and 40b when moving on straight line L231 than object magnet 142 passes when moving on straight line L232. Herein, the intensity of signals output from Hall elements 40a and 40b increases as the magnetic field strength applied to Hall elements 40a and 40b from the outside increases. Thus, signal X2 becomes larger than signal X1. Signal X2 is a signal output from Hall elements 40a and 40b when object magnet 142 moves on straight line L231, and signal X1 is a signal output from Hall elements 40a and 40b when object magnet 142 moves on straight line L232.

Accordingly, for instance, if the signal output from each Hall element is checked with a threshold, it can be determined whether object magnet 142 is located on straight line L231 or straight line L232, i.e., located apart from magnetic sensor 100 in a right-hand direction or a light-hand direction. In other words, it can be determined whether object magnet 142 is located on the right-hand side or the left-hand side of magnetic sensor 100. Specifically, when Hall element 40a (40b) outputs signal X1, magnet 142 is located on straight line L232, i.e., at portion S232 between position PC and position PD in slit 236. When Hall element 40a (40b) outputs signal X2, magnet 142 is located on straight line L231, i.e., at portion S231 between position PA and position PB in slit 236.

Figure 24:
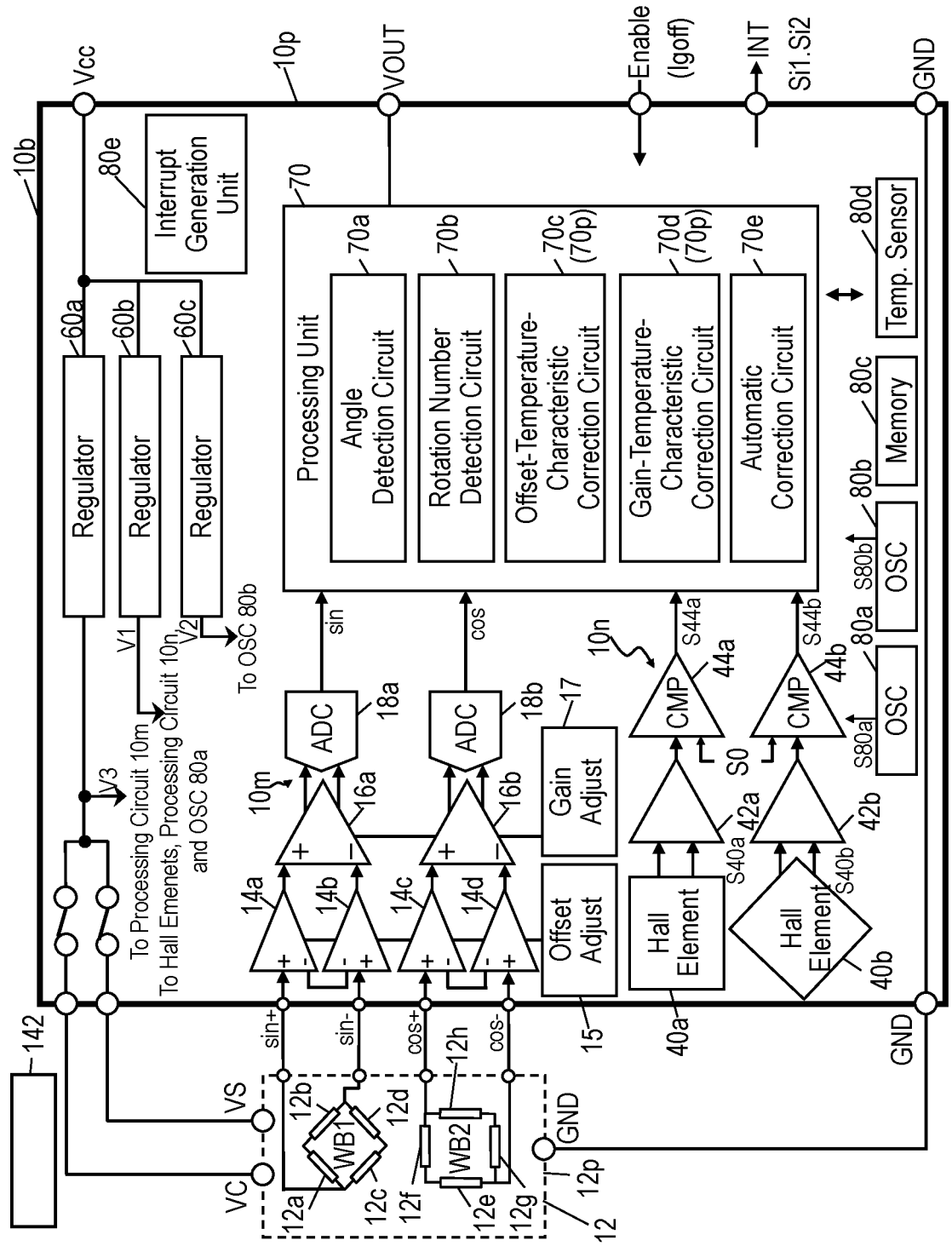
FIG. 24 is a block diagram of a magnetic sensor of the detection device shown in FIG. 22.

FIG. 24 is a block diagram of the magnetic sensor of detection device 230 shown in FIG. 22. In FIG. 24, components identical to those of magnetic sensor 100 shown in FIG. 1A are denoted by the same reference numerals. The magnetic sensor includes detection circuit 10b, instead of detection circuit 10. Detection circuit 10b further includes an output terminal (VOUT), interrupt generation unit 80e, and interrupt output terminal INT. The output terminal (VOUT) outputs, to the outside as an output signal, a signal which is obtained by performing at least one processing selected from amplification, analog-to-digital conversion, offset correction, and temperature-characteristics correction to the signal input from magneto-resistive element 12. When the signal input from Hall element 40a (40b) is larger than the predetermined threshold, interrupt generation unit 80e outputs interrupt signal Si1 from interrupt output terminal INT. When the signal input from Hall element 40a (40b) is equal to or less than the predetermined threshold, interrupt generation unit 80e outputs interrupt signal Si2 from interrupt output terminal INT. Interrupt signal Si1 indicates that magnet 142 is located apart from magnetic sensor 100 in direction D11a. Interrupt signal Si2 indicates that magnet 142 is located apart from magnetic sensor 100 in direction D12a opposite to direction D11a.

In magnetic sensor 100c shown in FIG. 13, magneto-resistive element 122 is disposed above magneto-resistive element 121. Especially, magneto-resistive elements 121 and 122 are arranged such that the center of magneto-resistive element 121 coincides with the center of magneto-resistive element 122. Such a configuration in which the center of magneto-resistive element 121 coincides substantially with the center of magneto-resistive element 122 is not limited to this.

Figure 25:
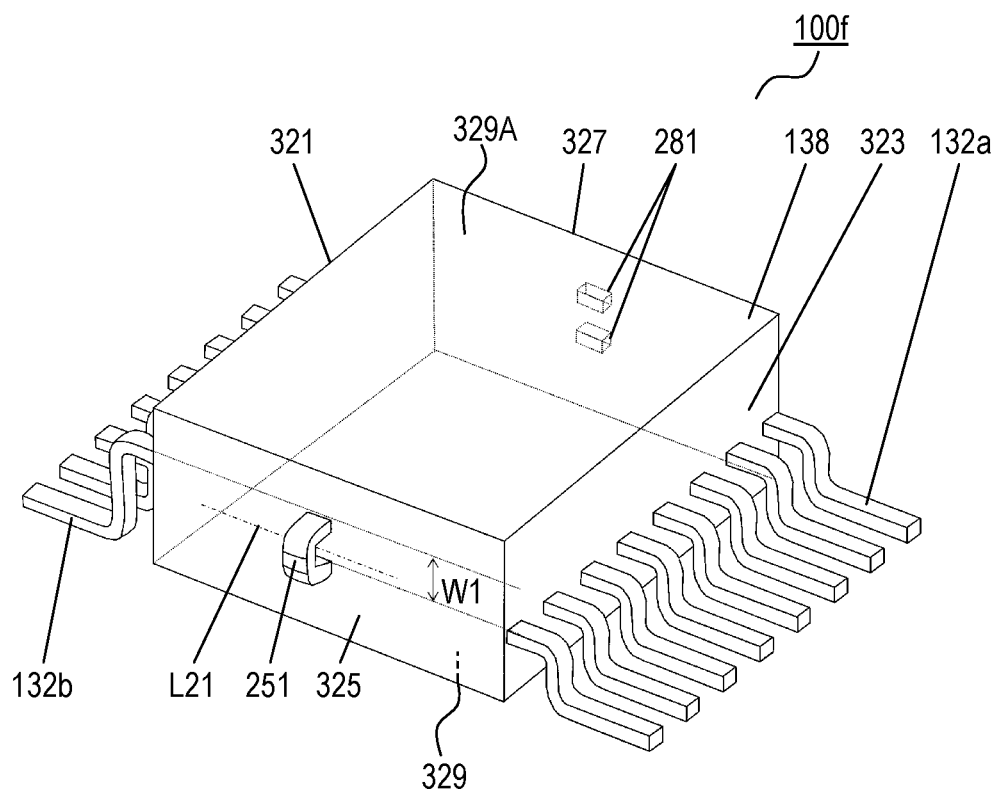
FIG. 25 is a perspective view of still another magnetic sensor in the exemplary embodiment.

Another magnetic sensor in which the center of magneto-resistive element 121 coincides substantially with the center of magneto-resistive element 122 will be described below. FIG. 25 is a perspective view of further magnetic sensor 100f in accordance with the exemplary embodiment. FIGS. 26 to 32 illustrates a method of manufacturing magnetic sensor 100f. In FIGS. 25 to 32, components identical to those of magnetic sensor 100d shown in FIG. 14 are denoted by the same reference numerals.

Figure 26:
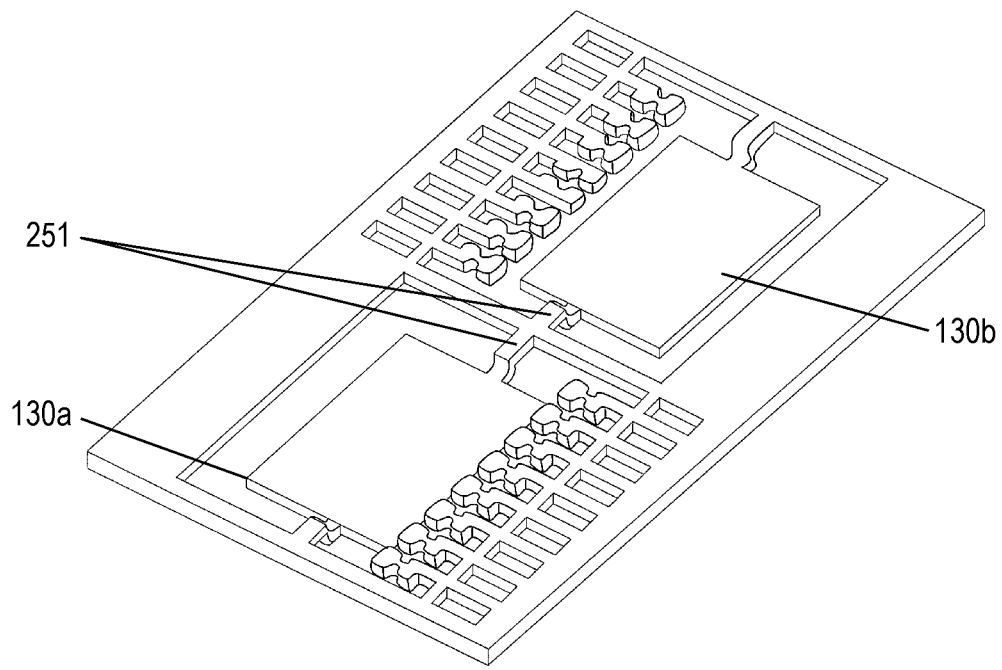
FIG. 26 is a view describing a manufacturing method of the magnetic sensor shown in FIG. 25.

As shown in FIG. 26, die pad 130a of magnetic sensor 100f is connected to die pad 130b with connecting part 251.

Figure 27:
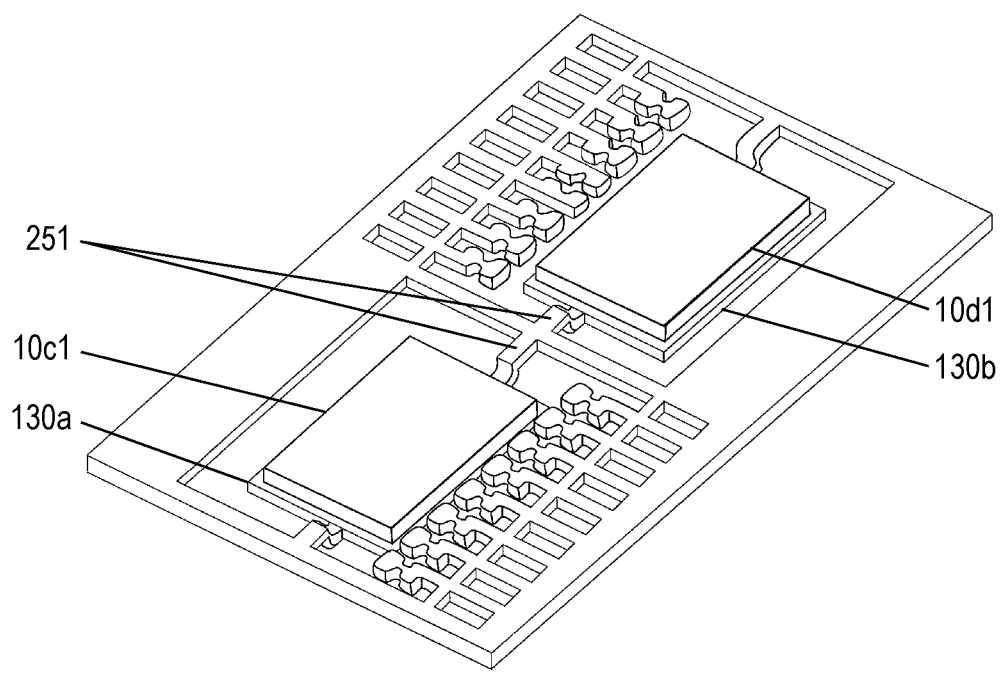
FIG. 27 is a view describing the manufacturing method of the magnetic sensor shown in FIG. 25.

Next, as shown in FIG. 27, substrates 10c1 and 10d1 are disposed on die pads 130a and 130b, respectively. Detection circuit 10c is provided on substrate 10c1. Detection circuit 10d is provided on substrate 10d1.

Figure 28:
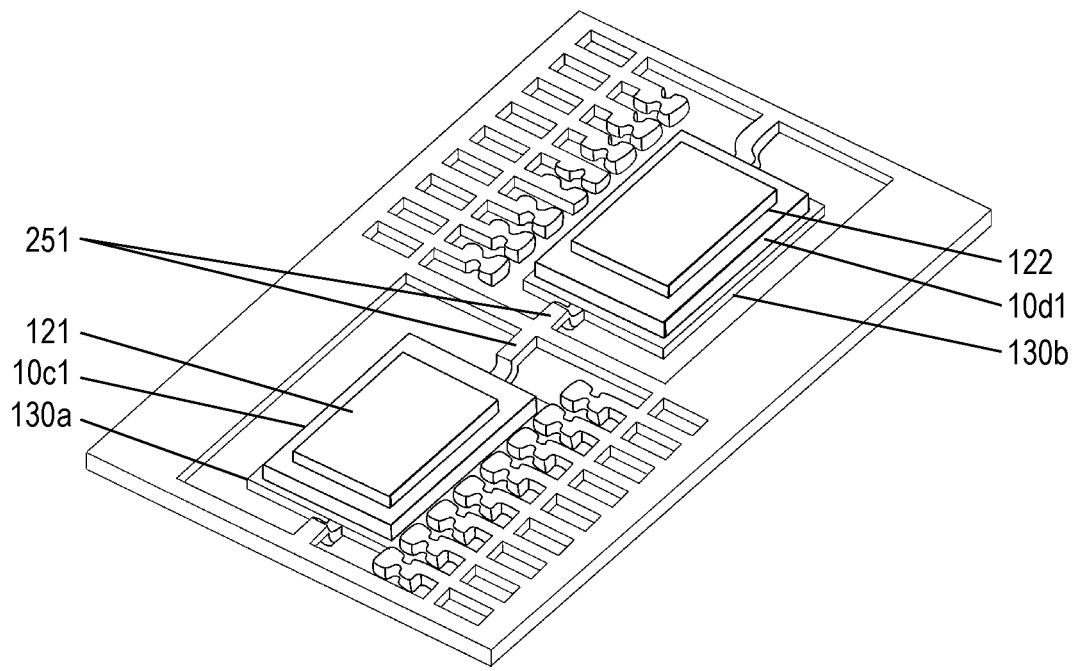
FIG. 28 is a view describing the manufacturing method of the magnetic sensor shown in FIG. 25.

Next, as shown in FIG. 28, magneto-resistive element 121 is disposed on detection circuit 10c. Magneto-resistive element 122 is disposed on detection circuit 10d.

Figure 29:
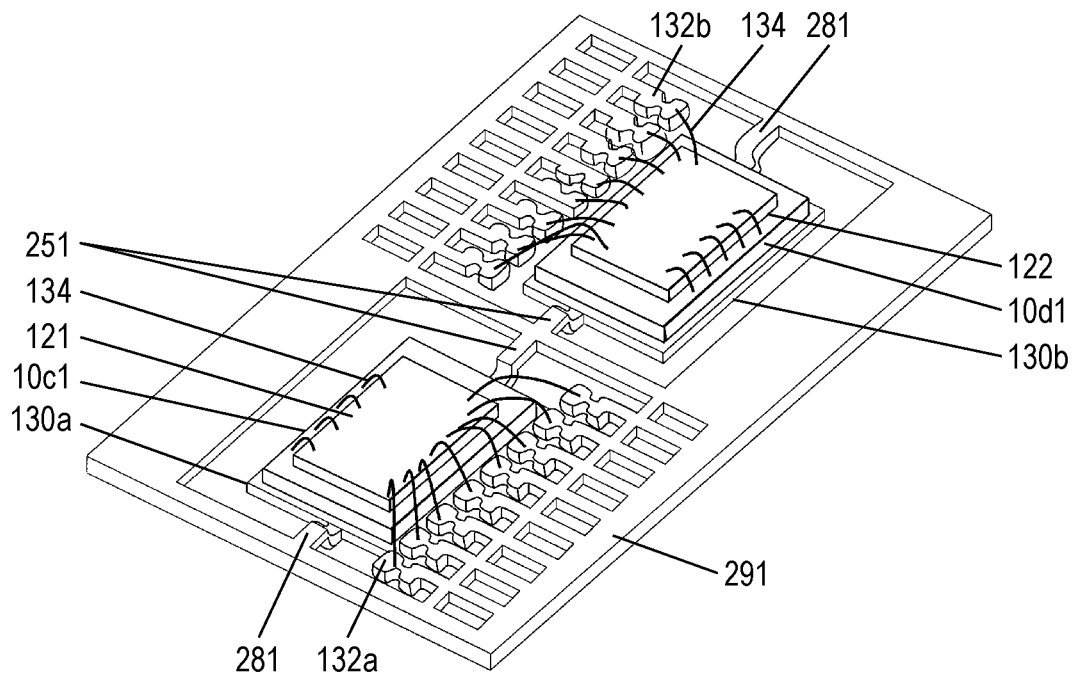
FIG. 29 is a view describing the manufacturing method of the magnetic sensor shown in FIG. 25.

Next, as shown in FIG. 29, wire 134 electrically connects detection circuit 10c to magneto-resistive elements 121. Wire 134 electrically connects detection circuit 10c to lead 132a. Wire 134 electrically connects detection circuit 10d to magneto-resistive elements 122. Wire 134 electrically connects detection circuit 10d to lead 132b.

Figure 30:
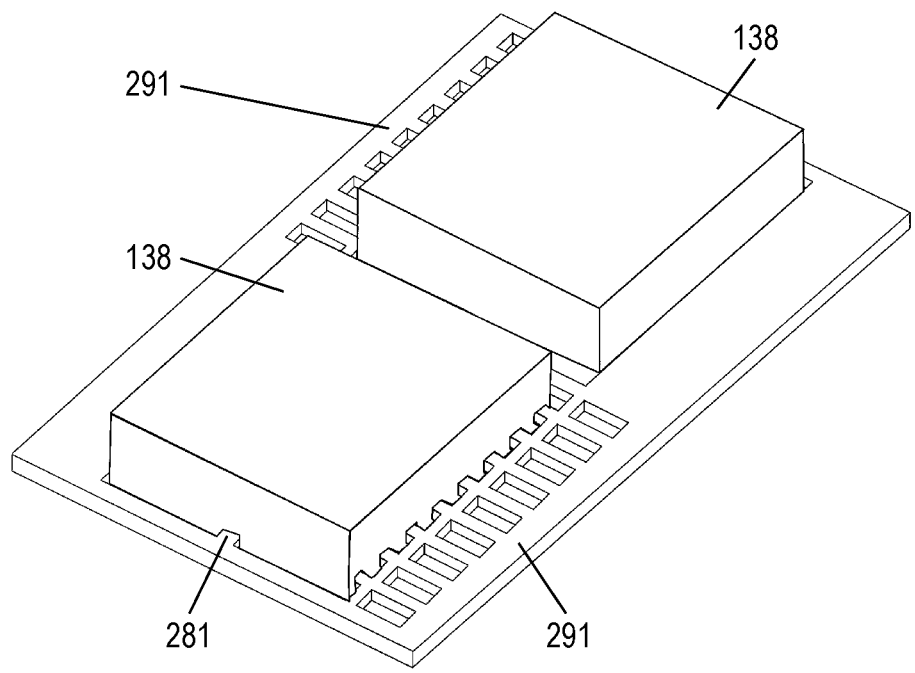
FIG. 30 is a view describing the manufacturing method of the magnetic sensor shown in FIG. 25.

Next, as shown in FIG. 30, magneto-resistive elements 121 and 122, substrates 10c1 and 10d1, and wire 134 are molded with sealing resin 138.

Figure 31:
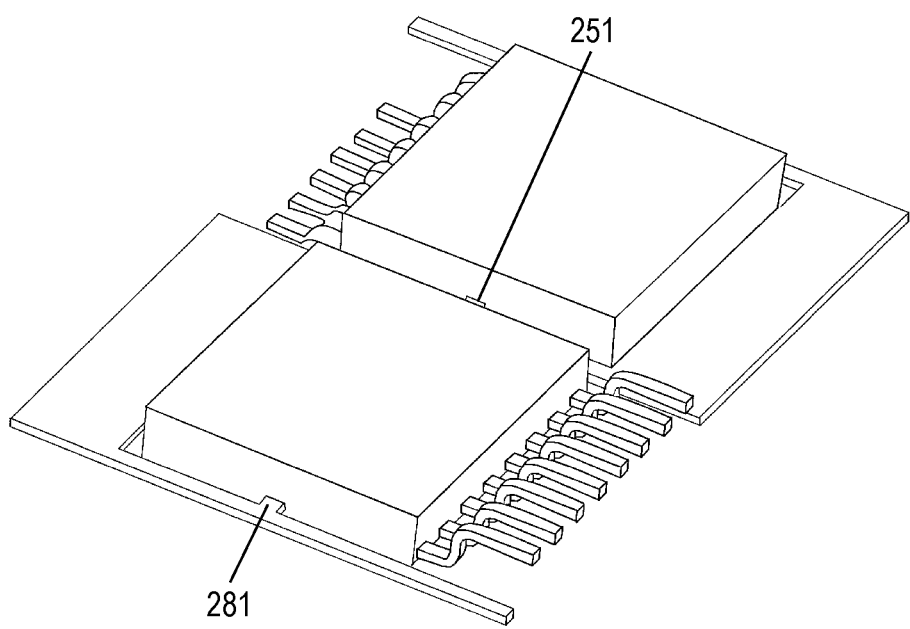
FIG. 31 is a view describing the manufacturing method of the magnetic sensor shown in FIG. 25.

Next, as shown in FIG. 31, a part of tie bar 291 is cut off, and then leads 132a and 132b are bent.

Figure 32:
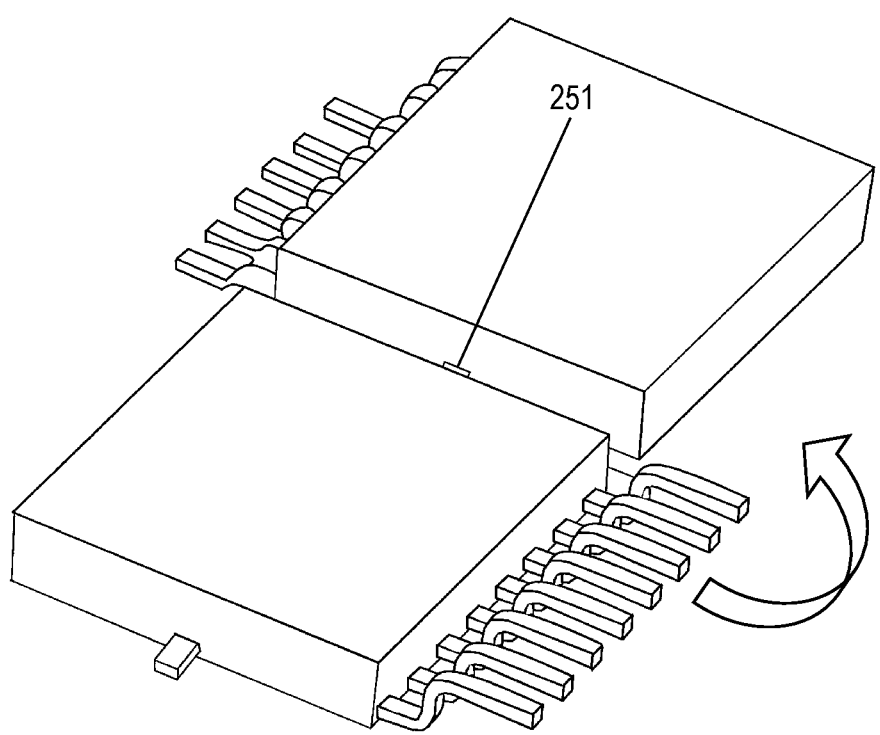
FIG. 32 is a view describing the manufacturing method of the magnetic sensor shown in FIG. 25.

Next, as shown in FIG. 32, the remaining part of tie bar 291 is cut off, and then connecting part 251 is bent to obtain magnetic sensor 100f in FIG. 25.

This structure makes allows the center of magneto-resistive element 121 to be close to the center of magneto-resistive element 122 precisely. Thus, the signals obtained from magneto-resistive element 121 and magneto-resistive element 122 can preferably be substantially the same.

Magnetic sensor 100f is formed by the above manufacturing process has the following features.

Lead 132a electrically connected to detection circuit 10c is extracted from surface 323 of sealing resin 138. Lead 132b electrically connected to detection circuit 10d, is extracted from surface 321 opposite to surface 323 of sealing resin 138. Sealing resin 138 has bottom surface 329 connected to surfaces 321 and 323. Lead 132a connected to detection circuit 10c is extracted from a position closer to bottom 329 of sealing resin 138 than lead 132b connected to detection circuit 10d is, i.e., a lower position. In other words, lead 132a connected to detection circuit 10c is extracted from near bottom 329 of sealing resin 138, and lead 132b connected to detection circuit 10d is extracted from near upper surface 329A opposite to bottom 329, i.e., lead 132a and lead 132b are extracted at heights different from each other, and the difference between the different heights is difference W1 (see FIG. 25).

Connecting part 251 is extracted from surface 325 which is perpendicular to surfaces 321 and 323 and has an arch shape. The shape of connecting part 251 is not limited to the arch shape. For instance, if a part of connecting part 251 is cut off after being bent, connecting part 251 may have an arch shape having its top portion removed. In other words, connecting part 251 includes a portion extracted from at least two points of surface 325. Further, boundary L21 may remain in sealing resin 138 in a portion surrounded by the arch shape of connecting part 251, i.e., between the two points at which connecting part 251 is extracted from surface 325 (see FIG. 25). Boundary L21 is a trace at which sealing resin 138 for sealing magneto-resistive element 121 shown in FIG. 32 is bonded to sealing resin 138 for sealing magneto-resistive element 122. Herein, the "boundary" may indicate a line remaining in resin, and/or a state where a gap is generated in a part of resin. Further, the "boundary" is located between die pad 130a and die pad 130b.

Supporting parts 281 that connect between tie bar 291 and each of die pads 130a and 130b are extracted from surface 327 opposite to surface 325. Connecting part 251 is extracted from surface 325.

In magnetic sensor 100e shown in FIGS. 26 to 31, magneto-resistive elements 121 and 122 are disposed on substrates 10c1 and 10d1, respectively. Substrates 10c1 and 10d1 are disposed on die pads 130a and 130b, respectively. Magneto-resistive elements 121 and 122 may be disposed on die pads 130a and 130b, respectively while substrate 10c1 and 10d1 may be disposed on magneto-resistive elements 121 and 122, respectively. This configuration allows magneto-resistive element 121 to be located close to magneto-resistive element 122. This configuration provides more approximated magnetic fields to be detected each of which is input to the magneto-resistive element, so that the signals to be output from the magneto-resistive elements are matched accurately.

FIG. 22 shows detection device 230 including magnetic sensor 100 in accordance with the exemplary embodiment, but structure of the detection device is not limited to this.

Figure 33:
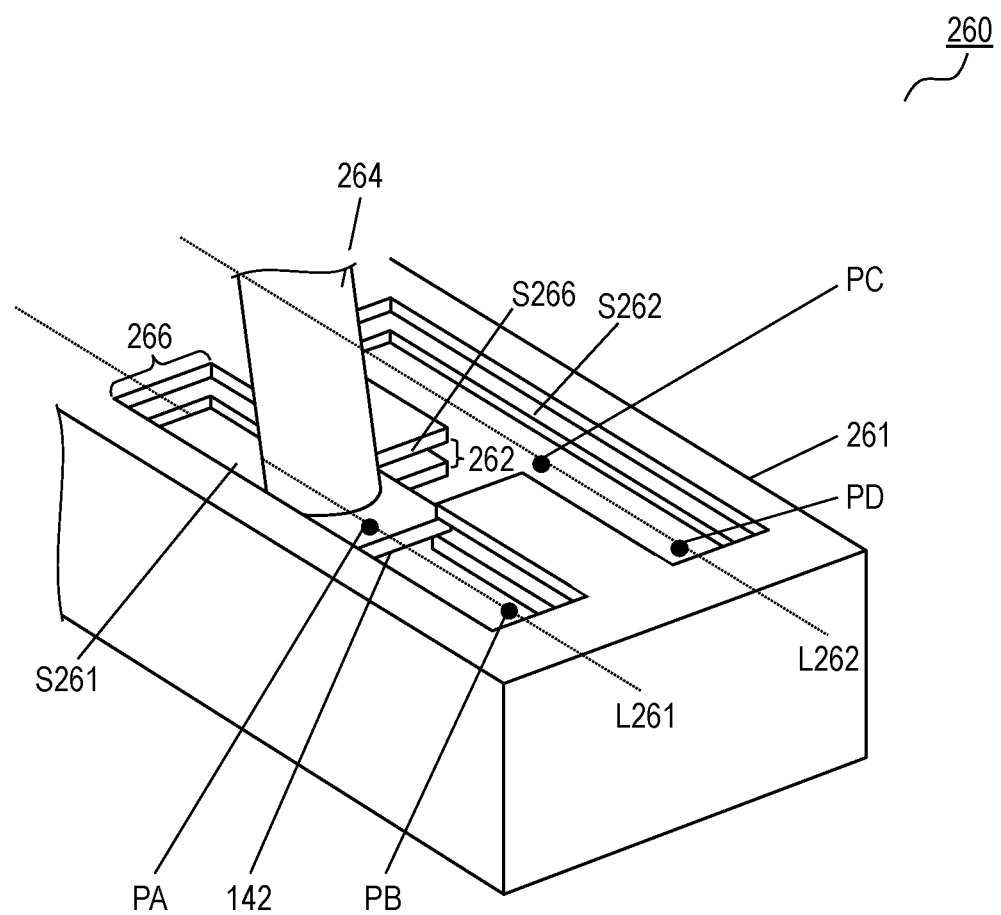
FIG. 33 is a perspective view of still another detection device in the exemplary embodiment.
Figure 34A:
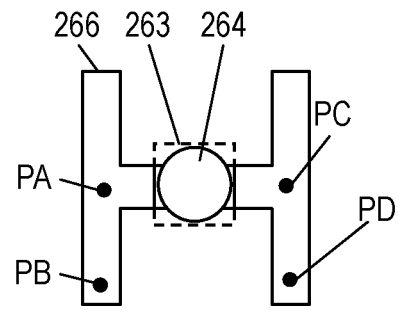
FIG. 34A is a partial top view of the detection device shown in FIG. 33.
Figure 34B:
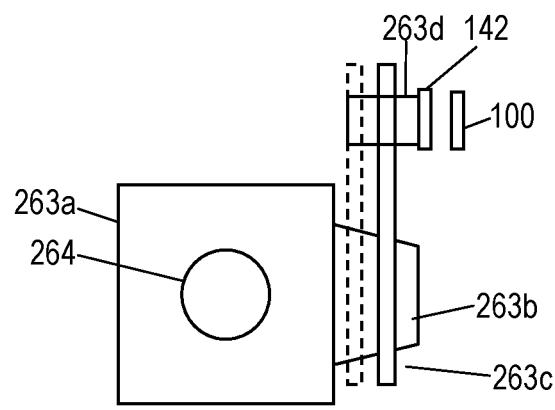
FIG. 34B is a partial top view of the detection device shown in FIG. 33.

FIG. 33 is a perspective view of still another detection device 260 in accordance with the exemplary embodiment. FIGS. 34A and 34B are partial top views of detection device 260. In FIGS. 34A and 34B, unnecessary structure for description is omitted, as necessary, to be described. Detection device 260 includes case 261, guide 262, linkage mechanism 263, shaft 264, and magnetic sensor 100. Shaft 264 may also be described as a shift lever.

Slit 266 is provided in case 261.

Slit 266 has portions S261, S262, and S266. Portions S261 and S262 extend slenderly along straight lines L261 and L262 parallel with each other, respectively. Portion S266 connects portion S261 to portion 262. In FIG. 33, slit 266 has an H-shape. Guide 262 is provided in an inner wall of slit 266. In accordance with the exemplary embodiment, guide 262 is a recess provided in the inner wall of slit 266.

Shaft 264 is connected to linkage mechanism 263. When a user operates shaft 264, a part of a member constituting linkage mechanism 263 moves along guide 262.

Linkage mechanism 263 includes supporting part 263a connected to shaft 264, movable body 263b connected to supporting part 263a, belt 263c connected to movable body 263b, movable body 263 connected to belt 263c, and object magnet 142 connected to movable body 263.

Supporting part 263a is slidable in slit 266 along guide 262. In other words, supporting part 263a can move along straight line L262 and straight line L261. Further, straight line L262 and straight line L261 can be described as traces along which supporting part 263a moves.

Movable body 263b is configured to convert an up-down movement of supporting part 263a into a rotational movement. Further, by moving movable body 263b horizontally, the rotation amount thereof is changed. To achieve this mechanism, movable body 263b has a cross section having a trapezoid shape. That is, a portion of movable body 263b closer to supporting part 263a has a diameter larger than that of a portion farther from supporting part 263a.

Belt 263c connects movable body 263b to movable body 263d, and transmits the rotational movement of movable body 263b to movable body 263d.

Figure 34C:
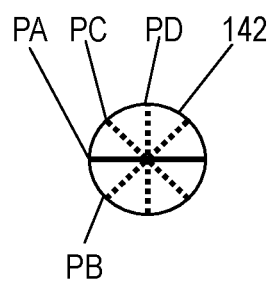
FIG. 34C is a front view of an object magnet of the detection device shown in FIG. 33.

FIG. 34C is a front view of object magnet 142. Movable body 263d has a cylindrical shape such that movable body 263d rotates due to a driving force transmitted through belt 263c. Object magnet 142 is connected to movable body 293d, thereby giving a change of magnetic field of object magnet 142 to magnetic sensor 100. In this way, linkage mechanism 263 is coupled with shaft 264 (shift lever), and configured such that a rotation amount of movable body 263d is changed according to horizontal movement of shaft 264. Thus, a difference in rotation angle of object magnet 142 is generated between position PB and position PB. As a result, positions PA, PB, PC, and PD can be determined by only one magnetic sensor 100.

Linkage mechanism 263 having this structure may be expressed as a variable speed pulley.

When linkage mechanism 263 having this structure is employed, Hall elements 40a and 40b of magnetic sensor 100 and a circuit used for detecting the output from Hall elements 40a and 40b are not essential.

In the exemplary embodiment, terms, such as "upper surface", and "when viewed from above" indicate relative directions determined only by relative physical relationship between component members of the magnetic sensor, but do not indicate absolute directions, such as a vertical direction.

REFERENCE MARKS IN THE DRAWINGS 10 detection circuit
12 magneto-resistive element
12a-12h magneto-resistive element
12t, 12s magnetic resistance pattern
12ac, 12bd, 12eg, 12fh node (midpoint)
12x magneto-resistive element group
12y magneto-resistive element group
14a-14d amplifier
15 offset control circuit
16a, 16b differential amplifier
17 gain control circuit
18a, 18b AD converter
40a, 40b Hall element
42a, 42b amplifier
44a, 44b comparator
60a-60c regulator
70 processing unit
70a angle detection circuit
70b rotation number detection circuit
70c offset-temperature-characteristic correction circuit
70d gain-temperature-characteristic correction circuit
70e automatic correction circuit
80a, 80b oscillator
80c memory
80d temperature sensor
90, 91 diagnostic circuit
100 magnetic sensor 100a1-100a4 wiring
100b1-100b4 wiring
112a, 112b resistor
112a1, 112a2, 112b1, 112b2 current path
WB1, WB2 bridge circuit
121, 122 magneto-resistive element
121a, 122a magneto-resistive element group
121b, 122b magneto-resistive element group
130, 130a, 130b die pad
132, 132a, 132b lead
134, 134b wire
138 sealing resin
142 object magnet
144 rotation shaft
146 bearing
150 rotation detection device
201a substrate
201b substrate
201c substrate
201d substrate
203 electrode
230 detection device

The invention claimed is:

1. A magnetic sensor configured to be used with a magnet, the magnetic sensor comprising:
   a magneto-resistive element;
   a Hall element disposed in a predetermined direction from the magneto-resistive element; and
   a detection circuit that receives a signal from the magneto-resistive element and a signal from the Hall element input thereto,
   wherein the detection circuit includes:
      a processing unit configured to output a signal to an outside as an output signal, the signal being obtained by performing, to the signal input from the magneto-resistive element, at least one processing selected from amplification, analog-to-digital conversion, offset correction, and temperature-characteristics correction; and
      an interrupt generation unit configured to output signals in response to the signal input from the Hall element,
   wherein the signal output from the processing unit indicates a position of the magnet when viewed in the predetermined direction, and
   wherein the interrupt generation unit is configured to:
      output a first interrupt signal when the signal input from the Hall element is larger than a predetermined threshold, the first interrupt signal indicating that the magnet is positioned in a first direction from the magnetic sensor, the first direction being perpendicular to the predetermined direction; and
      output a second interrupt signal when the signal input from the Hall element is less than or equal to the predetermined threshold, the second interrupt signal indicating that the magnet is positioned in a second direction from the magnetic sensor, the second direction being opposite to the first direction.

2. A detection device comprising:
   the magnetic sensor of claim 1; and
   magnet.

3. The detection device of claim 2,
   wherein the first interrupt signal indicates that the magnet is located apart from the magnetic sensor in the first direction, and
   wherein the second interrupt signal indicates that the magnet is located apart from the magnetic sensor in a second direction opposite to the first direction.

4. A detection device comprising:
   a magnetic sensor including a magneto-resistive element and a Hall element; and
   a magnet movable along a first straight line and a second straight line parallel with each other,
   wherein the magneto-resistive element overlaps a third straight line when viewed from above, the third straight line being parallel with the first straight line and located at equal distances from the first straight line and the second straight line,
   wherein the Hall element is provided between the first straight line and the third straight line, and
   wherein the magneto-resistive element and the Hall element are arranged in a direction perpendicular to the third straight line.

5. The detection device of claim 4, wherein the third straight line passes substantially through a center of the magneto-resistive element.

6. The detection device of claim 4, wherein the magnetic sensor outputs an interrupt signal when the magnet is located on the first straight line.

7. The magnetic sensor of claim 1,
   wherein the first interrupt signal indicates that the magnet is located apart from the magnetic sensor in the first direction, and
   wherein the second interrupt signal indicates that the magnet is located apart from the magnetic sensor in the second direction.

* * * * *